(12) United States Patent
Chang et al.

(10) Patent No.: US 11,978,674 B2
(45) Date of Patent: May 7, 2024

(54) SEMICONDUCTOR DEVICE STRUCTURE AND METHODS OF FORMING THE SAME

(71) Applicant: TAIWAN SEMICONDUCTOR MANUFACTURING COMPANY, LTD., Hsinchu (TW)

(72) Inventors: I-Ming Chang, ShinChu (TW); Jung-Hung Chang, Changhua (TW); Chung-Liang Cheng, Changhua (TW); Hsiang-Pi Chang, New Taipei (TW); Yao-Sheng Huang, Kaohsiung (TW); Huang-Lin Chao, Hillsboro, OR (US)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 288 days.

(21) Appl. No.: 17/497,128

(22) Filed: Oct. 8, 2021

(65) Prior Publication Data

US 2022/0359696 A1 Nov. 10, 2022

Related U.S. Application Data

(60) Provisional application No. 63/184,533, filed on May 5, 2021.

(51) Int. Cl.
*H01L 21/8234* (2006.01)
*H01L 29/06* (2006.01)
(Continued)

(52) U.S. Cl.
CPC .......... *H01L 21/823481* (2013.01); *H01L 21/823418* (2013.01); *H01L 21/823431* (2013.01);
(Continued)

(58) Field of Classification Search
CPC ..... H01L 21/823418; H01L 21/823431; H01L 21/823437; H01L 21/823481; H01L 21/823814; H01L 21/823821; H01L 21/823878; H01L 27/088; H01L 27/0886; H01L 29/0665; H01L 29/0673; H01L 29/1079; H01L 29/36; H01L 29/42392; H01L 29/66439; H01L 29/66742;
(Continued)

(56) References Cited

U.S. PATENT DOCUMENTS 9,209,247 B2 12/2015 Colinge et al.
9,236,267 B2 1/2016 De et al.
(Continued)

*Primary Examiner* — Cheung Lee
(74) *Attorney, Agent, or Firm* — NZ CARR LAW OFFICE

(57) ABSTRACT

A semiconductor device structure is provided. The semiconductor device structure includes a first source/drain epitaxial feature formed over a substrate, a second source/drain epitaxial feature formed over the substrate, two or more semiconductor layers disposed between the first source/drain epitaxial feature and the second source/drain epitaxial feature, a gate electrode layer surrounding a portion of one of the two or more semiconductor layers, a first dielectric region disposed in the substrate and in contact with a first side of the first source/drain epitaxial feature, and a second dielectric region disposed in the substrate and in contact with a first side of the second source/drain epitaxial feature, the second dielectric region being separated from the first dielectric region by a substrate.

18 Claims, 41 Drawing Sheets

(51) Int. Cl.
    *H01L 29/423*     (2006.01)
    *H01L 29/66*     (2006.01)
    *H01L 29/78*     (2006.01)
    *H01L 29/786*     (2006.01)

(52) U.S. Cl.
    CPC .... *H01L 29/0665* (2013.01); *H01L 29/42392* (2013.01); *H01L 29/66742* (2013.01); *H01L 29/785* (2013.01); *H01L 29/78618* (2013.01); *H01L 29/7869* (2013.01)

(58) Field of Classification Search
    CPC ............. H01L 29/66795; H01L 29/775; H01L 29/785; H01L 29/78618; H01L 29/7869; H01L 29/78696; B82Y 10/00
    See application file for complete search history.

(56) References Cited

U.S. PATENT DOCUMENTS

| | | |
|---|---|---|
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 2018/0026033 A1 | 1/2018 | Chang et al. |
| 2020/0044087 A1* | 2/2020 | Guha ................ H01L 29/66439 |

* cited by examiner

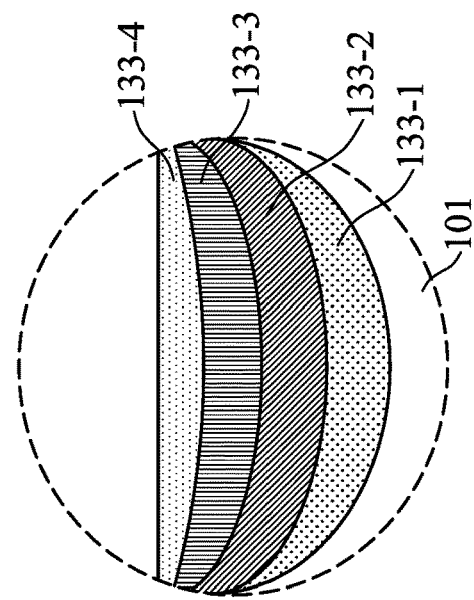
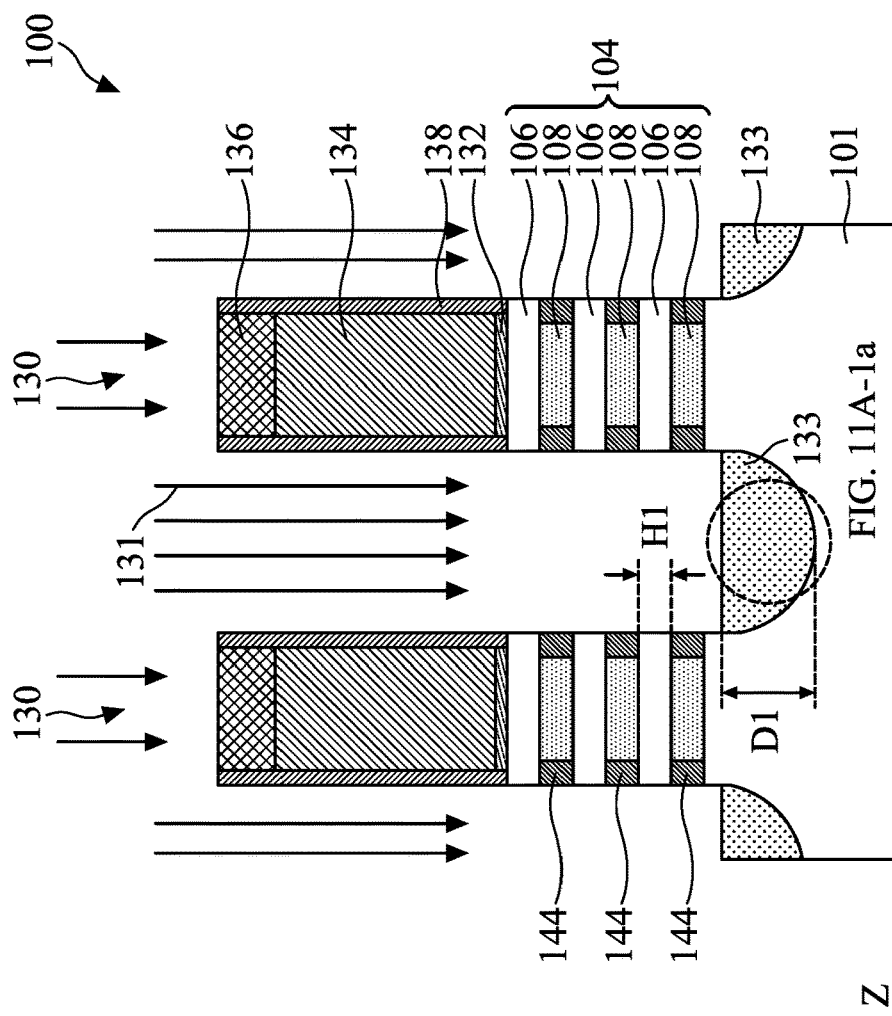
FIG. 11A-1a
FIG. 11A

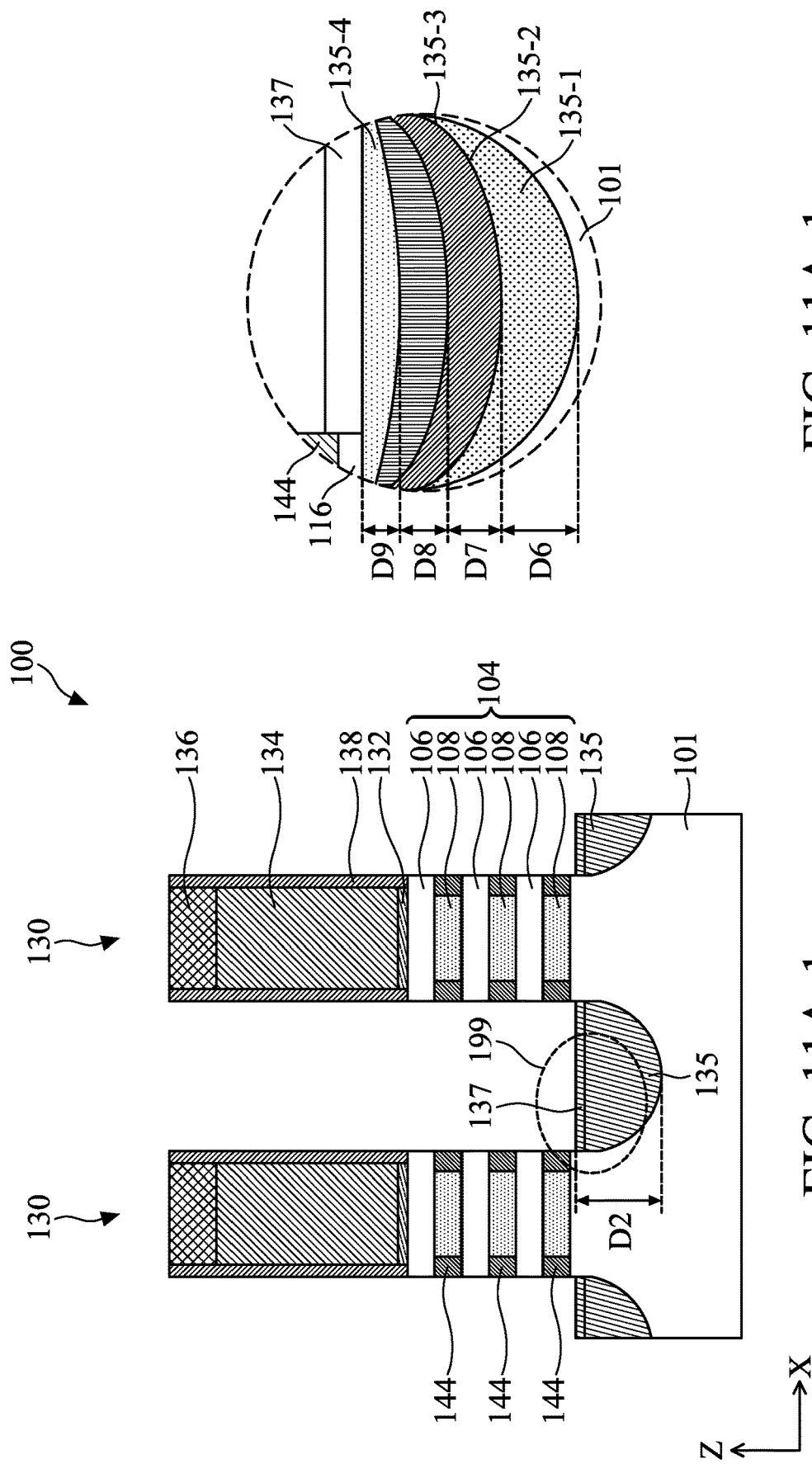

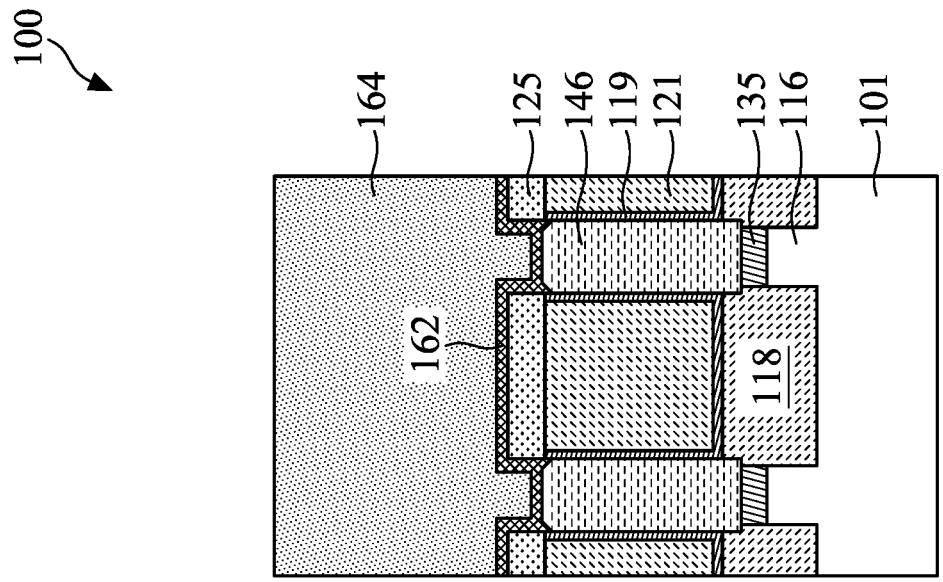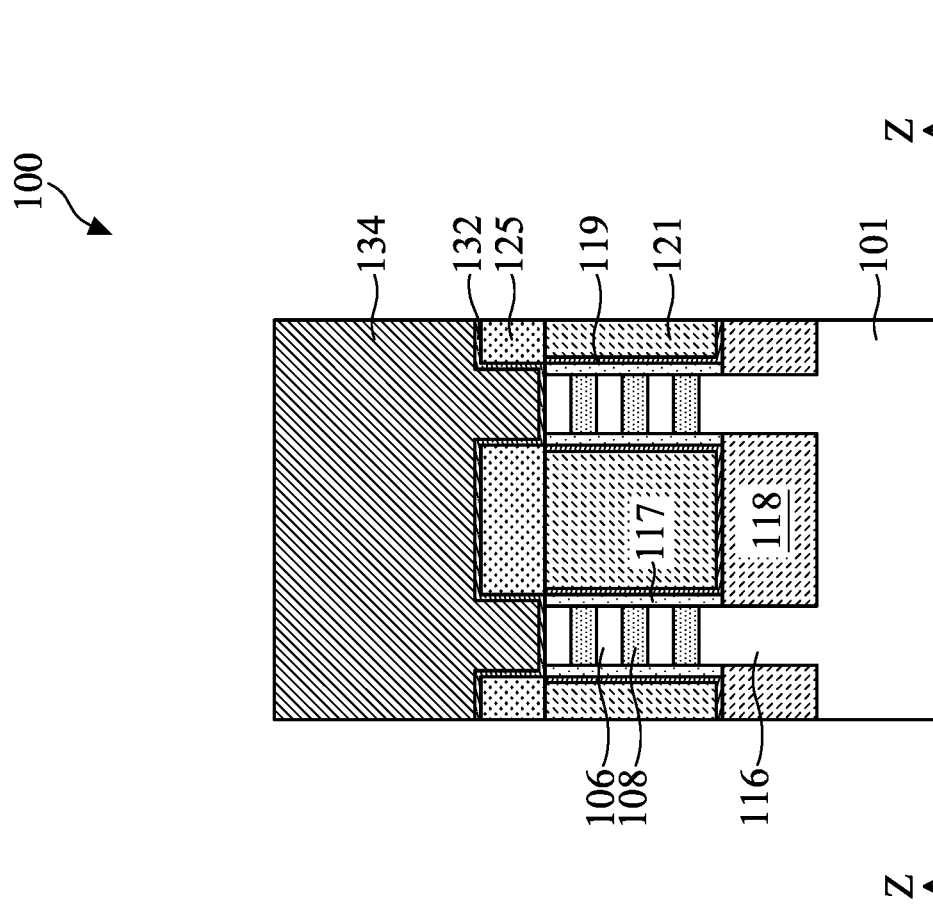
FIG. 15B
FIG. 15C

SEMICONDUCTOR DEVICE STRUCTURE AND METHODS OF FORMING THE SAME

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. However, as transistor, such as a multi-gate field effect transistor (FET), is continually scaled down in dimension, numerous challenges have risen. For example, off-state current leakage in a substrate of the multi-gate FET can become a significant concern. Therefore, further improvements are needed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 9A-11A, 11A-1, and 14A-18A are cross-sectional side views of various stages of manufacturing the semiconductor device structure taken along cross-section A-A of FIG. 8, in accordance with some embodiments.

FIGS. 9B-11B and 14B-18B are cross-sectional side views of various stages of manufacturing the semiconductor device structure taken along cross-section B-B of FIG. 8, in accordance with some embodiments.

FIGS. 9C-11C and 14C-18C are cross-sectional side views of various stages of manufacturing the semiconductor device structure taken along cross-section C-C of FIG. 8, in accordance with some embodiments.

FIG. 11A-1$a$ is an enlarged view of a portion of the implanted region showing an implant profile according to an exemplary embodiment.

FIG. 11A-1$b$ is a graph showing density of ion species as a function of depth after implantation using kinetic energies according to an exemplary embodiment.

FIG. 11A-1$c$ is an enlarged view of a portion of the dielectric region, in accordance with some embodiments.

FIGS. 12-1$a$ to 12-1$c$ are cross-sectional side views of various stages of the semiconductor device structure taken along cross-section A-A of FIG. 8, in accordance with some alternative embodiments.

FIG. 12-3 is a graph showing density of ion species as a function of depth after implantation using kinetic energies according to an exemplary embodiment.

FIGS. 12-2$a$ to 12-2$c$ are cross-sectional side views of various stages of the semiconductor device structure taken along cross-section A-A of FIG. 8, in accordance with some alternative embodiments.

FIGS. 12-4 and 12-5 are graphs showing nitride loss as a function of different oxygen implant dosages and comparisons between different combinations of dopants during removal of a nitride layer, in accordance with some alternative embodiments.

FIGS. 13-1$a$ to 13-1$c$ are cross-sectional side views of various stages of the semiconductor device structure taken along cross-section A-A of FIG. 8, in accordance with some alternative embodiments.

FIG. 13-2 is a graph showing etch amount as a function of etching times, in accordance with some embodiments.

DETAILED DESCRIPTION

Figure 1:
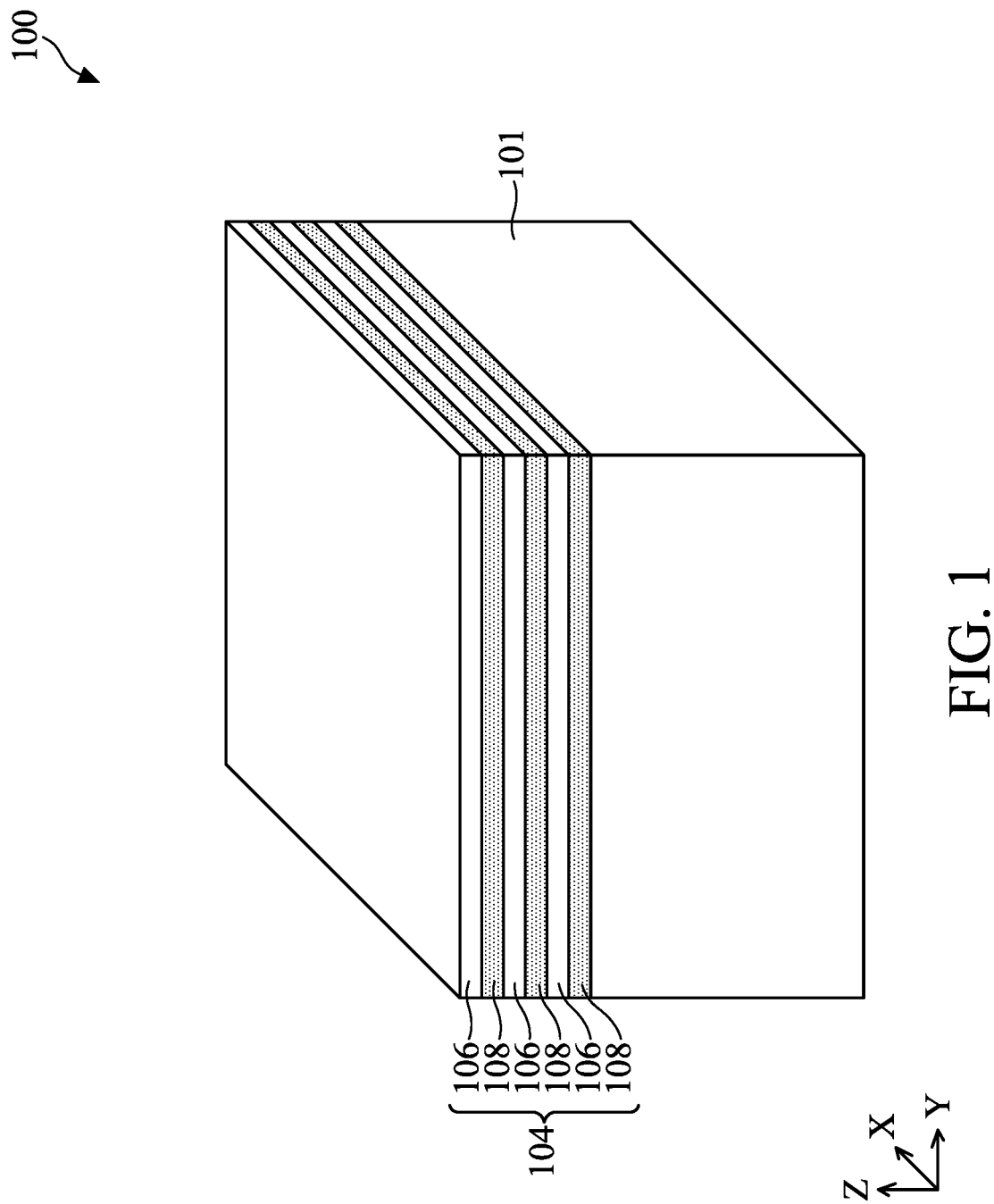
FIGS. 1-8 are perspective views of various stages of manufacturing a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

While the embodiments of this disclosure are discussed with respect to nanosheet FETs, implementations of some aspects of the present disclosure may be used in other processes and/or in other devices, such as planar FETs, FinFETs, Horizontal Gate All Around (HGAA) FETs, Vertical Gate All Around (VGAA) FETs, and other suitable devices. A person having ordinary skill in the art will readily understand other modifications that may be made are contemplated within the scope of this disclosure. In cases where gate all around (GAA) transistor structures are adapted, the GAA transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

FIGS. 1-21 show exemplary processes for manufacturing a semiconductor device structure 100 according to embodiments of the present disclosure. It is understood that additional operations can be provided before, during, and after processes shown by FIGS. 1-22, and some of the operations described below can be replaced or eliminated, for additional embodiments of the method. The order of the operations/processes is not limiting and may be interchangeable.

FIGS. 1-8 are perspective views of various stages of manufacturing a semiconductor device structure 100 in accordance with some embodiments. As shown in FIG. 1, the semiconductor device structure 100 includes a stack of semiconductor layers 104 formed over a substrate 101. The substrate 101 may be a semiconductor substrate. The substrate 101 may include a crystalline semiconductor material such as, but not limited to, silicon (Si), germanium (Ge), silicon germanium (SiGe), gallium arsenide (GaAs), indium antimonide (InSb), gallium phosphide (GaP), gallium antimonide (GaSb), indium aluminum arsenide (InAlAs), indium gallium arsenide (InGaAs), gallium antimony phosphide (GaSbP), gallium arsenic antimonide (GaAsSb) and indium phosphide (InP). In one embodiment, the substrate 101 is made of silicon. In some embodiments, the substrate 101 is a silicon-on-insulator (SOI) substrate having an insulating layer (not shown) disposed between two silicon layers for enhancement. In one aspect, the insulating layer is an oxygen-containing layer.

The substrate 101 may include various regions that have been doped with impurities (e.g., dopants having p-type or n-type impurities). Depending on circuit design, the dopants may be, for example boron for p-type field effect transistors (p-type FETs) and phosphorus for n-type field effect transistors (n-type FETs).

The stack of semiconductor layers 104 includes semiconductor layers made of different materials to facilitate formation of nanosheet channels in a multi-gate device, such as nanosheet FETs. In some embodiments, the stack of semiconductor layers 104 includes first semiconductor layers 106 and second semiconductor layers 108. In some embodiments, the stack of semiconductor layers 104 includes alternating first and second semiconductor layers 106, 108, and the first and second semiconductor layers 106, 108 are disposed parallelly with each other. The first semiconductor layers 106 and the second semiconductor layers 108 are made of semiconductor materials having different etch selectivity and/or oxidation rates. For example, the first semiconductor layers 106 may be made of Si doped with Ge and the second semiconductor layers 108 may be made of SiGe. In some examples, the first semiconductor layers 106 may be made of SiGe and the second semiconductor layers 108 may be made of Si. In some embodiments, the first semiconductor layers 106 may be made of SiGe having a first Ge concentration range, and the second semiconductor layers 108 may be made of SiGe having a second Ge concentration range that is lower or greater than the first Ge concentration range. Alternatively, in some embodiments, either of the semiconductor layers 106, 108 may be or include other materials such as Ge, SiC, GeAs, GaP, InP, InAs, InSb, GaAsP, AlInAs, AlGaAs, InGaAs, GaInP, GaInAsP, or any combinations thereof.

The thickness of the first semiconductor layers 106 and the second semiconductor layers 108 may vary depending on the application and/or device performance considerations. In some embodiments, each first and second semiconductor layer 106, 108 has a thickness in a range between about 5 nm and about 30 nm. In other embodiments, each first and second semiconductor layer 106, 108 has a thickness in a range between about 10 nm and about 20 nm. In some embodiments, each first and second semiconductor layer 106, 108 has a thickness in a range between about 6 nm and about 12 nm. Each second semiconductor layer 108 may have a thickness that is equal to, less than, or greater than the thickness of the first semiconductor layer 106. The second semiconductor layers 108 may eventually be removed and serve to define a vertical distance between adjacent channels for the semiconductor device structure 100.

The first semiconductor layers 106 or portions thereof may form nanosheet channel(s) of the semiconductor device structure 100 in later fabrication stages. The term nanosheet is used herein to designate any material portion with nanoscale, or even microscale dimensions, and having an elongate shape, regardless of the cross-sectional shape of this portion. Thus, this term designates both circular and substantially circular cross-section elongate material portions, and beam or bar-shaped material portions including, for example, a cylindrical in shape or substantially rectangular cross-section. The nanosheet channel(s) of the semiconductor device structure 100 may be surrounded by a gate electrode. The semiconductor device structure 100 may include a nanosheet transistor. The nanosheet transistors may be referred to as nanosheet transistors, nanowire transistors, gate-all-around (GAA) transistors, multi-bridge channel (MBC) transistors, or any transistors having the gate electrode surrounding the channels. The use of the first semiconductor layers 106 to define channels of the semiconductor device structure 100 is further discussed below.

The first and second semiconductor layers 106, 108 are formed by any suitable deposition process, such as epitaxy. By way of example, epitaxial growth of the layers of the stack of semiconductor layers 104 may be performed by a molecular beam epitaxy (MBE) process, a metalorganic chemical vapor deposition (MOCVD) process, and/or other suitable epitaxial growth processes. While three first semiconductor layers 106 and three second semiconductor layers 108 are alternately arranged as illustrated in FIG. 1, it can be appreciated that any number of first and second semiconductor layers 106, 108 can be formed in the stack of semiconductor layers 104, depending on the predetermined number of nanosheet channels for each FET. For example, the number of first semiconductor layers 106, which is the number of channels, may be between 2 and 8.

Figure 2:
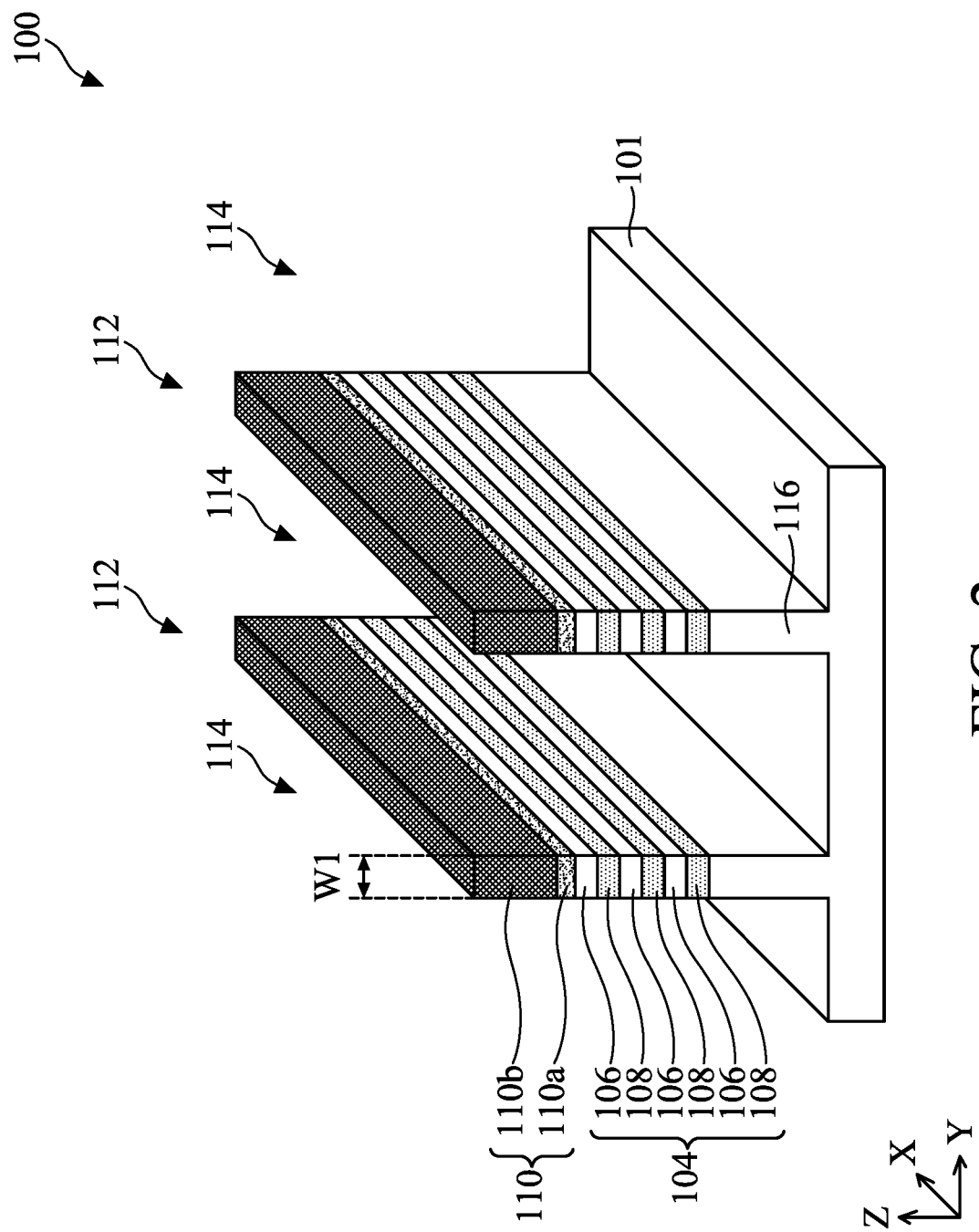

In FIG. 2, fin structures 112 are formed from the stack of semiconductor layers 104. Each fin structure 112 has a portion including the semiconductor layers 106, 108, a well portion 116 formed from the substrate 101, and a portion of a mask structure 110. The mask structure 110 is formed over the stack of semiconductor layers 104 prior to forming the fin structures 112. The mask structure 110 may include a pad layer 110a and a hard mask 110b. The pad layer 110a may be an oxygen-containing layer, such as a $SiO_2$ layer. The hard mask 110b may be a nitrogen-containing layer, such as a $Si_3N_4$ layer. The mask structure 110 may be formed by any suitable deposition process, such as chemical vapor deposition (CVD) process.

The fin structures 112 may be fabricated using suitable processes including photolithography and etch processes. In some embodiments, the photolithography process may include forming a photoresist layer (not shown) over the mask structure 110, exposing the photoresist layer to a pattern, performing post-exposure bake processes, and developing the photoresist layer to form a patterned photoresist layer. The patterned photoresist layer may then be used to protect regions of the substrate 101 and layers formed thereupon, while an etch process forms trenches 114 in unprotected regions through the mask structure 110, the stack of semiconductor layers 104, and into the substrate 101, thereby forming the extending fin structures 112. A width W1 of the fin structures 112 along the Y direction may be in a range between about 3 nm and about 44 nm. The trenches 114 may be etched using a dry etch (e.g., ME), a wet etch, and/or combination thereof. While two fin structures 112 are shown, the number of the fin structures is not limited to two.

Figure 3:
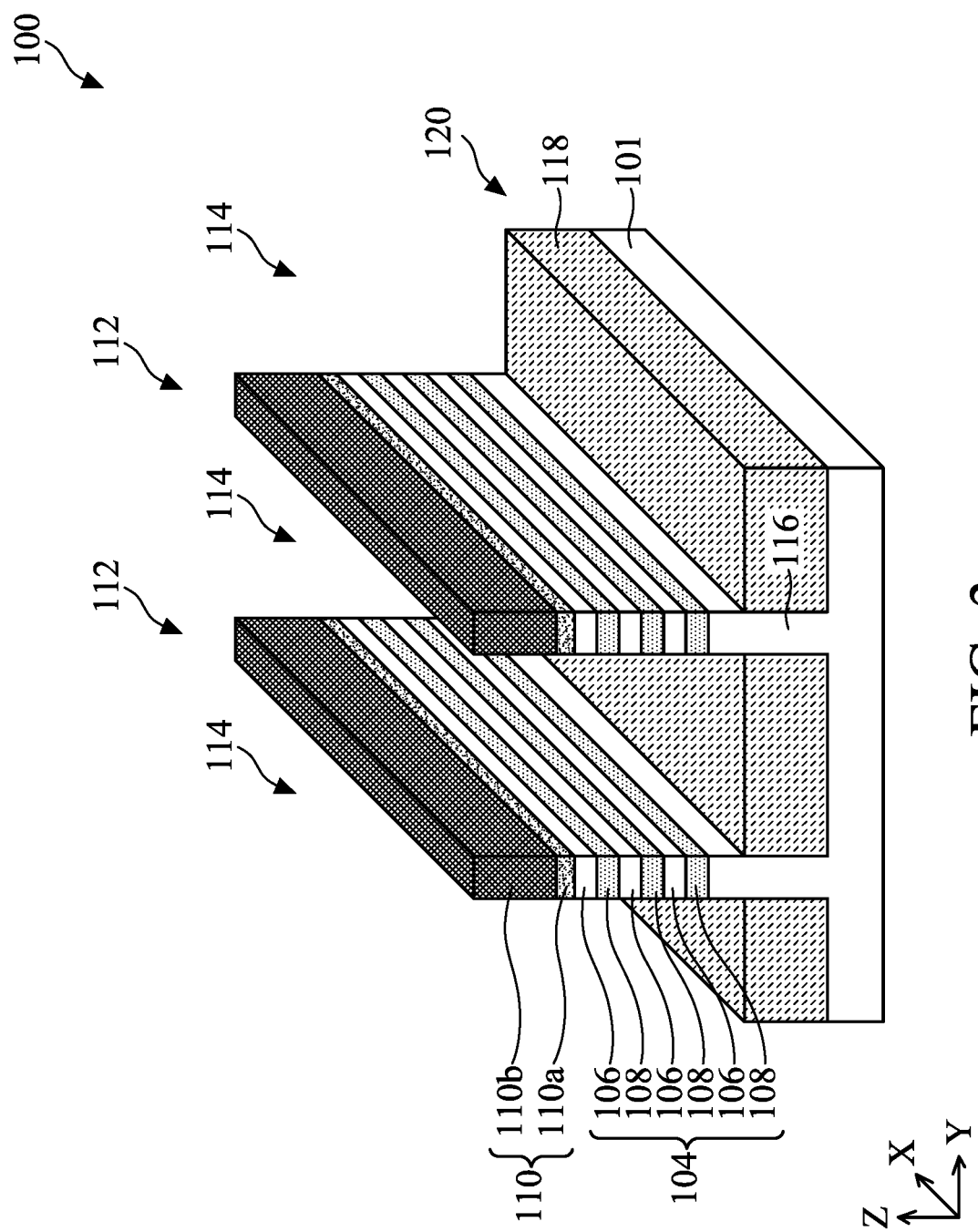

In FIG. 3, after the fin structures 112 are formed, an insulating material 118 is formed in the trenches 114 between the fin structures 112. The insulating material 118 fills the trenches 114 between neighboring fin structures 112 until the fin structures 112 are embedded in the insulating material 118. Then, a planarization operation, such as a chemical mechanical polishing (CMP) process and/or an etch-back process, is performed to expose the top of the fin structures 112. The insulating material 118 may be made of silicon oxide, silicon nitride, silicon oxynitride (SiON), SiOCN, SiCN, fluorine-doped silicate glass (FSG), a low-k dielectric material, or any suitable dielectric material. The insulating material 118 may be formed by any suitable method, such as low-pressure chemical vapor deposition (LPCVD), plasma enhanced CVD (PECVD) or flowable CVD (FCVD).

Next, the insulating material 118 is recessed to form an isolation region 120. The recess of the insulating material 118 exposes portions of the fin structures 112. The isolation region 120 may be formed using a suitable process, such as a dry etching process, a wet etching process, or a combination thereof. A top surface of the insulating material 118 may be level with or below a surface of the second semiconductor layer 108 in contact with the well portion 116.

Figure 4:
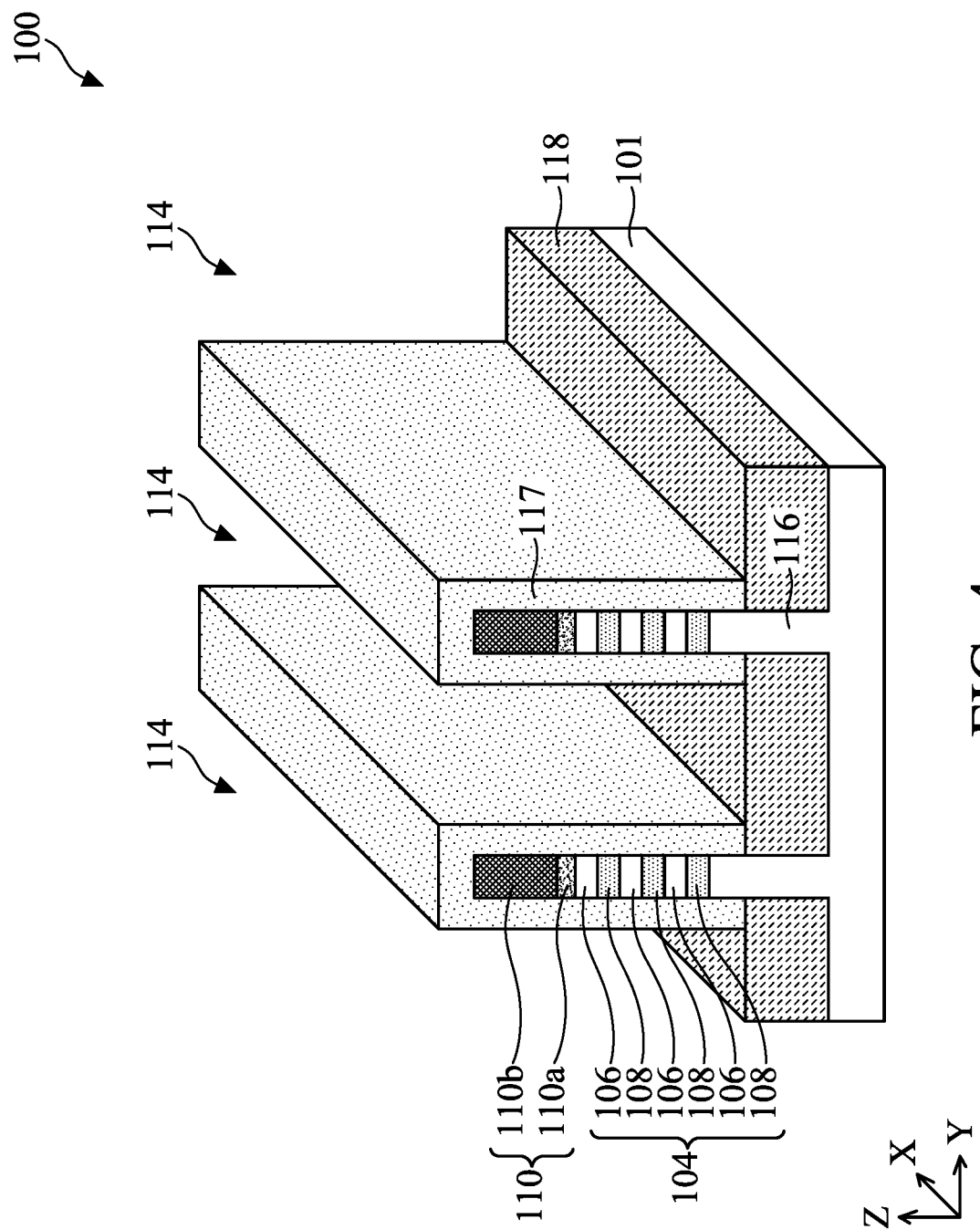

In FIG. 4, a cladding layer 117 is formed by an epitaxial process over exposed portion of the fin structures 112. In some embodiments, a semiconductor liner (not shown) may be first formed over the fin structures 112, and the cladding layer 117 is then formed over the semiconductor liner. The semiconductor liner may be diffused into the cladding layer 117 during the formation of the cladding layer 117. In either case, the cladding layer 117 is in contact with the stack of semiconductor layers 104. In some embodiments, the cladding layer 117 and the second semiconductor layers 108 include the same material having the same etch selectivity. For example, the cladding layer 117 and the second semiconductor layers 108 may be or include SiGe. The cladding layer 117 and the second semiconductor layers 108 may be removed subsequently to create space for the subsequently formed gate electrode layer.

Figure 5:
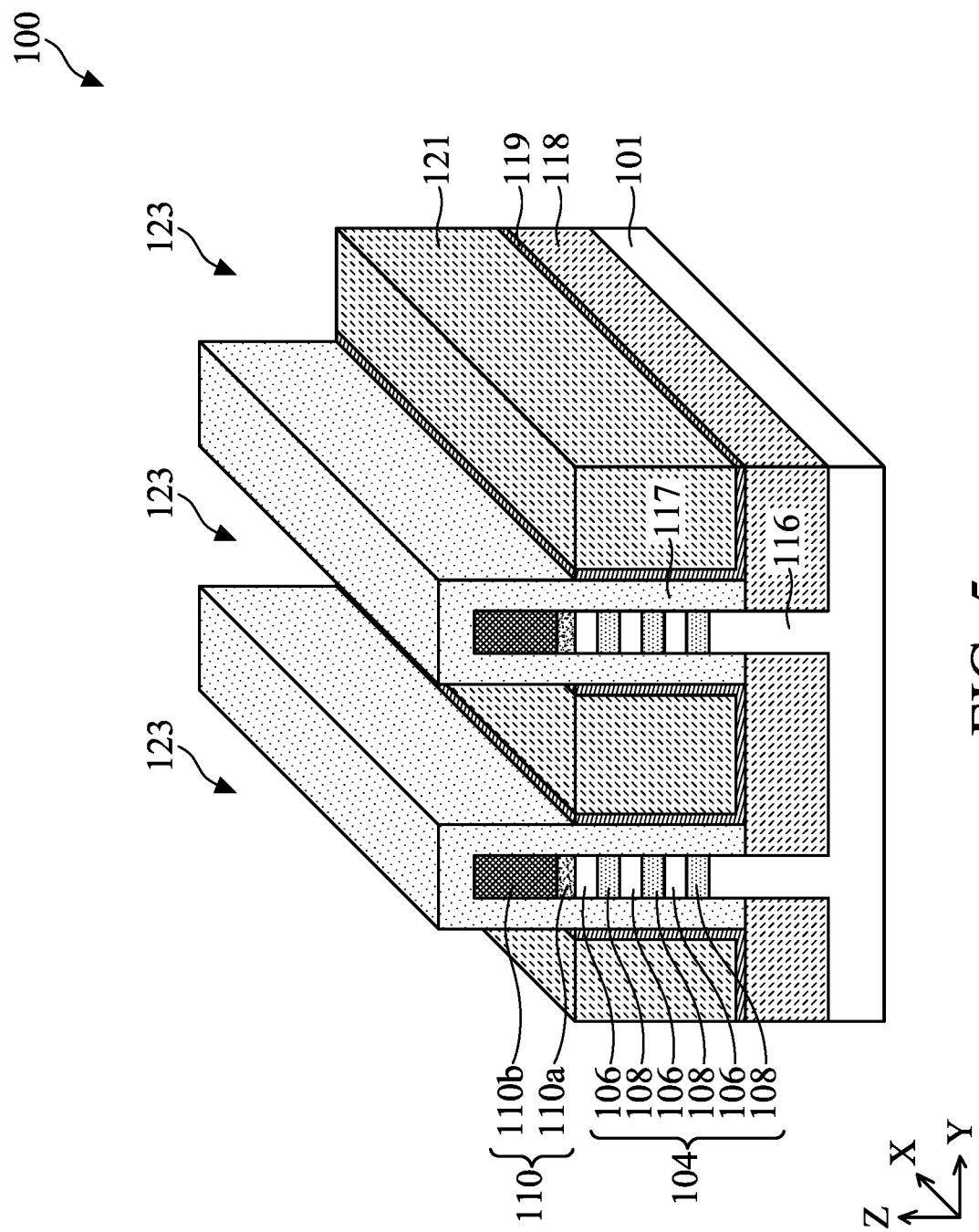

In FIG. 5, a liner 119 is formed on the cladding layer 117 and the top surface of the insulating material 118. The liner 119 may include a material having a k value lower than 7, such as $SiO_2$, SiN, SiCN, SiOC, or SiOCN. The liner 119 may be formed by a conformal process, such as an ALD process. A dielectric material 121 is then formed in the trenches 114 (FIG. 4) and on the liner 119. The dielectric material 121 may be an oxygen-containing material, such as an oxide, formed by FCVD. The oxygen-containing material may have a k value less than about 7, for example less than about 3. A planarization process, such as a CMP process, may be performed to remove portions of the liner 119 and the dielectric material 121 formed over the fin structures 112. The portion of the cladding layer 117 disposed on the hard mask 110b is exposed after the planarization process.

Next, the liner 119 and the dielectric material 121 are recessed to the level of the topmost first semiconductor layer 106. For example, in some embodiments, after the recess process, the top surfaces of the liner 119 and the dielectric material 121 may be level with a top surface of the uppermost first semiconductor layer 106. The recess processes may be selective etch processes that do not substantially affect the semiconductor material of the cladding layer 117. As a result of the recess process, trenches 123 are formed between the fin structures 112.

Figure 6:
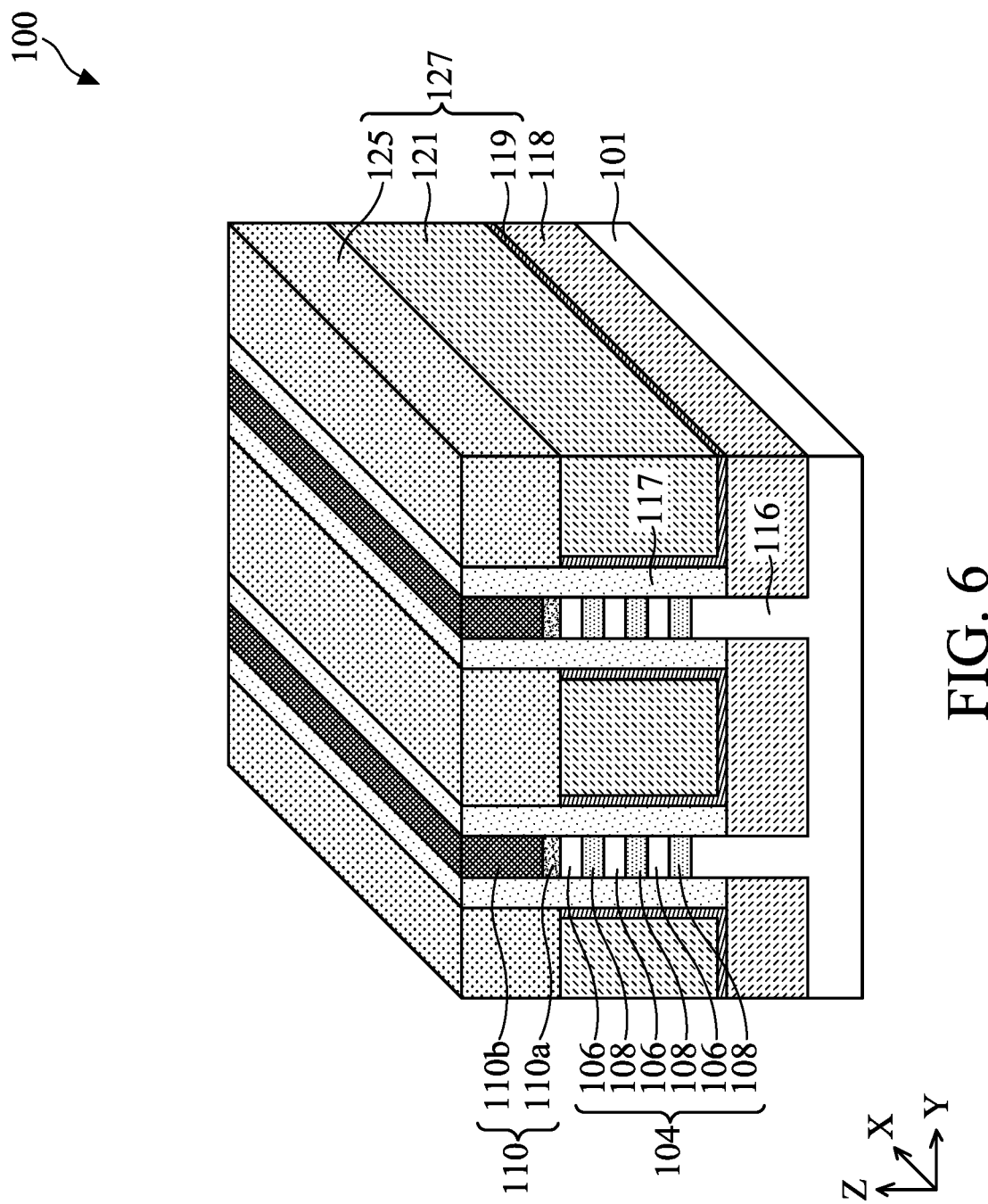

In FIG. 6, a dielectric material 125 is formed in the trenches 123 (FIG. 5) and on the dielectric material 121 and the liner 119. The dielectric material 125 may include SiO, SiN, SiC, SiCN, SiON, SiOCN, AlO, AlN, AlON, ZrO, ZrN, ZrAlO, HfO, or other suitable dielectric material. In some embodiments, the dielectric material 125 includes a high-k dielectric material (e.g., a material having a k value greater than 7). The dielectric material 125 may be formed by any suitable process, such as a CVD, PECVD, FCVD, or ALD process. A planarization process, such as a CMP process, is performed until the hard mask 110b of the mask structure 110 is exposed. The planarization process removes portions of the dielectric material 125 and the cladding layer 117 disposed over the mask structure 110. The liner 119, the dielectric material 121, and the dielectric material 125 together may be referred to as a dielectric feature 127 or a hybrid fin. The dielectric feature 127 serves to separate subsequent formed source/drain (S/D) epitaxial features and adjacent gate electrode layers.

Figure 7:
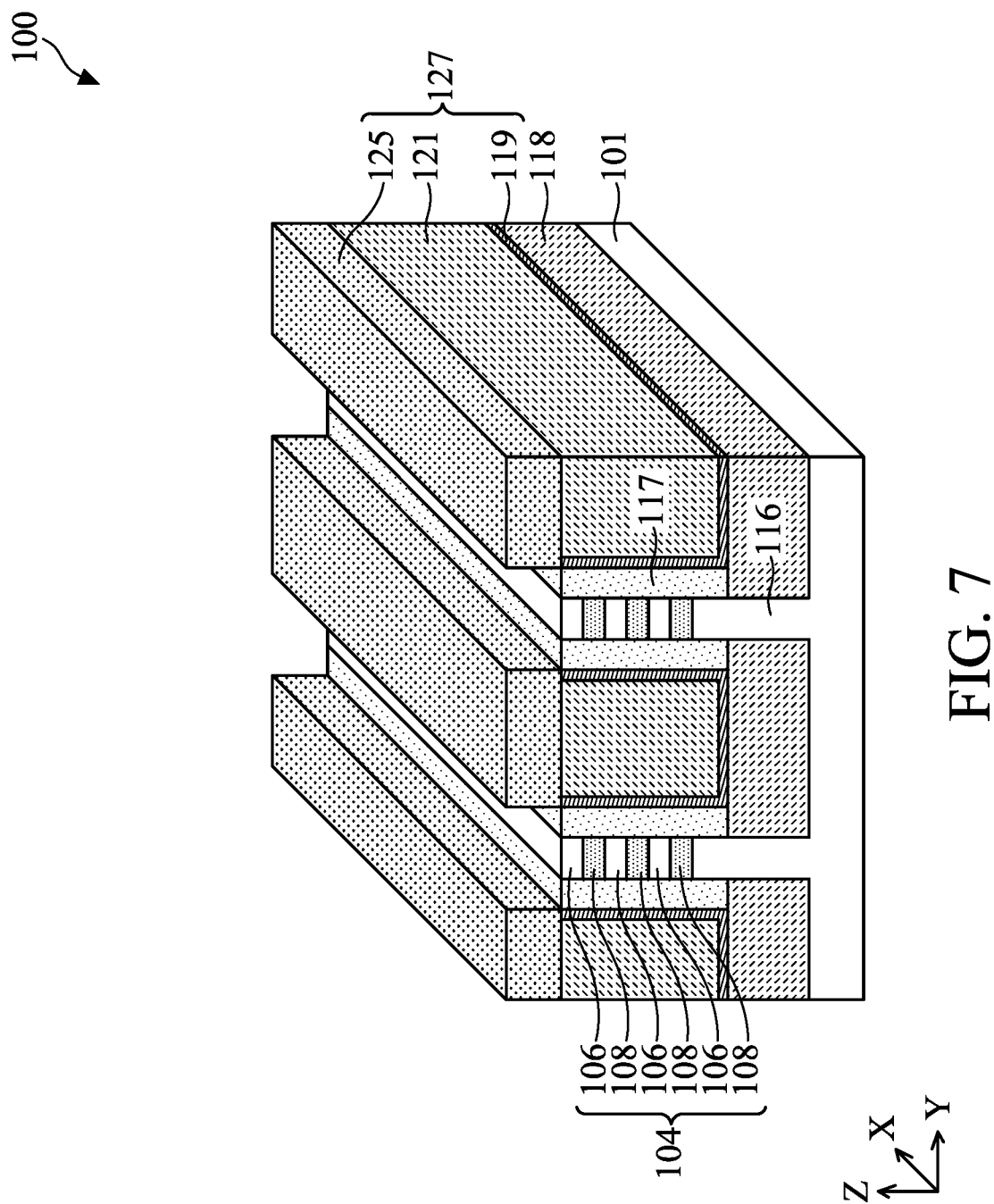

In FIG. 7, the cladding layers 117 are recessed, and the mask structures 110 are removed. The recess of the cladding layers 117 may be performed by any suitable process, such as dry etch, wet etch, or a combination thereof. The recess process may be controlled so that the remaining cladding layers 117 are substantially at the same level as the top surface of the uppermost first semiconductor layer 106 in the stack of semiconductor layers 104. The etch process may be a selective etch process that does not substantially affect the dielectric material 125. The removal of the mask structures 110 may be performed by any suitable process, such as dry etch, wet etch, or a combination thereof.

Figure 8:
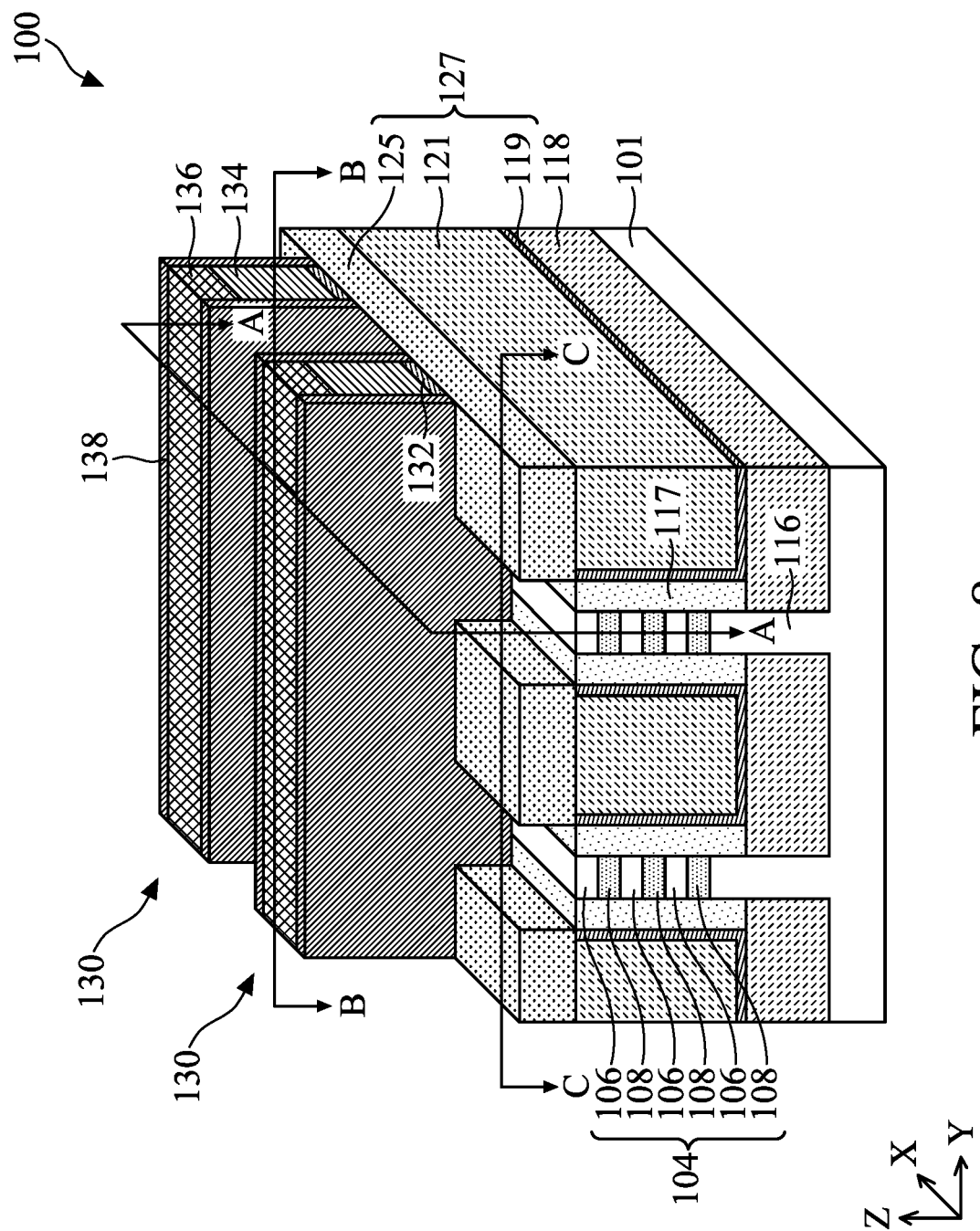

In FIG. 8, one or more sacrificial gate structures 130 (only two is shown) are formed over the semiconductor device structure 100. The sacrificial gate structures 130 are formed over a portion of the fin structures 112. Each sacrificial gate structure 130 may include a sacrificial gate dielectric layer 132, a sacrificial gate electrode layer 134, and a mask layer 136. The sacrificial gate dielectric layer 132, the sacrificial gate electrode layer 134, and the mask layer 136 may be formed by sequentially depositing blanket layers of the sacrificial gate dielectric layer 132, the sacrificial gate electrode layer 134, and the mask layer 136, followed by pattern and etch processes. For example, the pattern process includes a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etch process may include dry etch (e.g., RIE), wet etch, other etch methods, and/or combinations thereof.

By patterning the sacrificial gate structure 130, the stacks of semiconductor layers 104 of the fin structures 112 are partially exposed on opposite sides of the sacrificial gate structure 130. The portions of the fin structures 112 that are covered by the sacrificial gate electrode layer 134 of the sacrificial gate structure 130 serve as channel regions for the semiconductor device structure 100. The fin structures 112 that are partially exposed on opposite sides of the sacrificial gate structure 130 define source/drain (S/D) regions for the semiconductor device structure 100. While two sacrificial gate structures 130 are shown, three or more sacrificial gate structures 130 may be arranged along the X direction in some embodiments.

Next, gate spacers 138 are formed on sidewalls of the sacrificial gate structures 130. The gate spacers 138 may be formed by first depositing a conformal layer that is subsequently etched back to form sidewall gate spacers 138. For example, a spacer material layer can be disposed conformally on the exposed surfaces of the semiconductor device structure 100. The conformal spacer material layer may be formed by an ALD process. Subsequently, anisotropic etch is performed on the spacer material layer using, for example, RIE. During the anisotropic etch process, most of the spacer material layer is removed from horizontal surfaces, such as the tops of the fin structures 112, the cladding layer 117, the dielectric material 125, leaving the gate spacers 138 on the vertical surfaces, such as the sidewalls of sacrificial gate structures 130. The gate spacer 138 may be made of a dielectric material such as silicon oxide, silicon nitride, silicon carbide, silicon oxynitride, SiCN, silicon oxycarbide, SiOCN, and/or combinations thereof.

In some embodiments where the cladding layers 117 and the dielectric features 127 are not present, portions of the sacrificial gate structures 130 and the gate spacers 138 are formed on the insulating material 118, and gaps are formed between exposed portions of the fin structures 112.

FIGS. 9A-11A and 14A-18A are cross-sectional side views of various stages of manufacturing the semiconductor device structure 100 taken along cross-section A-A of FIG. 8, in accordance with some embodiments. FIGS. 9B-11B and 14B-18B are cross-sectional side views of various stages of manufacturing the semiconductor device structure 100 taken along cross-section B-B of FIG. 8, in accordance with some embodiments. FIGS. 9C-11C and 14C-18C are cross-sectional side views of various stages of manufacturing the semiconductor device structure 100 taken along cross-section C-C of FIG. 8, in accordance with some embodiments. Cross-section A-A is in a plane of the fin structure 112 along the X direction. Cross-section B-B is in a plane perpendicular to cross-section A-A and is in the sacrificial gate structure 130. Cross-section C-C is in a plane perpendicular to cross-section A-A and is in the S/D epitaxial features 146 (FIG. 14A) along the Y-direction.

Figure 9A:
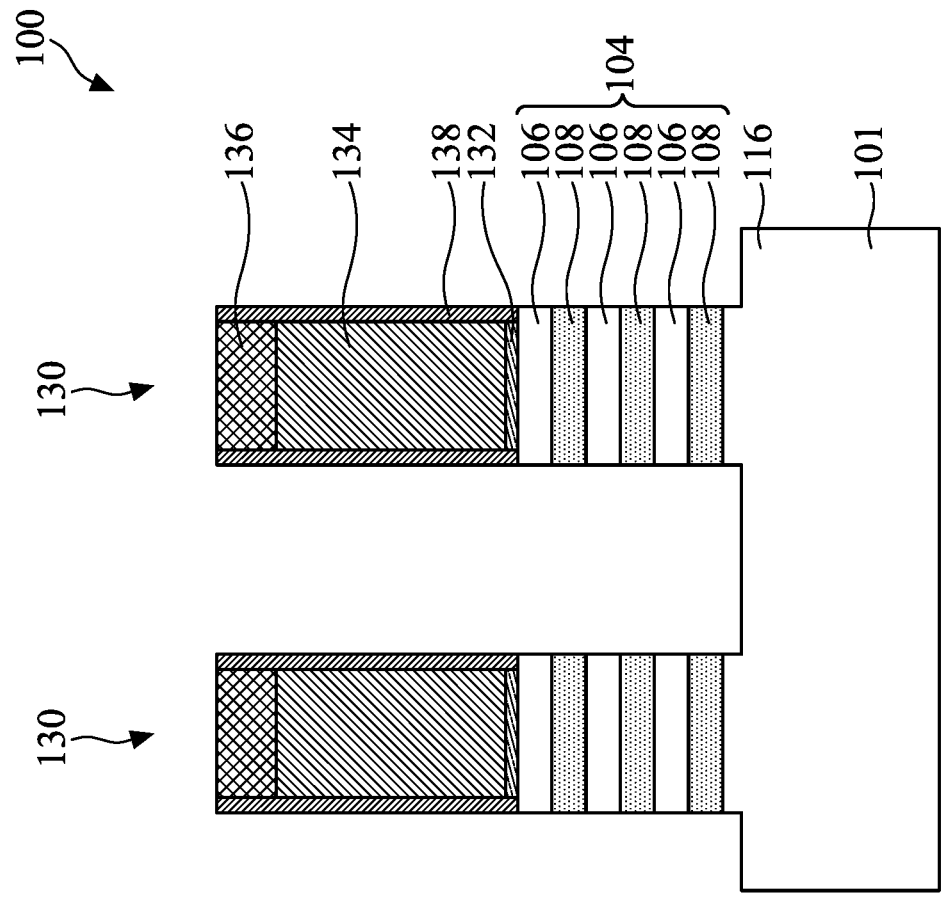
Figure 9C:
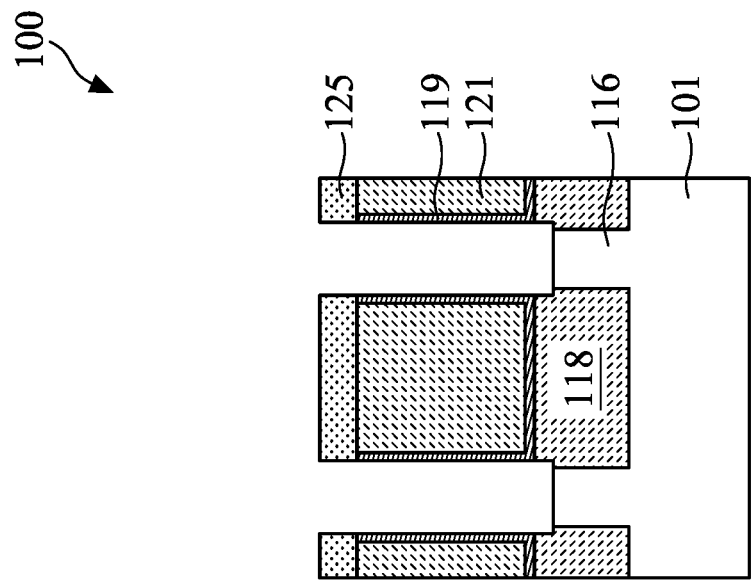
Figure 9B:
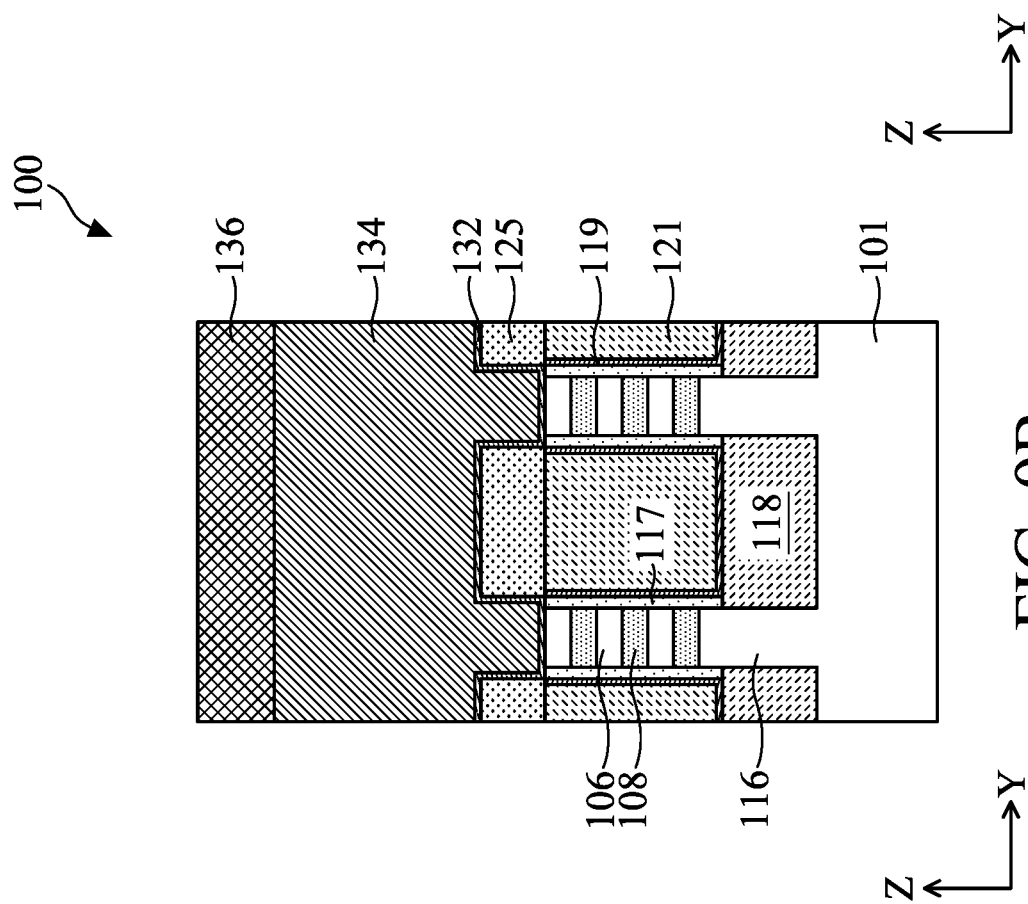

In FIGS. 9A-9C, exposed portions of the fin structures 112, exposed portions of the cladding layers 117, and exposed portions of the dielectric material 125 not covered by the sacrificial gate structures 130 and the gate spacers 138 are selectively recessed by using one or more suitable etch processes, such as dry etch, wet etch, or a combination thereof. In some embodiments, exposed portions of the stacks of semiconductor layers 104 of the fin structures 112 are removed, exposing portions of the well portions 116. As shown in FIG. 9A, the exposed portions of the fin structures 112 are recessed to a level at or slightly below the bottom surface of the second semiconductor layer 108 in contact with the well portion 116 of the substrate 101. The recess processes may include an etch process that recesses the exposed portions of the fin structures 112 and the exposed portions of the cladding layers 117.

Figure 10A:
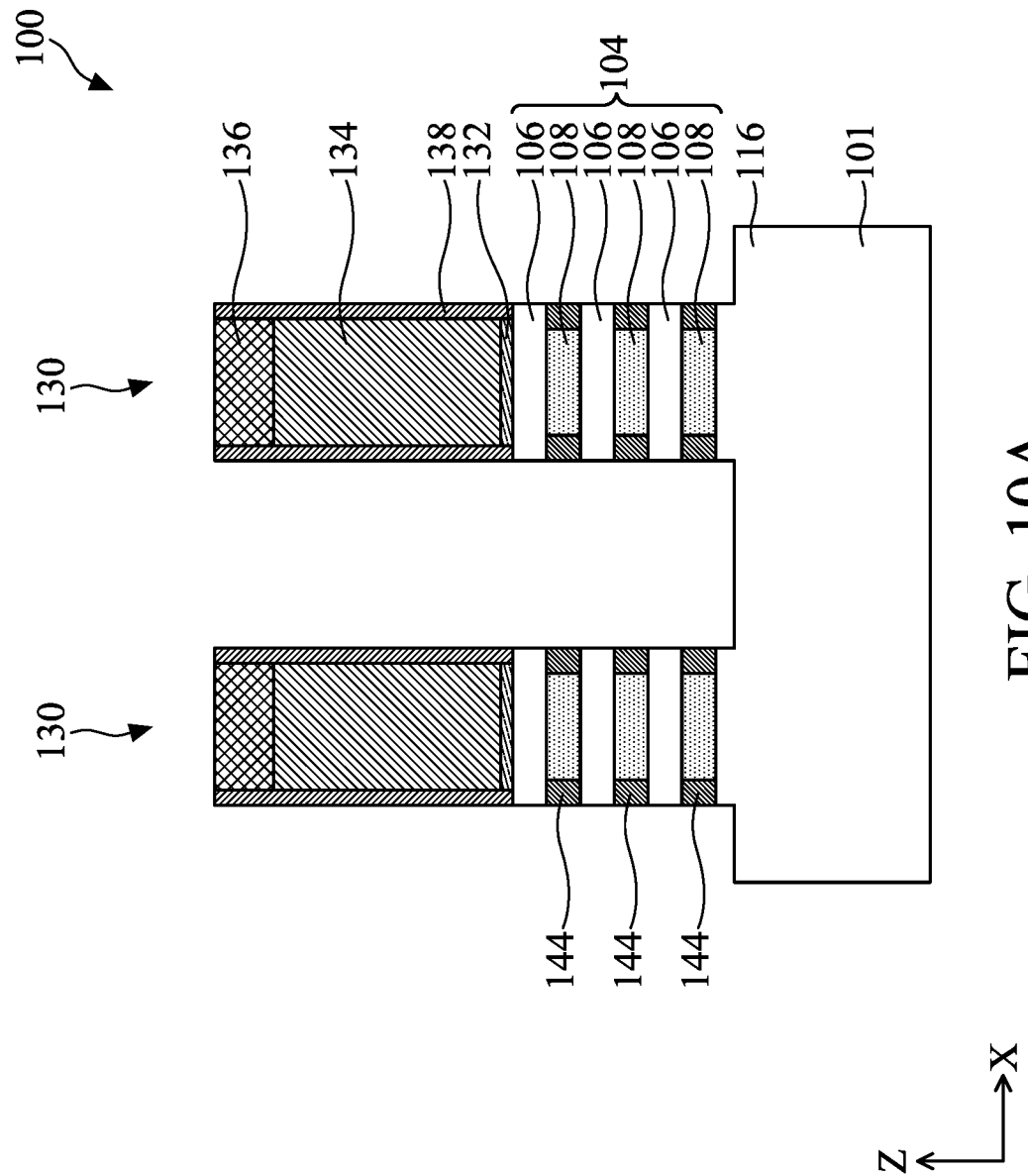
Figure 10B:
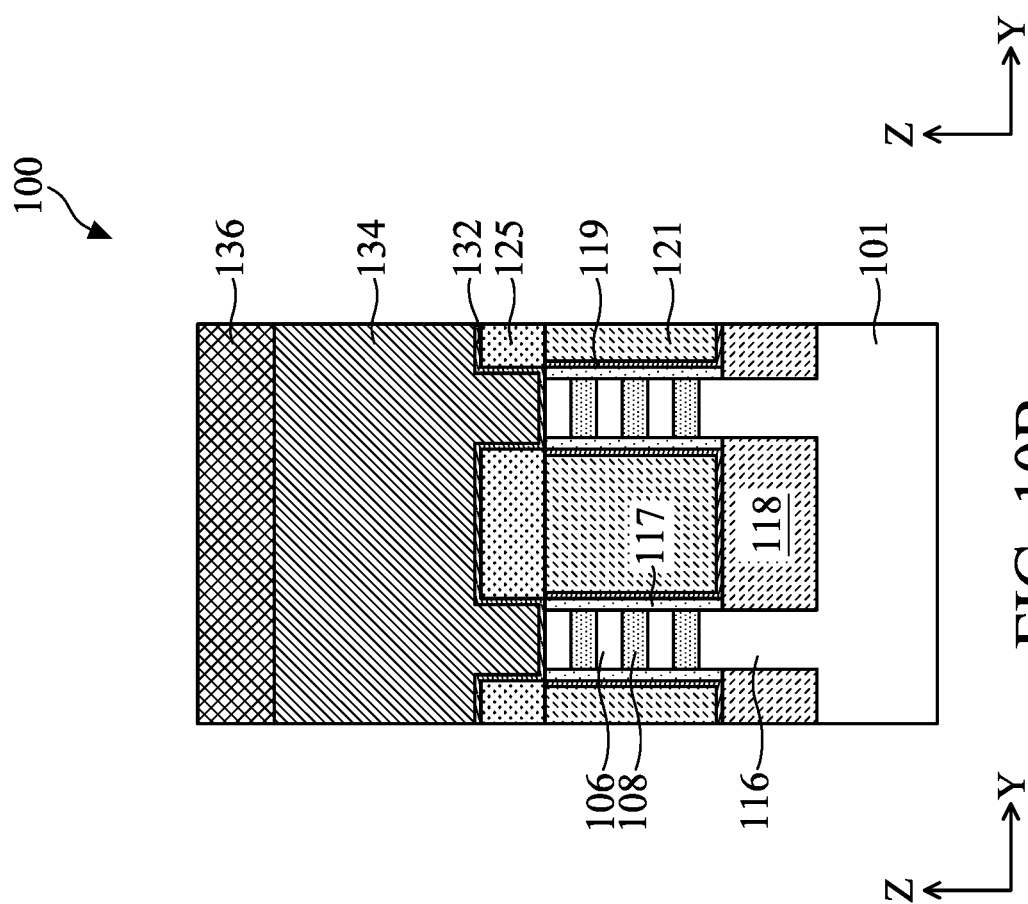
Figure 10C:
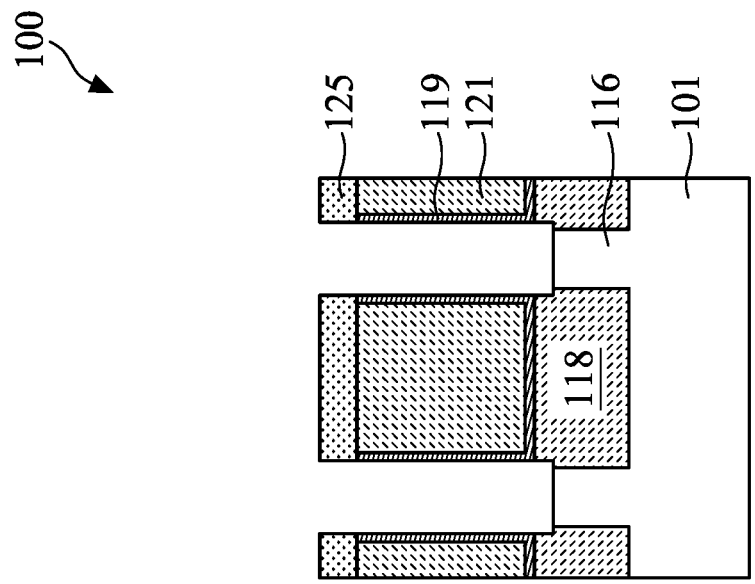

In FIGS. 10A-10C, edge portions of each second semiconductor layer 108 of the stack of semiconductor layers 104 are removed horizontally along the X direction. The removal of the edge portions of the second semiconductor layers 108 forms cavities. In some embodiments, the portions of the second semiconductor layers 108 are removed by a selective wet etching process. In cases where the second semiconductor layers 108 are made of SiGe and the first semiconductor layers 106 are made of silicon and/or SiGe having lower germanium concentration than the second semiconductor layers 108, the second semiconductor layer 108 can be selectively etched using a wet etchant such as, but not limited to, ammonium hydroxide (NH$_4$OH), tetramethylammonium hydroxide (TMAH), ethylenediamine pyrocatechol (EDP), or potassium hydroxide (KOH) solutions.

After removing edge portions of each second semiconductor layers 108, a dielectric layer is deposited in the cavities to form dielectric spacers 144. The dielectric spacers 144 may be made of SiON, SiCN, SiOC, SiOCN, or SiN. The dielectric spacers 144 may be formed by first forming a conformal dielectric layer using a conformal deposition process, such as ALD, followed by an anisotropic etching to remove portions of the conformal dielectric layer other than the dielectric spacers 144. The dielectric spacers 144 are protected by the first semiconductor layers 106 during the anisotropic etching process. The remaining second semiconductor layers 108 are capped between the dielectric spacers 144 along the X direction.

Figures 1B, 11A:
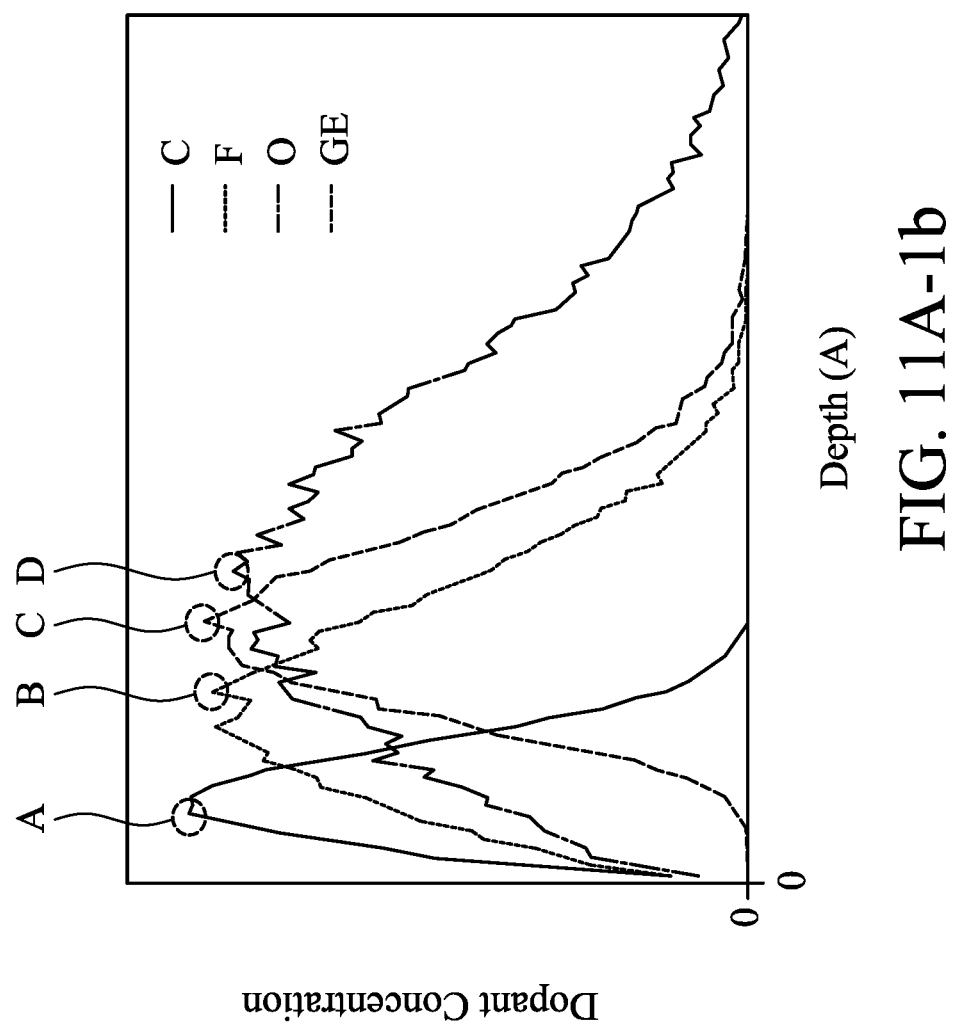
Figure 11B:
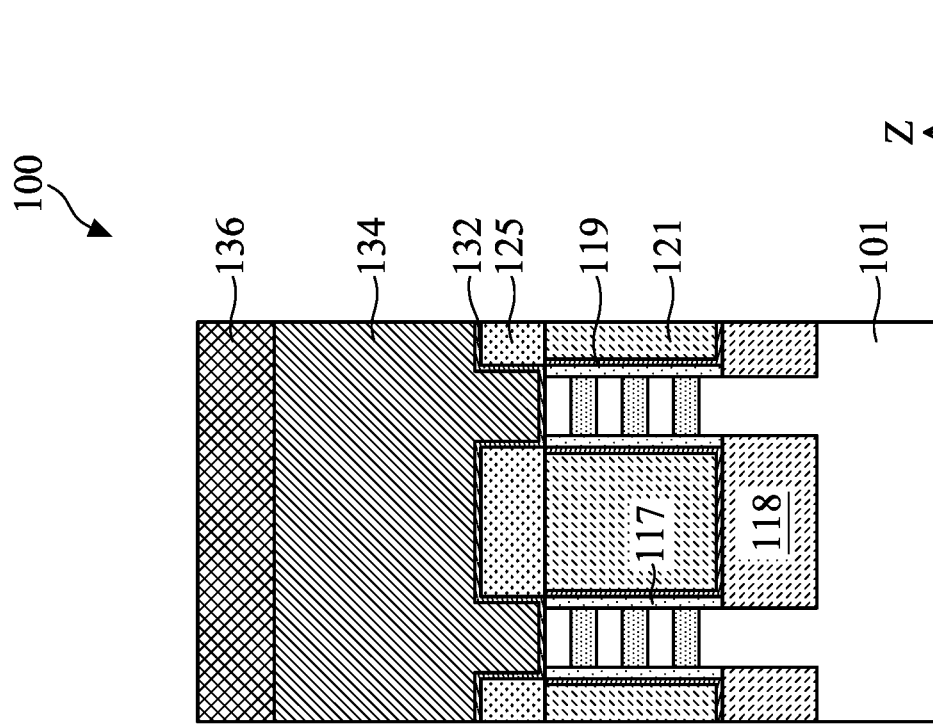
Figure 11C:
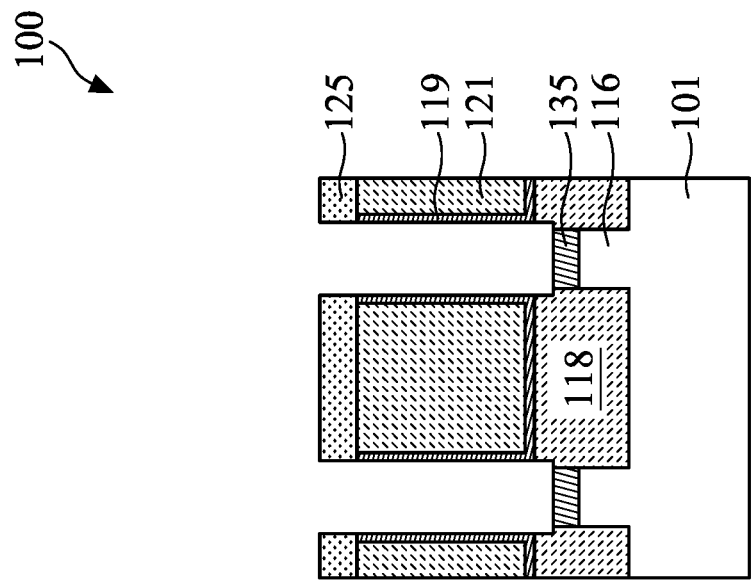

In FIGS. 11A-11C, after formation of the dielectric spacers 144, the semiconductor device structure 100 is subjected to an ion implantation process 131. Particularly, the ion implantation process 131 is performed so that majority of the ion species (dopants) are implanted into the substrate 101 at the source/drain (S/D) regions not covered by the sacrificial gate structures 130. The sacrificial gate structures 130 may be protected by a mask or resist layer (not shown) during the ion implantation process 131. The implanted regions are then oxidized (FIG. 11A-1) to form dielectric regions at and/or near the exposed surface of the substrate 101 in the S/D regions. In various embodiments, the ion implantation process 131 changes material properties of the substrate 101 so that the implanted regions can be oxidized at a faster rate. For example, the implanted dopants may be selected to increase oxidation rate of the implanted regions by transforming the implanted region into an amorphous state. Additionally or alternatively, the implanted dopants may be selected to decrease temperature of the subsequent oxidation process, which in turn increases the reaction rate of the oxidation process. Additionally or alternatively, the implanted dopants may be selected to promote oxidation of the implanted regions while preventing loss of the dielectric regions during the subsequent S/D pre-clean process.

The ion implantation process 131 may employ one or more ion species. In some embodiments, the ion implantation process 131 employs a first group of ion species ("Group 1") comprising fluorine (F), tin (Sn), antimony (Sb), or phosphorus (P), or atoms having an atomic radius of about 0.5 times to about 1.5 times the atomic radius of silicon, or any combination thereof; a second group of ion species ("Group 2") comprising inert gas, such as neon (Ne), argon (Ar), krypton (Kr), xenon (Xe), or radon (Rn), or any combination thereof; a third group of ion species ("Group 3") comprising germanium (Ge), arsenic (As), or combination thereof; a fourth group of ion species ("Group 4") comprising oxygen (O); and/or a fifth group of ion species ("Group 5") comprising carbon (C) or nitrogen (N). The first and second groups of ion species (e.g., Sn, Sb, and P) may be employed to enhance oxidation of silicon due to the chemical effect between oxygen and silicon at the interface of Si—SiO$_2$ induced by ion implantation. In some embodiments, the first group of ion species (e.g., Ar) may be employed to lower the activation energy of oxygen and promote chemical reaction between the implanted ions and the silicon substrate. As a result, the oxidation rate of the implanted regions is increased. In some embodiments, the first group of ion species (e.g., F) may be employed to promote growth of oxides on silicon when implanted with F ion species. The third group of ion species (e.g., Ge) may be employed to increase oxidation rate of the implanted regions by transforming the implanted region into an amorphous state, which in turn lowers the temperature needed for performing of the oxidation process. The fourth group of ion species may be employed to provide oxygen into the implanted regions which enhances oxidation of silicon substrate. The fifth group of ion species (e.g., C) may be employed to protect the dielectric regions from the subsequent S/D pre-clean process.

In some embodiments, the ion implantation process 131 employs one or more species of the first, second, third, fourth, and fifth groups of ion species. The first, second, third, fourth, and fifth groups of ion species may be implanted in any order. In some embodiments, the first, second, third, fourth, and fifth groups of ion species are implanted in the following order: Group 4-Group 3-Group 1-Group 2-Group 5. In some embodiments, the first, second, third, fourth, and fifth groups of ion species are implanted in the following order: Group 4-Group 2-Group 1-Group 3-Group 5. In some embodiments, the first, second, third, fourth, and fifth groups of ion species are implanted in the following order: Group 4-Group 3-Group 1-Group 2-Group 5.

In some embodiments, the ion implantation process 131 employs one or more species of the first, third, fourth, and fifth groups of ion species. The first, third, fourth, and fifth groups of ion species may be implanted in any order. In some embodiments, the first, third, fourth, and fifth groups of ion species are implanted in the following order: Group 4, Group 3, Group 1, Group 5. In some embodiments, the first, third, fourth, and fifth groups of ion species are implanted in the following order: Group 4-Group 1-Group 3-Group 5.

In some embodiments, the ion implantation process 131 employs one or more species of the first, third, and fifth groups of ion species. The first, third, and fifth groups of ion species may be implanted in any order. In some embodiments, the first, third, and fifth groups of ion species are implanted in the following order: Group 3-Group 1-Group 5. In some embodiments, the first, third, and fifth groups of ion species are implanted in the following order: Group 1-Group 3-Group 5.

The ion implantation process 131 may be a zero-degree tilt implantation process performed at a low-temperature range (e.g., 25 degrees Celsius to about 150 degrees Celsius). While various ion species may distribute over the implanted region in both lateral and vertical directions, the implant dosage and ion kinetic energy for each group of ion species may be selected to achieve desired implant concentration profile in the target regions. The ion species of each group may be implanted at a kinetic energy in a range of about 0.3 KeV to about 10 KeV, such as about 0.5 KeV to about 5 KeV, and an implant dosage of each group of ion species may be in a range of about $1E10^{12}$ atoms/cm$^2$ to about $3E10^{22}$ atoms/cm$^2$, such as about $1E10^{16}$ atoms/cm$^2$ to about $6E10^{15}$ atoms/cm$^2$, which may vary depending on the mass and intended purpose of the ions. In various embodiments, the implantation of various ion species forms an implanted region 133 having a depth D1 measuring from the exposed top surface of the substrate 101 to a bottom of the implanted region 133. The nanosheet channel (e.g., first semiconductor layer 106) may have a height H1 in a range of about 2 nm to about 14 nm. In some embodiments, the depth D1 may be in a range from about 10 nm to about 100 nm, such as about 20 nm to about 50 nm. If the depth D1 is less than 10 nm, the implanted region, which is to be transformed into a dielectric region, may not be sufficient to block current leakage in the substrate flowing from source region to drain region when the gate is in an "off" state. On the other hand, if the depth D1 is greater than 100 nm, the manufacturing cost is increased without significant advantage.

Figures 1A, 12:
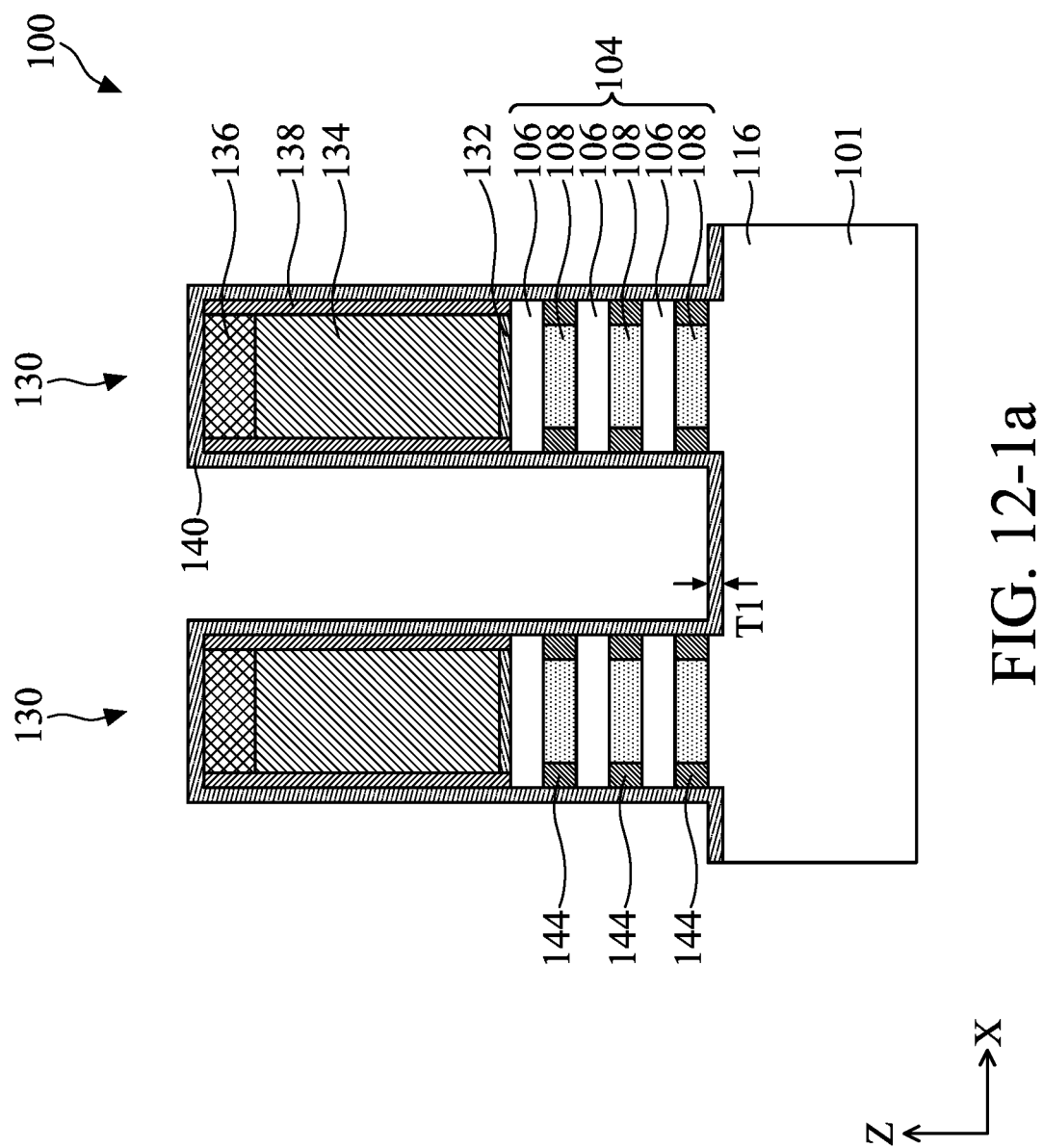
Figures 1B, 12:
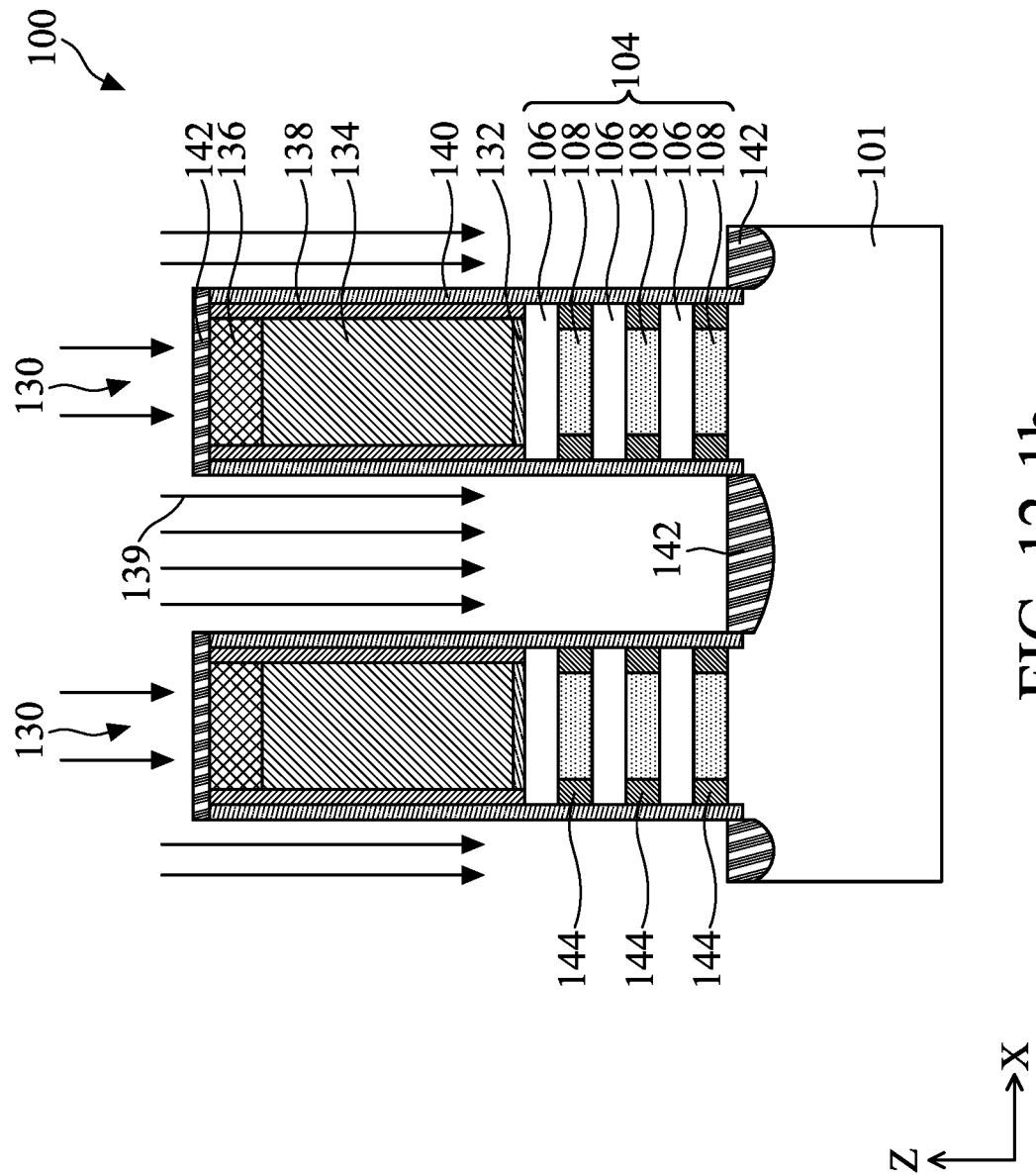
Figures 3, 12:
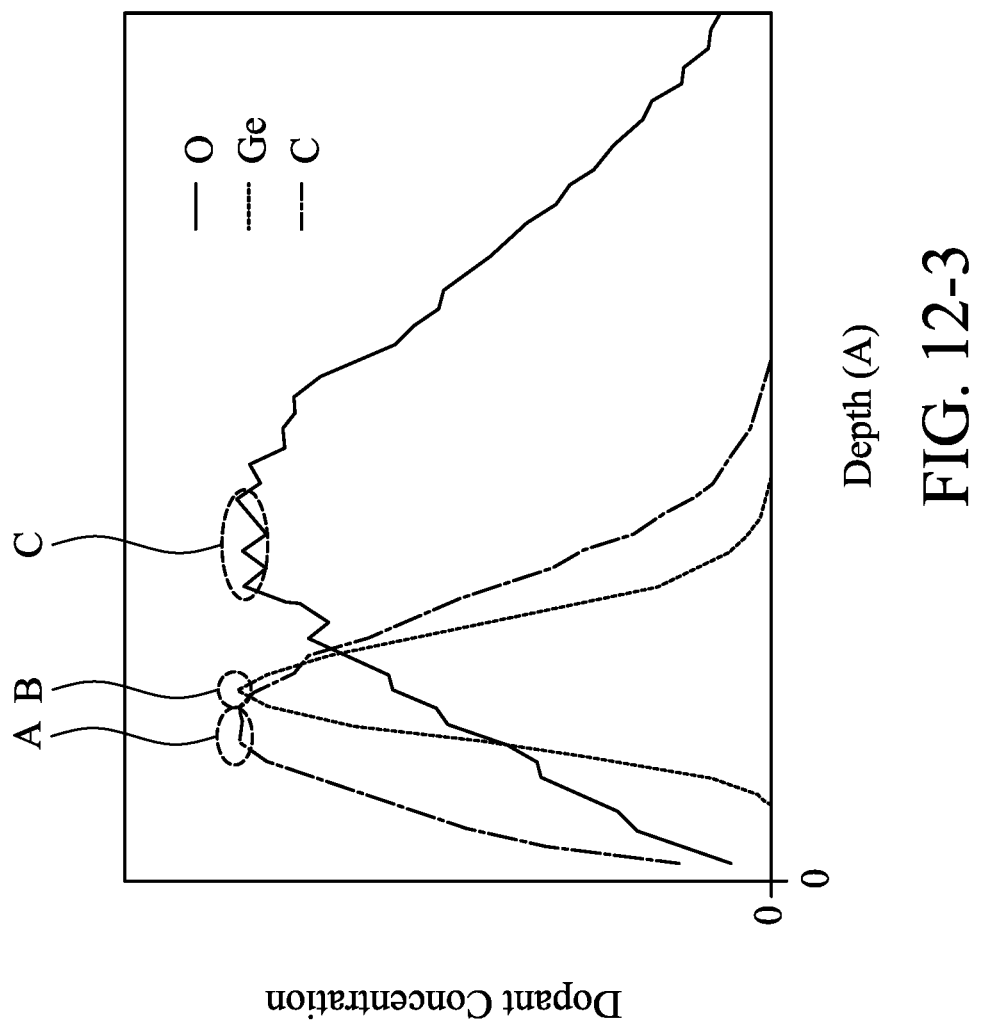

In one exemplary embodiment, the ion implantation process 131 is performed to implant ion species of F, Ge, O, and C into the substrate 101 at the source/drain (S/D) regions (e.g., implanted region 133), and the ion species are implanted in an order of O—Ge—F—C. In some embodiments, the ion species F discussed herein are replaced by Sn. FIG. 11A-1a is an enlarged view of a portion of the implanted region 133 showing an implant profile according to the exemplary embodiment. In cases where the substrate 101 is formed of silicon, the implant profile may include a first implant region 133-1 consisting of SiOx (0≤x≤2), a second implant region 133-2 consisting of Si$_{1-x}$Ge$_x$ (0≤x≤1) and disposed over the first implant region 133-1, a third implant region 133-3 consisting of SiF$_x$ (0≤x≤4) and disposed over the second implant region 133-2, and a fourth implant region 133-4 consisting of SiC$_x$ (x≤0) and disposed over the third implant region 133-3. It is contemplated that ion implantation process 131 using different groups of ion species may show similar/additional implant regions depending on the ion species implanted. FIG. 11A-1b is a graph showing density (dopant concentration) of O, Ge, F, and C ion species in the substrate 101 as a function of the depth after implantation using kinetic energies according to the exemplary embodiment. Each of the O, Ge, F, and C ion species has a substantial Gaussian distribution, and the distribution profile of the O, Ge, F, and C ion species are overlapped in part with each other. In one embodiment shown in FIG. 11A-1b, the distribution profile of the C ion species has a peak atomic density "A" at the depth of about 15 Å to 20 Å from the exposed top surface of the substrate 101; the distribution profile of the F ion species has a peak atomic density "B" at the depth of about 45 Å to 50 Å from the exposed top surface of the substrate 101; the distribution profile of the Ge ion species has a peak atomic density "C" at the depth of about 60 Å to 65 Å from the exposed top surface of the substrate 101; and the distribution profile of the O ion species has a peak atomic density "D" at the depth of about 70 Å to 75 Å from the exposed top surface of the substrate 101.

After the ion implantation process 131, the semiconductor device structure 100 is subjected to an oxidation process to oxidize and transform the implanted region 133 into dielectric regions 135, as shown in FIG. 11A-1. During the oxidation process, the implanted region 133 may be fully oxidized, while the exposed sidewall surfaces of the stack of the semiconductor layer 104 (e.g., first semiconductor layers 106 and dielectric spacers 144) and the sacrificial gate structures 130 may be non-oxidized or slightly oxidized. The implanted regions 133 are oxidized at a faster rate than the exposed sidewall surfaces of the first semiconductor layers 106, dielectric spacers 144, and the gate spacers 138 due to the chemical/physical effects provided by the implanted ion species. The oxidation process may be any suitable oxidation process, such as a wet oxidation process, a dry thermal oxidation process, or a combination thereof, in an ambient comprising $O_2$, $H_2O$, NO, or any combination thereof. In some embodiments, the semiconductor device structure 100 is further exposed to $H_2$, $N_2$, $NH_3$, or the like, which may serve as dilution gas and/or to assist the oxidation process. In some embodiments, the semiconductor device structure 100 is exposed to a wet oxidation process using water vapor or steam as the oxidant, at a pressure of about 1 Torr to about 40 ATM, within a temperature range of about 300 degrees Celsius to about 900 degrees Celsius, such as about 400 degrees Celsius to about 600 degrees Celsius, and for a time from about 20 minutes to about 2 hours. The oxidation process performed at lower temperature (e.g., below 600 degrees Celsius) can minimize oxidation of the exposed surfaces of the stack of the semiconductor layer 104 and the sacrificial gate structures 130. It is noted that the oxidation process conditions provided herein are merely exemplary, and are not meant to be limiting.

Figures 1C, 12:
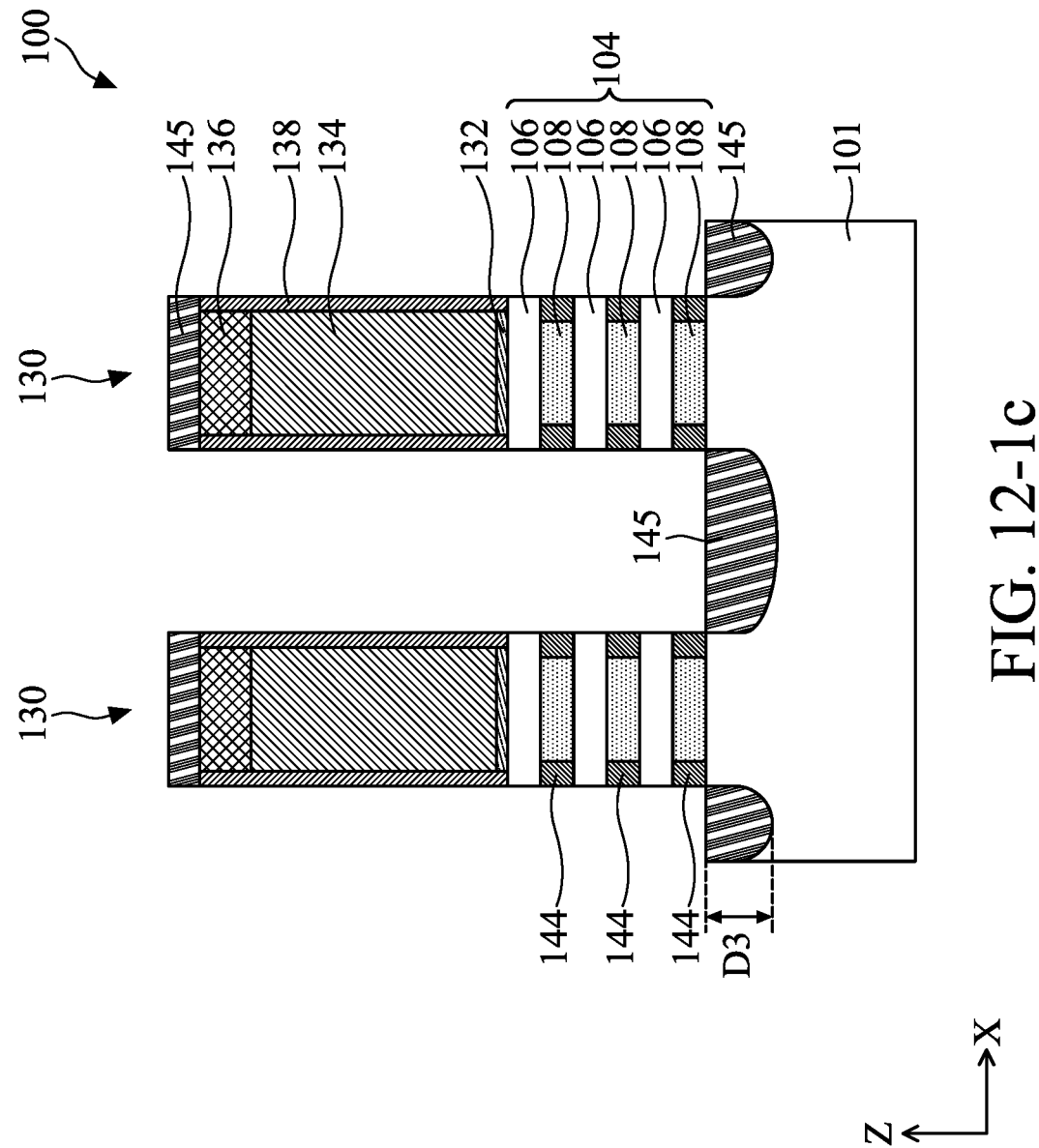

The temperature of the oxidation process may cause the implanted ion species to diffuse laterally and vertically in the substrate 101, resulting in greater depth of the dielectric region 135. FIG. 11A-1c is an enlarged view of a portion 199 of the dielectric region 135 showing an oxidation profile corresponding to the profile of the implanted region 133. In cases where the substrate 101 is formed of silicon (e.g., pure silicon), the dielectric region 135 may include SiO with implanted species after the oxidation process, and the oxidation profile in the dielectric region 135 includes a first oxidation region 135-1 consisting of silicon oxide in which the oxygen content ranges from about 30 at. % to about 70 at. %, a second oxidation region 135-2 consisting of silicon germanium oxide and formed over the first oxidation region 135-1, where the germanium content in the second oxidation region 135-2 ranges from about 20 at. % to about 50 at. %, a third oxidation region 135-3 consisting of silicon fluoride oxide and formed over the second oxidation region 135-2, where the fluorine content in the third oxidation region 135-3 ranges from about 2 at. % to about 5 at. %, and a fourth oxidation region 135-4 consisting of silicon carbon oxide and formed over the third oxidation region 135-3, where the carbon content in the fourth oxidation region 135-4 ranges from about 20 at. % to about 50 at. %. The first oxidation region 135-1 may have a depth D6 measuring at its broadest thickness, the second oxidation region 135-2 may have a depth D7 measuring at its broadest thickness, the third oxidation region 135-3 may have a depth D8 measuring at its broadest thickness, and the fourth oxidation region 135-4 may have a depth D9 measuring at its broadest thickness. In one exemplary embodiment, a ratio of depth of the first, second, third, and fourth oxidation regions is about 1.5:1:1:0.5. It is contemplated that the ratio here is for illustration purposes only and may vary depending on the temperature of the oxidation process. In some embodiments, the depth D8 of the third oxidation region 135-3 may be less than that of the third implant region 133-3 due to combination and evaporation of fluorine atoms during the oxidation process.

The oxidation process may also form a thin oxide layer 137 on the exposed surfaces of the substrate 101. In cases where the substrate 101 is formed of silicon, the oxide layer 137 is a silicon oxide formed as a result of the reaction between silicon and oxygen from the oxidation process. In some embodiments, the oxide layer 137 includes dopants (e.g., carbon) from the fourth implant region 133-4 (FIG. 11A-1a). In such cases, the oxide layer 137 can be considered as part of the dielectric region 135. In some embodiments, the oxide layer 137 is formed so that the top of the oxide layer 137 is in contact with the bottommost dielectric spacers 144, as shown in FIG. 11A-1b. The dielectric region 135 has a depth D2 measuring from the top surface of the oxide layer 137 to a bottom of the dielectric region 135. The depth D2 is greater than the depth D1 and may be in a range from about 20 nm to about 100 nm, such as about 30 nm to about 60 nm. In some embodiments, the depth D2 and the nanosheet channel height H1 may be at a ratio (D2:H1) of about 1.4:1 to about 50:1, such as about 3:1 to about 10:1, for example about 4:1. If the ratio (D2:H1) is less than about 1.4:1, the dielectric region 135 may not be sufficient to block current leakage in the substrate flowing from source region to drain region when the gate is in an "off" state. On the other hand, if the ratio (D2:H1) is greater than about 50:1 the manufacturing cost is increased without significant advantage.

In some embodiments, a thin oxide layer may be formed on the first semiconductor layers 106 as a result of the oxidation process. A clean process (e.g., dry etch, wet etch, or a combination thereof) may be performed subsequently to remove the thin oxide layer formed on the first semiconductor layers 106, while the dielectric regions 135 are not substantially affected by the clean process. Alternatively, any thin oxide layer formed on the first semiconductor layers 106 can be removed during the subsequent S/D pre-clean process, as will be discussed below.

The formation of the dielectric regions 135 and the oxide layer 137 is advantageous for controlling leakage current in gate all around (GAA) transistors (e.g., nanosheet transistors). While current in the channel regions can be controlled by the gate electrode layer which fully surrounds each channel region, the current in the substrate cannot be effectively controlled by the gate and thus, a flow of current leakage from source region to drain region through the substrate 101 is often observed, especially when the gate is in an "off" state (i.e., gate voltage is held below the threshold voltage). By forming a dielectric region 135 at the bottom of the S/D regions, current leakage through the substrate 101 is blocked when the gate is in off state. As a result, the device performance is increased.

It is contemplated that the various embodiments of this disclosure can be equally applied to FinFET transistors by forming a dielectric region at a bottom of S/D regions between neighboring gate structures. In such cases, the fin structures 112 are formed without the stack of semiconductor layers and the dielectric features 127 may be omitted so that portions of the gate structures wrap around at least three surfaces of the fin structures and in contact with the insulating material 118.

FIGS. 12-1a to 12-1c are cross-sectional side views of various stages of the semiconductor device structure 100 taken along cross-section A-A of FIG. 8, in accordance with some alternative embodiments. In the embodiment of FIGS. 12-1a to 12-1c, instead of performing an ion implantation process and then an oxidation process, a nitride layer is formed at and/or near exposed surface of the substrate 101 in the S/D regions and then oxidized to form dielectric regions. In FIGS. 12-1a, after formation of the dielectric spacers 144 (FIG. 10A), a nitrogen-containing layer 140 is conformally formed on the exposed surfaces of the semiconductor device structure 100. The nitrogen-containing layer 140 covers the exposed top surface of the substrate 101, the dielectric spacers 144, the first semiconductor layers 106, the gate spacers 138, and the mask layer 136. The nitrogen-containing layer 140 may be formed by an ALD process or any suitable conformal deposition technique. In some embodiments, the nitrogen-containing layer 140 may have a thickness (T1) in a range of about 10 nm to about 80 nm, for example about 20 nm to about 60 nm. Suitable nitrogen-containing layer 140 may include, but is not limited to, silicon nitride ($Si_3N_4$), silicon oxynitride ($SiO_xN_y$), silicon carbonitride (SiCN), silicon oxycarbonitride (SiOCN), silicon oxime ($SiO_xN_y:H_z$), any combination thereof, or the like.

In FIG. 12-1b, after formation of the nitrogen-containing layer 140, the semiconductor device structure 100 is subjected to an ion implantation process 139. Particularly, the ion implantation process 139 is performed so that majority of the ion species (dopants) are implanted into the nitrogen-containing layer 140 disposed on the horizontal surfaces of the semiconductor device structure 100, such as top surfaces of the gate spacers 138, the mask layer 136, and the top surface of the substrate 101 not covered by the sacrificial gate structures 130. The implanted nitrogen-containing layer 140 is then oxidized (FIG. 12-1c) to form dielectric regions at and/or near the surface of the substrate 101 in the S/D regions. Likewise, the ion implantation process 139 changes chemical/physical properties of the substrate 101 so that the implanted nitrogen-containing layer 140 can be oxidized at a faster rate.

The ion implantation process 139 may employ one or more ion species. In some embodiments, the ion implantation process 139 employs a first group of ion species ("Group 1") comprising inert gas, such as Ne, Ar, Kr, Xe, or Rn, or any combination thereof; a second group of ion species ("Group 2") comprising Ge, As, or combination thereof; a third group of ion species ("Group 3") comprising O; and a fourth group of ion species ("Group 4") comprising C or N. The first group of ion species (e.g., Ar) may be employed to promote chemical reaction between the implanted ions and the silicon substrate and increase the oxidation rate of the implanted regions. The second group of ion species (e.g., Ge) may be employed to increase oxidation rate of the implanted regions by transforming the implanted region into an amorphous state, which in turn lowers the temperature needed for performing of the oxidation process. The third group of ion species (e.g., O) may be employed to provide oxygen into the implanted regions and thus enhance oxidation of silicon substrate. The fourth group of ion species (e.g., C) may be employed to promote oxidation of the implanted regions while protecting the dielectric regions from the subsequent S/D pre-clean process.

In some embodiments, the ion implantation process 139 employs one or more species of the first, second, third, and fourth groups of ion species. The first, second, third, and fourth, groups of ion species may be implanted in any order. In some embodiments, the first, second, third, and fourth groups of ion species are implanted in the following order: Group 3-Group 2-Group 1-Group 4. In some embodiments, the first, second, third, and fourth groups of ion species are implanted in the following order: Group 3-Group 1-Group 2-Group 4.

In some embodiments, the ion implantation process 139 employs one or more species of the second, third, and fourth groups of ion species. The second, third, and fourth groups of ion species may be implanted in any order. In some embodiments, the second, third, and fourth groups of ion species are implanted in the following order: Group 3-Group 2-Group 4. In some embodiments, the first, third, and fifth groups of ion species are implanted in the following order: Group 2-Group 3-Group 4.

The ion implantation process 139 may be a zero-degree tilt implantation process. In some embodiments, the ion implantation process 139 is performed at a low-temperature range (e.g., 25 degrees Celsius to about 250 degrees Celsius). In some embodiments, the ion implantation process 139 may be performed in an oxygen-containing ambient at a temperature of about 200 degrees Celsius to about 250 degrees Celsius. The ion species of each group may be implanted at a kinetic energy in a range of about 0.3 KeV to about 10 KeV, such as about 0.5 KeV to about 5 KeV, and the implant dosage of each group of ion species may be in a range of about $1E10^{12}$ atoms/$cm^2$ to about $6E10^{22}$ atoms/$cm^2$, such as about $1E10^{15}$ atoms/$cm^2$ to about $8E10^{15}$ atoms/$cm^2$, which may vary depending on the mass and intended purpose of the ions. For example, the second group of ion species (e.g., Ge) may be implanted at a kinetic energy in a range of about 1.5 KeV to about 3 KeV, and the implant dosage of may be in a range of about $1E10^{15}$ atoms/$cm^2$ to about $1.5E10^{15}$ atoms/$cm^2$, the third group of ion species (e.g., 0) may be implanted at a kinetic energy in a range of about 0.5 KeV to about 1 KeV, and the implant dosage of may be in a range of about $1E10^{15}$ atoms/$cm^2$ to about $5E10^{15}$ atoms/$cm^2$, and the fourth group of ion species (e.g., C) may be implanted at a kinetic energy in a range of about 0.5 KeV to about 2 KeV, and the implant dosage of may be in a range of about $1E10^{15}$ atoms/$cm^2$ to about $3E10^{15}$ atoms/$cm^2$.

The implantation of various ion species forms an implanted region 142 in the nitrogen-containing layer 140 (i.e., implanted nitrogen-containing layer). The implanted region 142 may have a depth corresponding to the thickness T1 of the nitrogen-containing layer 140. In one exemplary embodiment, the ion implantation process 139 is performed to implant ion species of O, Ge, and C into the nitrogen-containing layer 140, and the ion species are implanted in an order of O—Ge—C. FIG. 12-3 is a graph showing density (dopant concentration) of O, Ge, and C ion species in the nitrogen-containing layer 140 (e.g., implanted regions) as a function of the depth (Å) after implantation using kinetic energies according to the exemplary embodiment. Each of the O, Ge, and C ion species has a substantial Gaussian distribution, and the distribution profile of the O, Ge, and C ion species are overlapped in part with each other. In one embodiment shown in FIG. 12-3, the distribution profile of the C ion species has a peak atomic density "A" at the depth of about 12 Å to 18 Å from the exposed top surface of the substrate 101; the distribution profile of the Ge ion species has a peak atomic density "B" at the depth of about 20 Å to 23 Å from the exposed top surface of the substrate 101; and the distribution profile of the O ion species has a peak atomic density "D" at the depth of about 35 Å to 45 Å from the exposed top surface of the substrate 101.

After the ion implantation process 139, an annealing process may be performed to re-crystallize and/or repair lattice damage in the implanted regions 142. The annealing process may be controlled to have minimum impact on the implanted regions which are in an amorphous state. In some embodiments, the anneal process is a rapid thermal annealing (RTA) which heats the semiconductor device structure 100 to a target temperature range of about 550 degrees Celsius to about 1000 degrees Celsius in a short time period, for example about 40 seconds to about 2 minutes.

Next, the semiconductor device structure 100 is subjected to an oxidation process to oxidize and transform the implanted region 142 into dielectric regions 145, as shown in FIG. 12-1c. After the oxidation process, the implanted region 142 is at least partially converted to an oxide layer (e.g., silicon oxynitride). In some embodiments, the implanted region 142 is fully oxidized and converted to an oxide layer (e.g., silicon oxide). In either case, the exposed sidewall surfaces of the stack of the semiconductor layer 104 (e.g., first semiconductor layers 106 and dielectric spacers 144) and the sacrificial gate structures 130 may be non-oxidized or slightly oxidized. During the oxidation process, the implanted regions 142 are oxidized at a faster rate than the exposed sidewall surfaces of the first semiconductor layers 106, dielectric spacers 144, and the gate spacers 138 due to the chemical/physical effects provided by the ion species. The oxidation process may be the same oxidation process discussed above with respect to FIG. 11A-1. In some embodiments, the semiconductor device structure 100 is exposed to a wet oxidation process using water vapor or steam as the oxidant, at a pressure of about 1 Torr to about 40 ATM, within a temperature range of about 300 degrees Celsius to about 1200 degrees Celsius, such as about 400 degrees Celsius to about 800 degrees Celsius, and for a time from about 20 minutes to about 2 hours. The oxidation process may cause the implanted ion species to diffuse into the substrate 101 and in some cases, form an oxide layer (e.g., silicon oxynitride) on the surface of the implanted region 142, resulting in dielectric regions 145 with a depth D3 greater than the thickness T1 of the nitrogen-containing layer 140. The thickness T2 is measured from the top of the oxide layer to the bottom of the dielectric region 145. The oxide layer may include dopants (e.g., carbon) from the dielectric regions 145. In some embodiments, the top of the dielectric regions 145 is in contact with the dielectric spacers 144.

In some embodiments, a thin oxide layer may be formed on the first semiconductor layers 106 as a result of the oxidation process. A clean process (e.g., dry etch, wet etch, or a combination thereof) may be performed subsequently to remove the thin oxide layer formed on the first semiconductor layers 106, while the dielectric regions 145 are not substantially affected by the clean process. Additionally or alternatively, any oxide layer formed on the first semiconductor layers 106 can be removed during the subsequent S/D pre-clean process, as will be discussed below.

After the oxidation process, the semiconductor device structure 100 is subjected to an etch process to remove the nitrogen-containing layer 140 from the exposed sidewall surfaces of the first semiconductor layers 106, dielectric spacers 144, and the gate spacers 138, as shown in FIG. 12-1c. The etch process may be an isotropic or anisotropic etch process. In one exemplary embodiment, the etch process is an isotropic etch process using a solution of phosphoric acid ($H_3PO_4$) or $H_3PO_4$ and diluted hydrofluoric acid (DHF) (having a ratio of water to HF in a range from about 50:1 to about 500:1). The etch process may be performed for about 25 seconds to about 50 seconds, for example about 35 seconds and can be repetitive if needed. DHF, if used, may be performed for about 10 seconds to about 25 seconds, for example about 15 seconds. The oxide layer on the dielectric regions 145 may serve as an etch barrier. Since the nitrogen-containing layer 140 remaining on the exposed sidewall surfaces of the first semiconductor layers 106, dielectric spacers 144, and the gate spacers 138 are non-oxidized or slightly oxidized (if no clean process was performed), an etch selectivity between the nitrogen-containing layer 140 and the dielectric regions 145 will allow the etch process to remove the nitrogen-containing layer 140 at a faster rate than the dielectric regions 145. Therefore, the nitrogen-containing layer 140 on the exposed sidewall surfaces of the first semiconductor layers 106, dielectric spacers 144, and the gate spacers 138 are removed while the dielectric regions 145 remain substantially intact.

In some embodiments, which can be combined with any other embodiments of the present disclosure, the ion implantation process 139 is a high-temperature implantation process performed at a temperature greater than about 250 degrees Celsius, such as about 350 degrees Celsius to about 550 degrees Celsius. In cases where high-temperature implantation process is adapted, the annealing process may be skipped.

Figures 2A, 12:
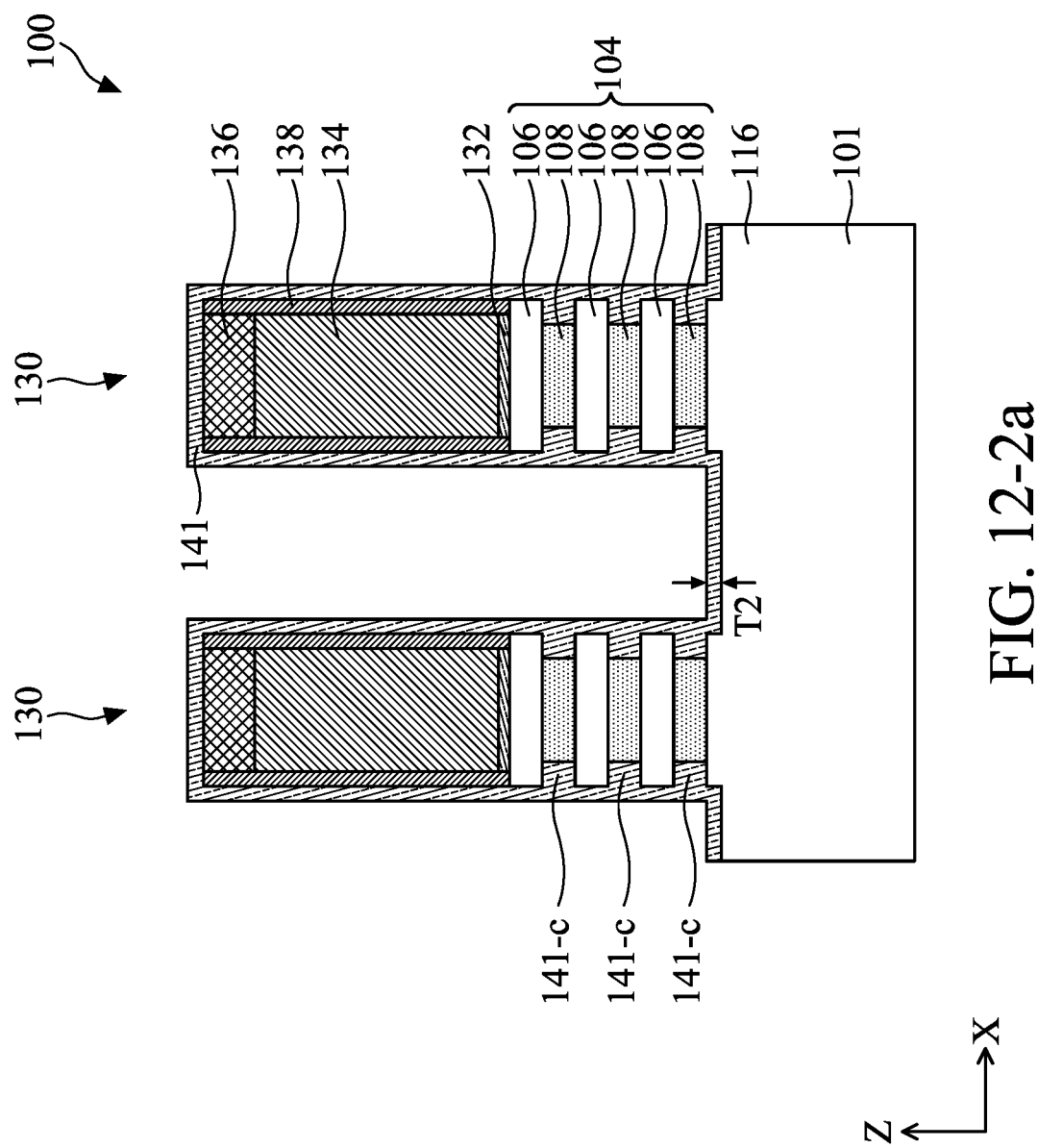
Figures 2B, 12:
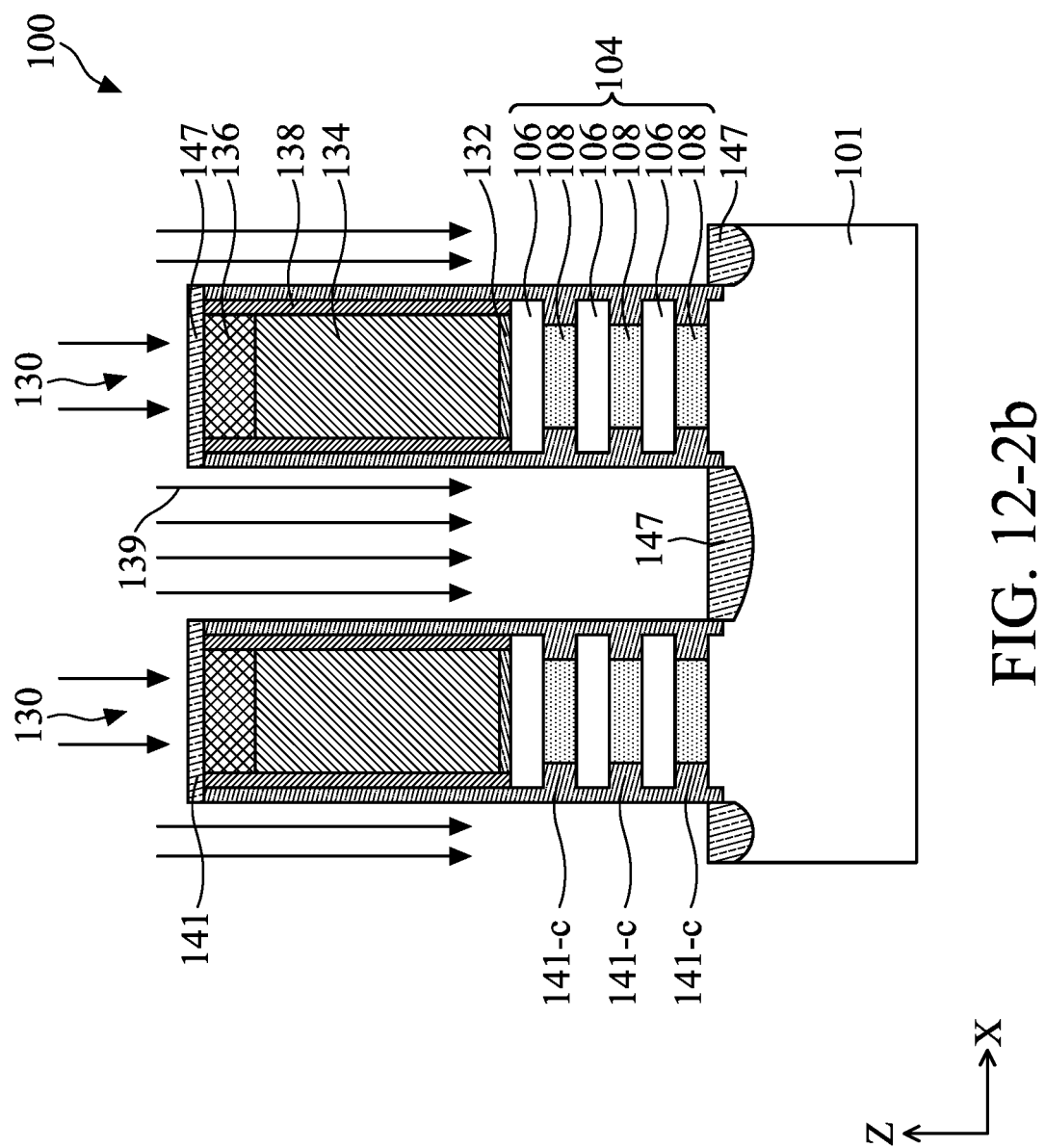
Figures 2C, 12:
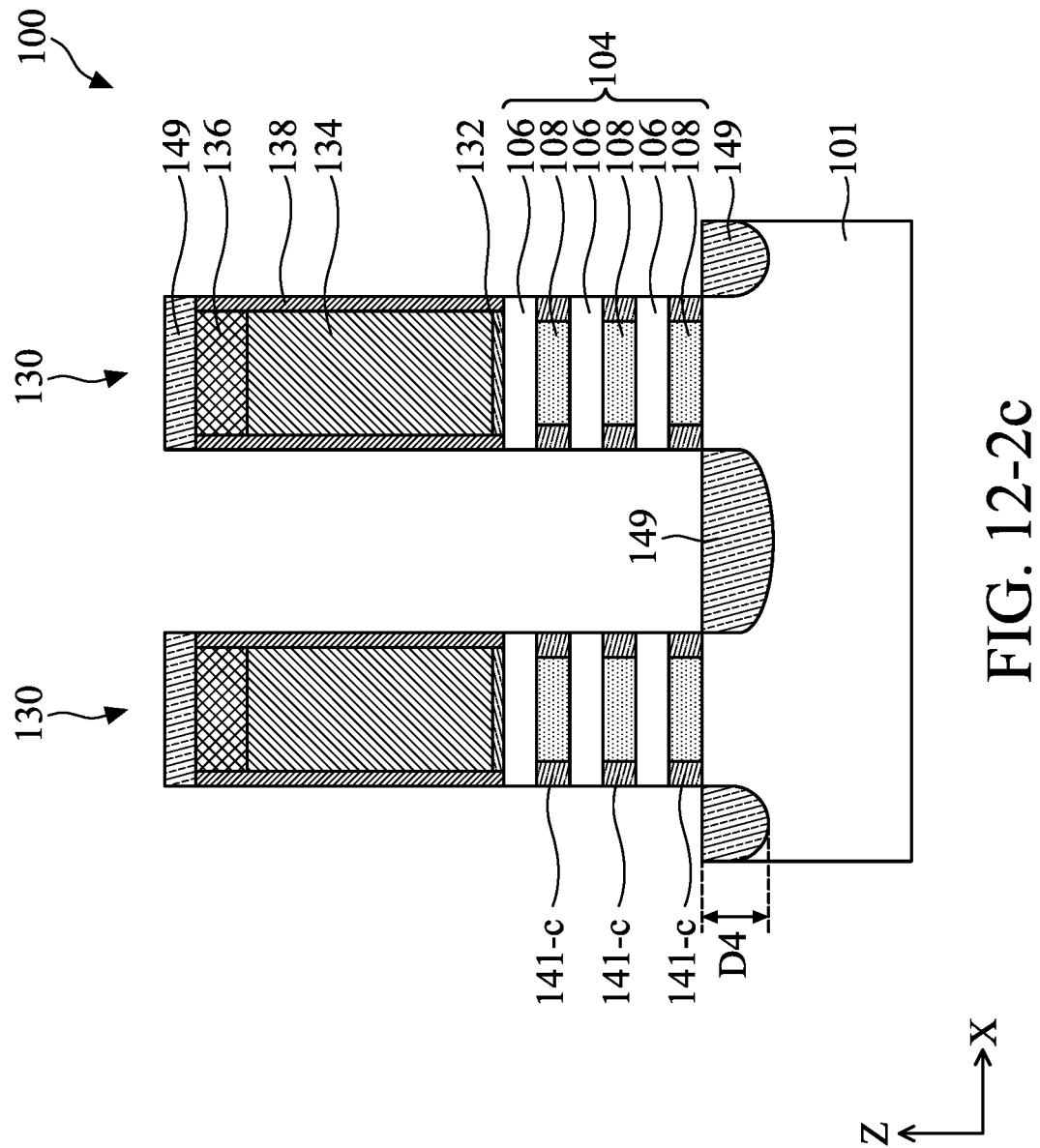
Figures 4, 12:
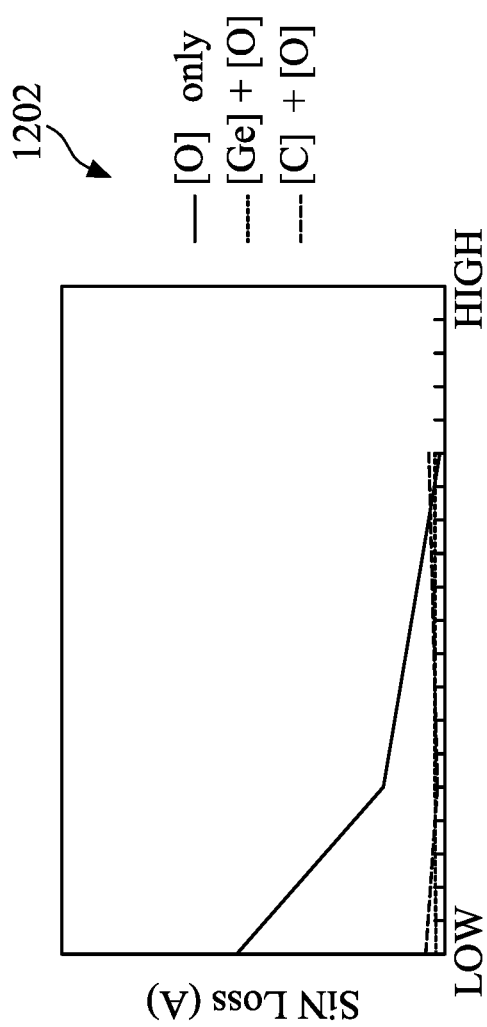
Figures 5, 12:
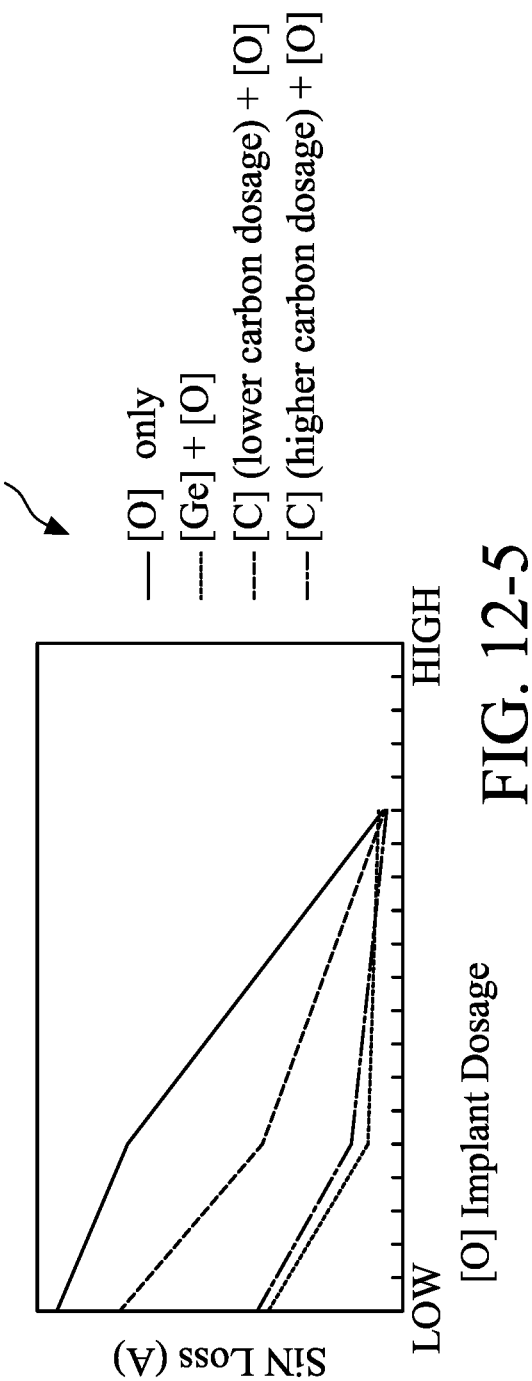

FIGS. 12-2a to 12-2c are cross-sectional side views of various stages of the semiconductor device structure 100 taken along cross-section A-A of FIG. 8, in accordance with some alternative embodiments. The embodiment of FIGS. 12-2a to 12-2c is similar to the embodiment of FIGS. 12-1a to 12-1c except that a nitride layer is formed at and/or near the exposed surface of the substrate 101 in the S/D regions while forming the dielectric spacers 144. In FIG. 12-2a, after removing edge portions of each second semiconductor layers 108, a nitrogen-containing layer 141, such as the nitrogen-containing layer 140 (FIG. 12-1a), is deposited on the exposed surfaces of the semiconductor device structure 100 by a conformal deposition process, such as ALD. The nitrogen-containing layer 141 is deposited in the cavities to form dielectric spacers 141-c. Therefore, the second semiconductor layers 108 are capped between and in contact with the nitrogen-containing layer 141 along the X direction. The nitrogen-containing layer 141 also covers the exposed top surface of the substrate 101, the first semiconductor layers 106, the gate spacers 138, and the mask layer 136. The nitrogen-containing layer 141 may have a thickness T2 corresponding to the thickness T1 of the nitrogen-containing layer 140.

In FIG. 12-2b, an ion implantation process, such as the ion implantation process 139, is performed to implant various ion species into the nitrogen-containing layer 141 on the horizontal surfaces of the semiconductor device structure 100, such as top surfaces of the gate spacers 138, the mask layer 136, and the top surface of the substrate 101 not covered by the sacrificial gate structures 130. The implanted nitrogen-containing layer 147 is then oxidized to form dielectric regions 149 at and/or near the surface of the substrate 101 in the S/D regions. In some embodiments, the implanted nitrogen-containing layer 147 is at least partially converted to an oxide layer (e.g., silicon oxynitride). In some embodiments, the implanted nitrogen-containing layer 147 is fully converted to an oxide layer (e.g., silicon oxide). The oxidation process may be the same oxidation process discussed above with respect to FIG. 11A-1 or FIG. 12-1c. Likewise, the oxidation process may cause the implanted ion species to diffuse (and even into the underlying substrate 101 in some embodiments) and form an oxide layer on the implanted nitrogen-containing layer 147, resulting in dielectric regions 149 with a depth D4 greater than the thickness T2 of the nitrogen-containing layer 141, as shown in FIG. 12-2c. In some embodiments, the top of the nitrogen-containing layer 141 is in contact with the dielectric spacers 141-c. Thereafter, the nitrogen-containing layer 141 on the vertical surfaces of the semiconductor device structure 100, such as exposed sidewall surfaces of the first semiconductor layers 106, dielectric spacers 144, and the gate spacers 138, are removed using the etch process as discussed above, while the dielectric regions 149 remain substantially intact, as shown in FIG. 12-2c.

For various embodiments of FIGS. 12-1a to 12-1c and 12-2a to 12-2c, it has been observed that higher dopant concentration of oxygen in the implanted regions, for example, about 40 atomic percentage or greater, such as about 42 atomic percentage to about 57 atomic percentage, can reduce nitride loss of the implanted regions during the subsequent etch process for removal of the nitride layer from vertical surfaces of the semiconductor device structure 100. Other dopants in the implanted regions can further help nitride loss. For example, FIGS. 12-4 and 12-5 are graphs showing nitride loss as a function of different oxygen implant dosages and comparisons between different combinations of dopants during removal of the nitride layer (e.g., SiN) from vertical surfaces of the semiconductor device structure 100. FIG. 12-4 shows the SiN loss after exposing to $H_3PO_4$ and DHF. FIG. 12-5 shows the SiN loss after two treatments of $H_3PO_4$ and DHF, and ion species of C are implanted separately, one with an implant dosage of about $2E10^{15}$ atoms/cm$^2$ to about $2.5E10^{15}$ atoms/cm$^2$ (lower carbon dosage) and one with an implant dosage of about $4E10^{15}$ atoms/cm$^2$ to about $4.5E10^{15}$ atoms/cm$^2$ (higher carbon dosage). As can be seen in FIG. 12-4, ion implantation of dopants Ge and O or dopants C and O shows significantly lower nitride loss as compared to implanting O dopants alone. In FIG. 12-5, while exposing the nitride layer to etchants twice increases the amount of nitride loss, the addition of the G or C dopants can significantly reduce the nitride loss of the implanted regions.

Figures 1A, 13:
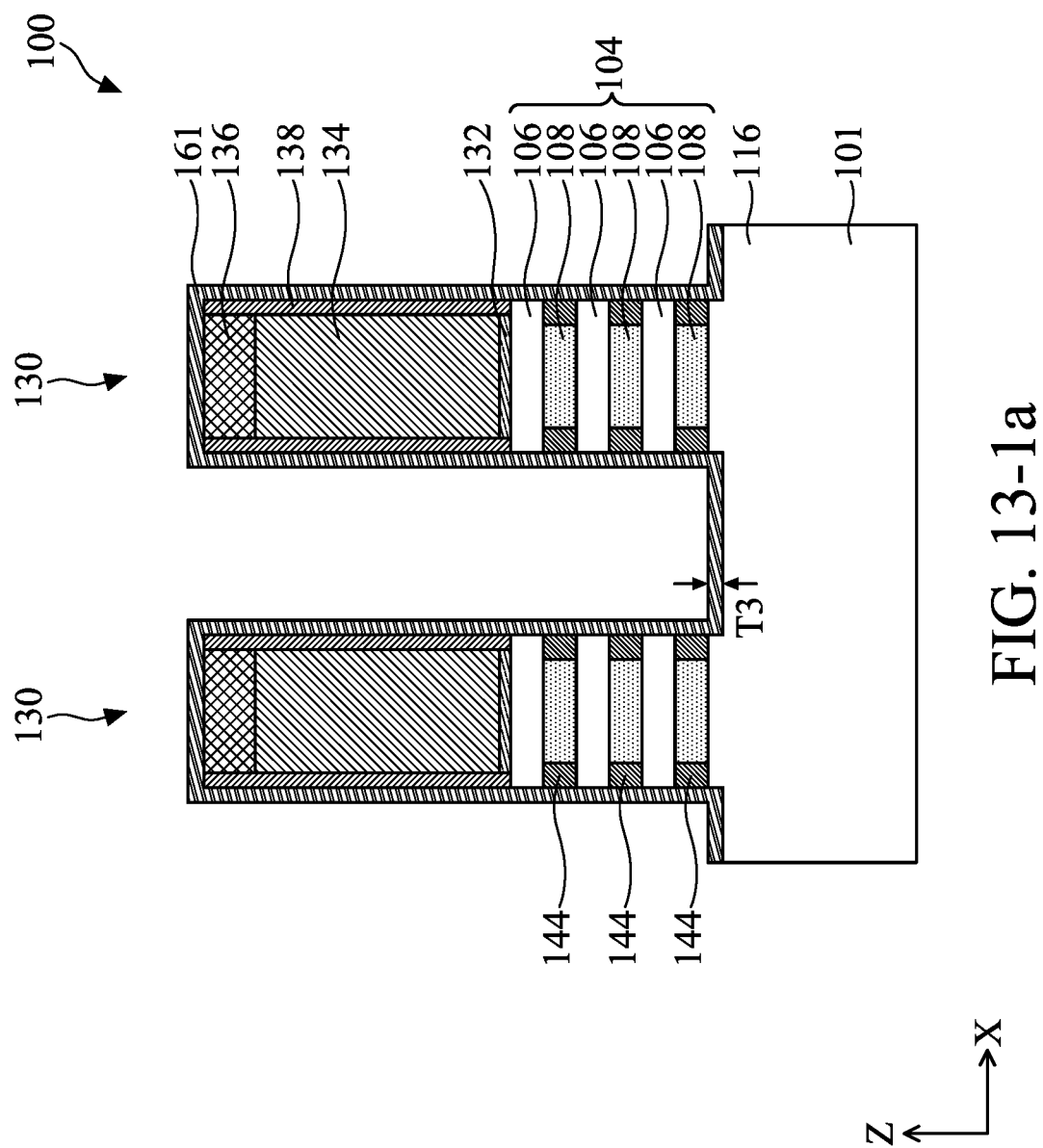
Figures 1B, 13:
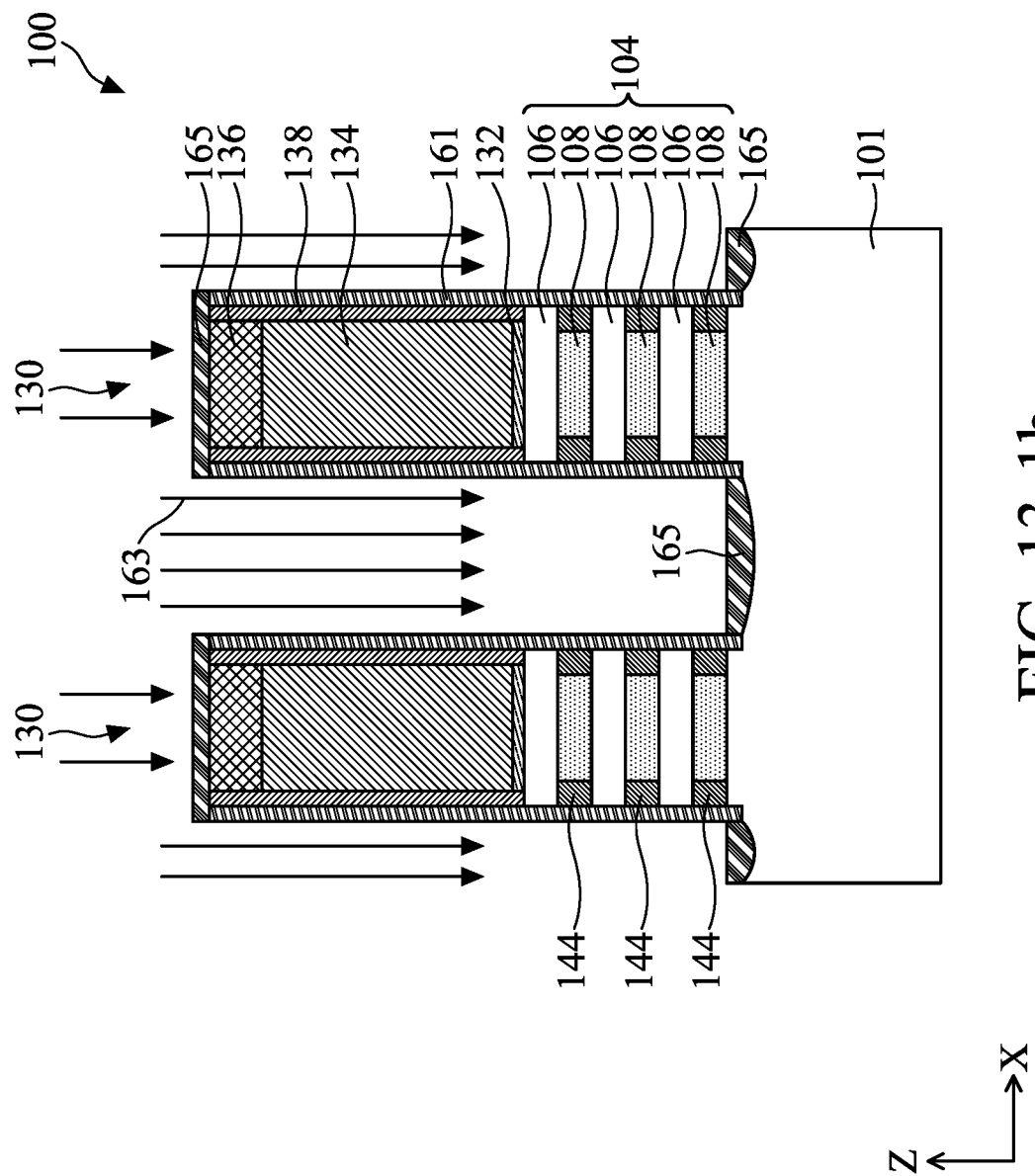
Figures 1C, 13:
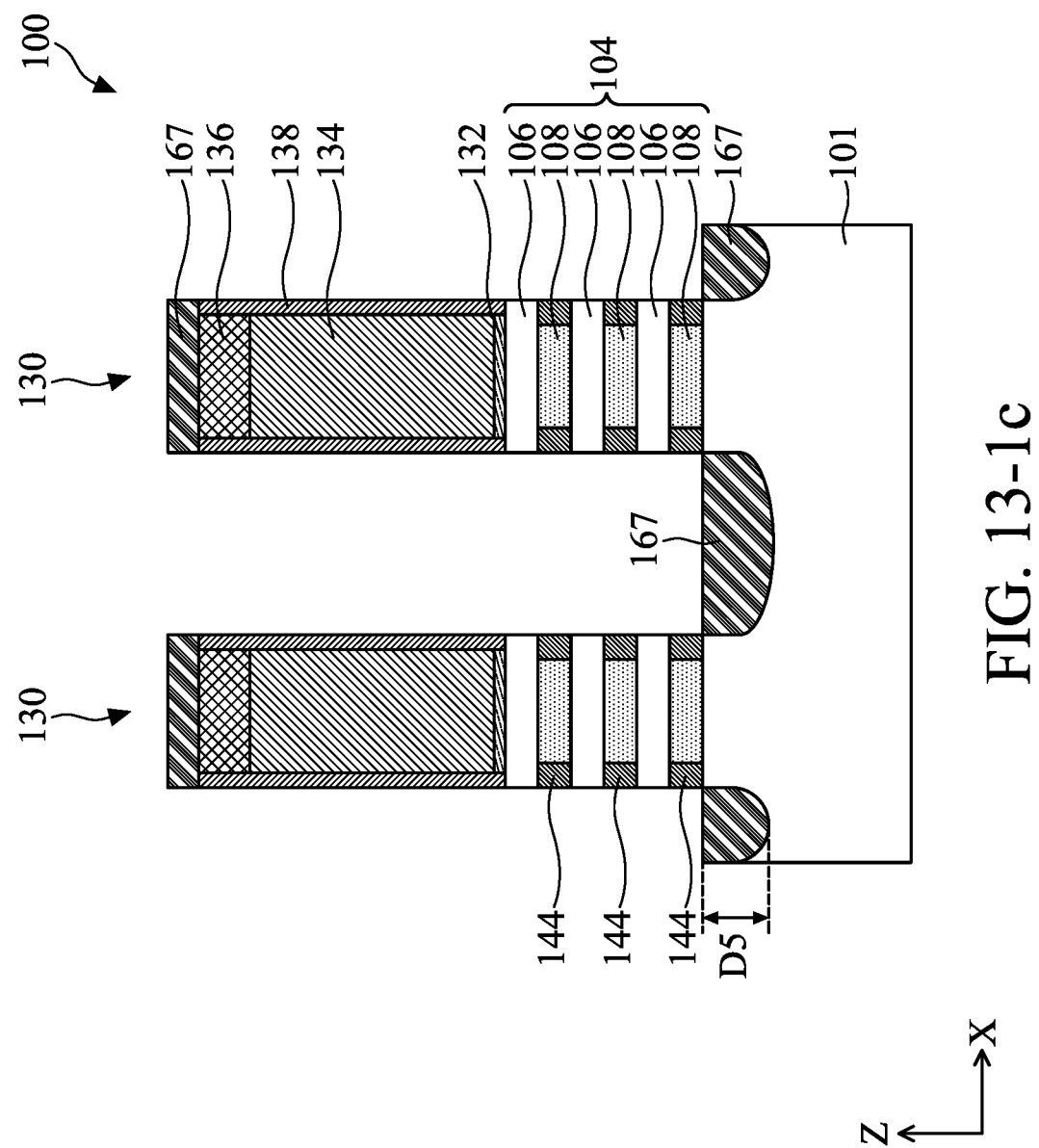
Figures 2, 13:
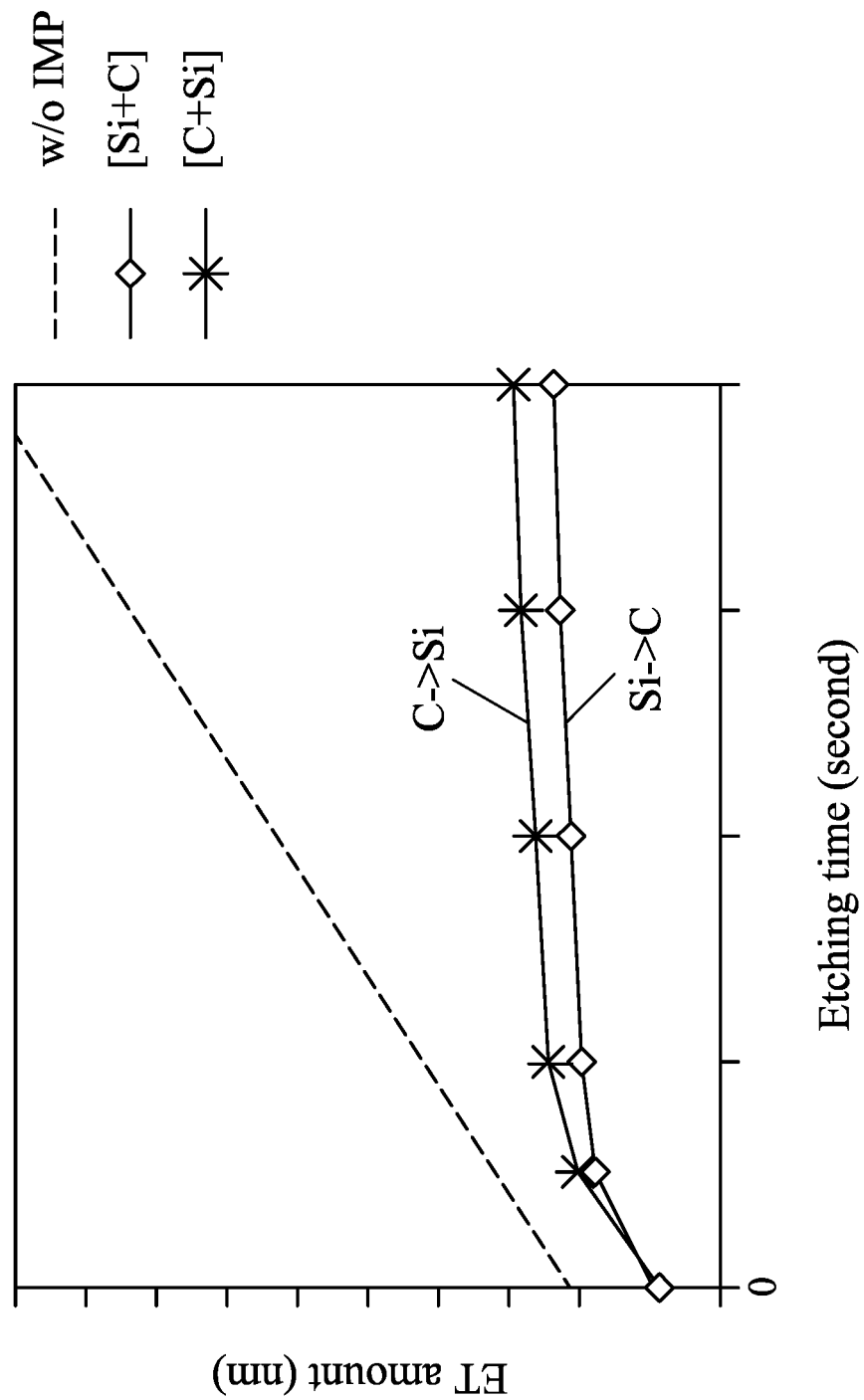

FIGS. 13-1a to 13-1c are cross-sectional side views of various stages of the semiconductor device structure 100 taken along cross-section A-A of FIG. 8, in accordance with some alternative embodiments. In the embodiment of FIGS. 13-1a to 13-1c, instead of forming a nitride layer and then performing an oxidation process, an oxide layer is formed at and/or near the exposed surface of the substrate 101 in the S/D regions. The oxide layer is then implanted and annealed to form dielectric regions. In FIGS. 13-1a, after formation of the dielectric spacers 144 (FIG. 10A), an oxygen-containing layer 161, such as silicon oxide or silicon oxycarbide (SiOC), is conformally formed on the exposed surfaces of the semiconductor device structure 100. The oxygen-containing layer 161 covers the exposed top surface of the substrate 101, the dielectric spacers 144, the first semiconductor layers 106, the gate spacers 138, and the mask layer 136. The oxygen-containing layer 161 may be formed by an ALD or PEALD process or any suitable conformal deposition technique. In some embodiments, the oxygen-containing layer 161 may have a thickness T3 in a range of about 10 nm to about 80 nm, for example about 20 nm to about 60 nm.

In FIG. 13-1b, after formation of the oxygen-containing layer 161, the semiconductor device structure 100 is subjected to an ion implantation process 163. Particularly, the ion implantation process 163 is performed so that majority of the ion species (dopants) are implanted into the oxygen-containing layer 161 disposed on the horizontal surfaces of the semiconductor device structure 100, such as top surfaces of the gate spacers 138, the mask layer 136, and the top surface of the substrate 101 not covered by the sacrificial gate structures 130, as shown in FIG. 13-1b. The implanted regions 165 (i.e., implanted oxygen-containing layer 161) are formed after the ion implantation process. The ion implantation process 163 may employ one or more ion species. In some embodiments, the ion implantation process 163 employs a first group of ion species ("Group 1") comprising Si; a second group of ion species ("Group 2") comprising C. The first group of ion species may be employed to promote bonding between Si and O (from subsequent oxidation process) and prevent oxide removal during the subsequent etch process. The second group of ion species may be employed to increase oxidation rate of the implanted regions by transforming the implanted region into an amorphous state. The second group of ion species also protects the dielectric regions from the subsequent S/D pre-clean process.

In some embodiments, the ion implantation process 163 employs the first and second groups of ion species, and the first and second groups of ion species are implanted in the following order: Group 1-Group 2, or Group 2-Group 1. In some embodiments, the ion implantation process 163 is performed in the following order: Group 1-Group 1, or Group 2-Group 2. The ion species of Si may be implanted with high dosage at a depth about 1.5 nm to about 5 nm below the surface of the implanted regions 165 (shallow implantation) to help minimize etching amount of the oxides at the dielectric regions 167 during the subsequent oxide removal process. In some embodiments, the ion species of Si may be implanted at a kinetic energy of about 0.5 KeV to about 2 KeV, and an implant dosage of about $3E10^{15}$ atoms/cm$^2$ to about $5E10^{15}$ atoms/cm$^2$. Likewise, the ion species of C may be shallowly implanted with high dosage to help protect the dielectric regions 167 during the subsequent S/D pre-clean process. In some embodiments, the ion species of C may be implanted at a kinetic energy of about 0.5 KeV to about 1 KeV, and an implant dosage of about $5E10^{15}$ atoms/cm$^2$ to about $6E10^{15}$ atoms/cm$^2$.

The ion implantation process 163 may be a zero-degree tilt implantation process. In some embodiments, the ion implantation process 163 is performed at a low-temperature range (e.g., 25 degrees Celsius to about 200 degrees Celsius). In some embodiments, the ion implantation process 163 is a high-temperature implantation process performed at a temperature greater than about 250 degrees Celsius, such as about 350 degrees Celsius to about 550 degrees Celsius. In cases where high-temperature implantation process is adapted, a subsequent annealing process may be skipped.

After the ion implantation process 163, an annealing process may be performed to oxidize the implanted regions 165, thereby forming dielectric regions 167 at and/or near the surface of the substrate 101 in the S/D regions, as shown in FIG. 13-1c. The annealing process may be controlled to have minimum impacts on the implanted regions which are in an amorphous state. In some embodiments, the anneal process is RTA which heats the semiconductor device structure 100 to a target temperature range of about 600 degrees Celsius to about 1200 degrees Celsius. The annealing process may be performed in an ambient comprising $O_2$, $H_2O$, NO, $H_2$, $N_2$, $NH_3$, Ar, He, or the like, or any combination thereof, and at a pressure of about 1 Torr to about 40 ATM.

The annealing process may cause the implanted ion species to diffuse (and into the underlying substrate 101 in some embodiments) and form an oxide layer (e.g., silicon oxide) on the surface of the implanted region 165, resulting in dielectric regions 167 with a depth D5 greater than the thickness T3 of the oxide-containing layer 161. The thickness T6 is measured from the top of the oxide layer to the bottom of the dielectric region 167. The oxide layer may include dopants (e.g., carbon) from the dielectric regions 167. In such cases, the oxide layer may be silicon oxide doped with carbon or silicon oxycarbide (SiOC). In some embodiments, the top of the dielectric regions 167 may be in contact with the dielectric spacers 144.

After the annealing process, the semiconductor device structure 100 is subjected to an oxide removal process to remove the oxide-containing layer 161 from the exposed sidewall surfaces of the first semiconductor layers 106, dielectric spacers 144, and the gate spacers 138, as shown in FIG. 13-1c. The oxide removal process may be an isotropic or anisotropic etch process. In one exemplary embodiment, the oxide removal process is an isotropic etch process using a solution of phosphoric acid ($H_3PO_4$) or $H_3PO_4$ and DHF (having a ratio of water to HF in a range from about 50:1 to about 500:1). The oxide removal process may be performed for about 25 seconds to about 50 seconds, for example about 35 seconds and can be repetitive if needed. DHF, if used, may be performed for about 10 seconds to about 25 seconds, for example about 15 seconds. Since the oxide-containing layer 161 on the exposed sidewall surfaces of the first semiconductor layers 106, dielectric spacers 144, and the gate spacers 138 are non-implanted, an etch selectivity between the oxide-containing layer 161 and the dielectric regions 167 will allow the oxide removal process to remove the oxide-containing layer 161 at a faster rate than the dielectric regions 167. Therefore, the oxide-containing layer 161 on the exposed sidewall surfaces of the first semiconductor layers 106, dielectric spacers 144, and the gate spacers 138 are removed while the dielectric regions 167 remain substantially intact.

FIG. 13-2 is a graph showing etch amount as a function of etching times, in accordance with some embodiments. As can be seen, the ion implantation of Si and C in an order of Group 1-Group 2 or Group 2-Group 1 etches less amount of oxides (e.g., oxygen-containing layer 161) than that of Si and C implanted in an order of Group 1-Group 1 or Group 2-Group 2 when exposed to an etchant (e.g., diluted HF having a ratio of water to HF of about 100:1). The ion implantation of Si and C are implanted according to the exemplary embodiments discussed above. However, oxides implanted with Si and C in either order or combination show less amount of removal when compared to the non-implanted oxides, and this phenomenon holds true regardless of duration of the etching time.

Figure 14A:
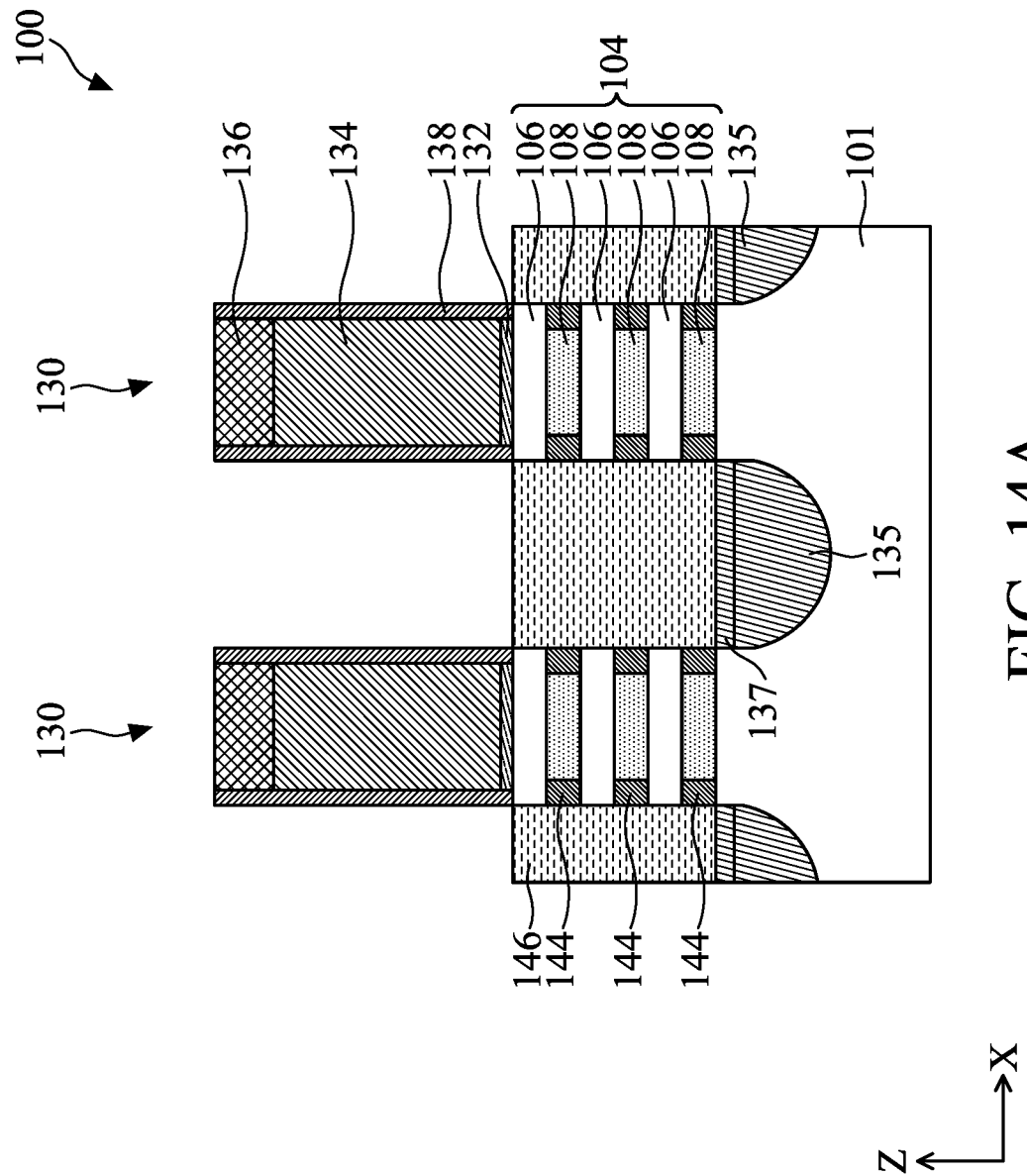
Figure 14B:
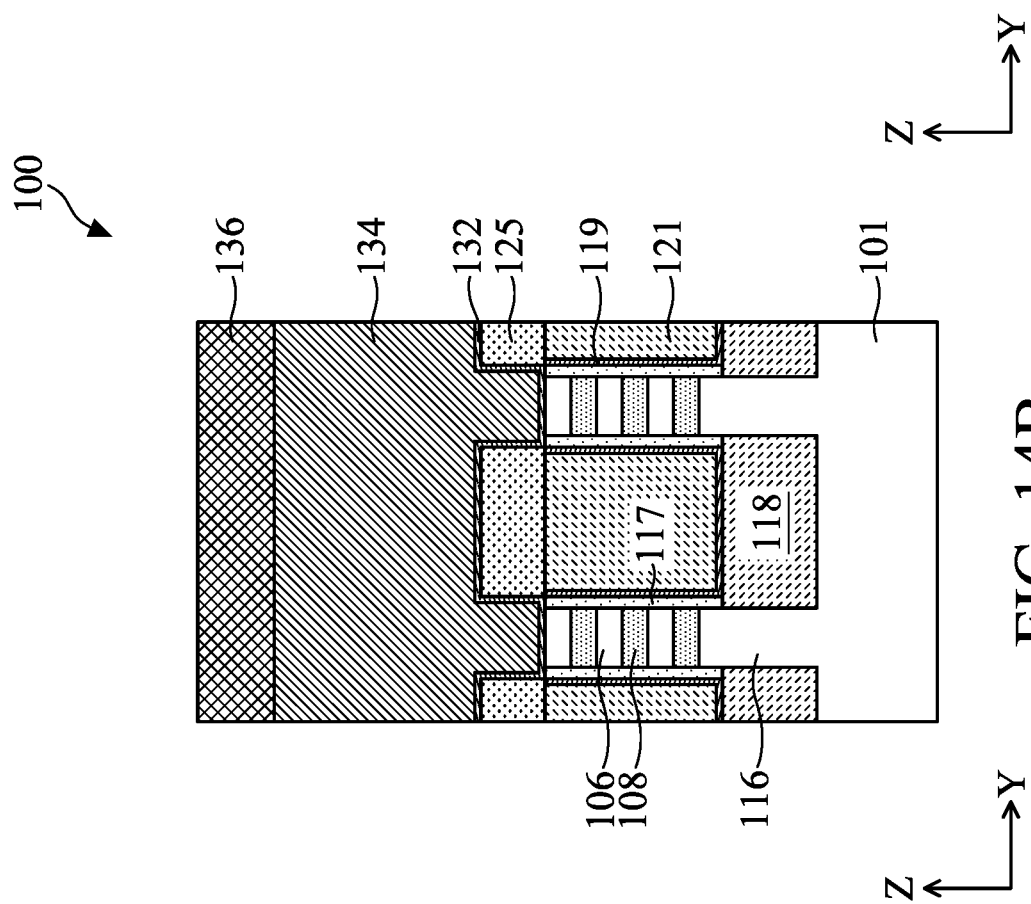
Figure 14C:
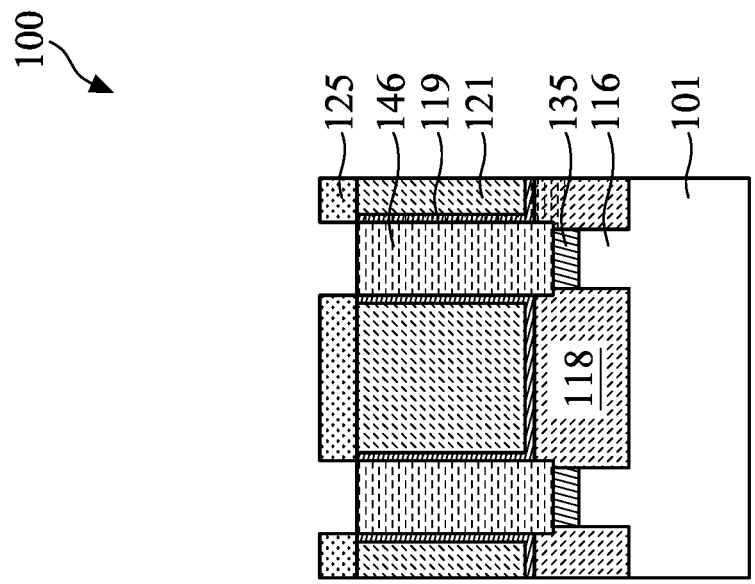

In FIGS. 14A-14C, S/D epitaxial features 146 are formed in the S/D regions between the neighboring sacrificial gate structures 130. The S/D epitaxial features 146 may grow laterally from the first semiconductor layers 106. The shape of the S/D epitaxial features 146 is confined by the dielectric feature 127. The S/D epitaxial feature 146 may include one or more layers of Si, SiP, SiC and SiCP for an n-type FET or Si, SiGe, Ge for a p-type FET. The S/D epitaxial features 146 may be formed by an epitaxial growth method using selective epitaxial growth (SEG), CVD, ALD or MBE. In cases where embodiments of FIGS. 11A and 11A-1 are adapted, the S/D epitaxial features 146 are in contact with the dielectric regions 135, the first semiconductor layers 106, and dielectric spacers 144. The S/D epitaxial features 146 may be the S/D regions. For example, one of a pair of S/D epitaxial features 146 located on one side of the sacrificial gate structures 130 may be a source region, and the other of the pair of S/D epitaxial features 146 located on the other side of the sacrificial gate structures 130 may be a drain region. A pair of S/D epitaxial features 146 includes a source epitaxial feature 146 and a drain epitaxial feature 146 connected by the channels (i.e., the first semiconductor layers 106). In this disclosure, a source and a drain are interchangeably used, and the structures thereof are substantially the same.

Prior to formation of the S/D epitaxial features 146, a S/D pre-clean process may be performed to remove a native oxide layer that is formed on the first semiconductor layers 106 and the dielectric regions 135 (or on the oxide layer if presented) as a result of the nature oxidation or prior oxidation process. The S/D pre-clean process may be an inert gas sputtering process (e.g., argon sputter) or a plasma-based cleaning process. In one embodiment, the S/D pre-clean process is a SiCoNi process which uses a remote plasma source to generate ammonium fluoride ($NH_4F$) etchant species from nitrogen trifluoride ($NF_3$) and ammonia ($NH_3$) to minimize the damage to the semiconductor device structure 100.

Figure 15A:
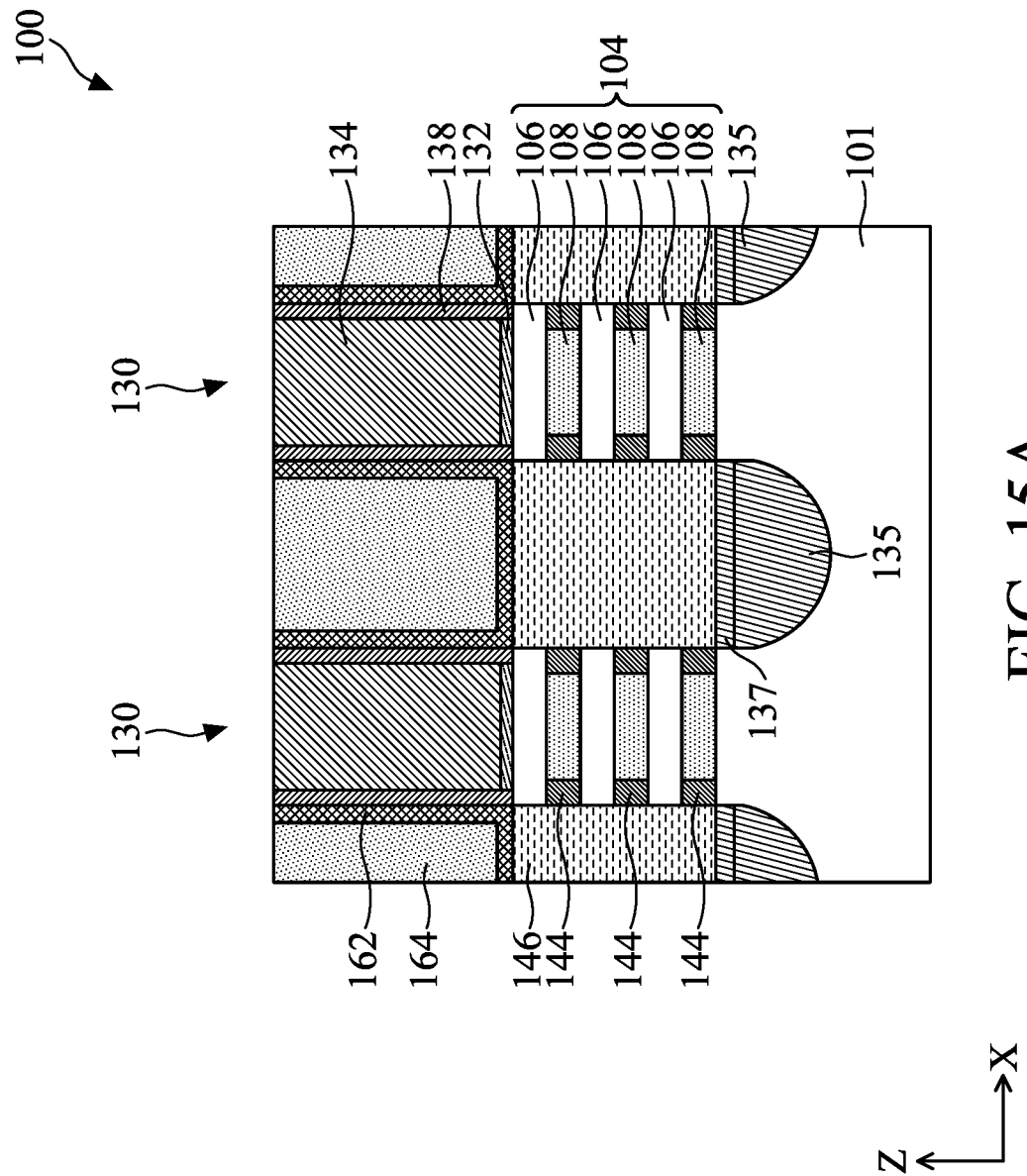

In FIGS. 15A-15C, after formation of the S/D epitaxial features 146, a contact etch stop layer (CESL) 162 is conformally formed on the exposed surfaces of the semiconductor device structure 100. The CESL 162 covers the S/D epitaxial features 146, the gate spacers 138, and the dielectric material 125. The CESL 162 may include an oxygen-containing material or a nitrogen-containing material, such as silicon nitride, silicon carbon nitride, silicon oxynitride, carbon nitride, silicon oxide, silicon carbon oxide, or the like, or a combination thereof, and may be formed by CVD, PECVD, ALD, or any suitable deposition technique. Next, an interlayer dielectric (ILD) layer 164 is formed on the CESL 162 over the semiconductor device structure 100. The materials for the ILD layer 164 may include oxide formed with tetraethylorthosilicate (TEOS), un-doped silicate glass, or doped silicon oxide such as borophosphosilicate glass (BPSG), fused silica glass (FSG), phosphosilicate glass (PSG), boron doped silicon glass (BSG), and/or other suitable dielectric materials comprising Si, O, C, and/or H. The ILD layer 164 may be deposited by a PECVD process or other suitable deposition technique. In some embodiments, after formation of the ILD layer 164, the semiconductor device structure 100 may be subject to a thermal process to anneal the ILD layer 164.

Next, a planarization operation, such as CMP, is performed on the semiconductor device structure 100 to remove portions of the ILD layer 164, the CESL 162, and the mask layer 136 until the sacrificial gate electrode layer 134 is exposed, as shown in FIGS. 15A-15C. The planarization operation also removes dielectric regions 145, 149, 167, when presented on the sacrificial gate structures 130, as those shown in alternative embodiments of FIGS. 12-1a to 12-1c, 12-2a to 12-2c, and 13-1a to 13-1c.

Figure 16A:
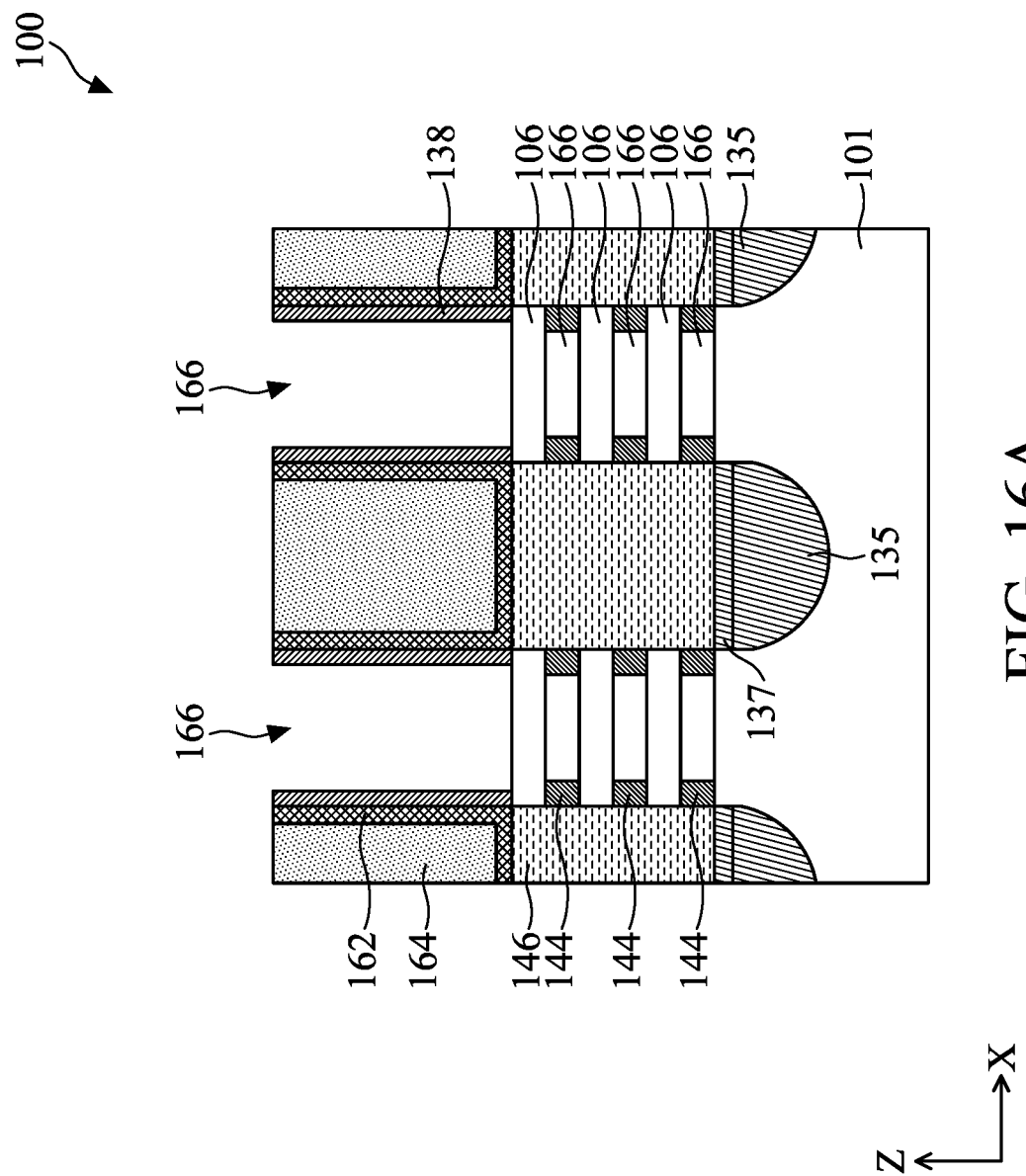
Figure 16C:
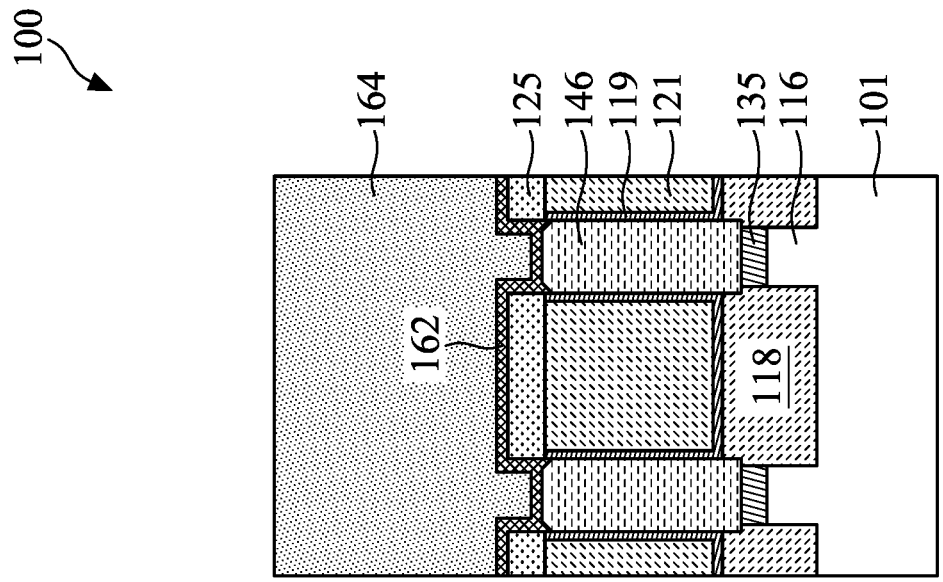
Figure 16B:
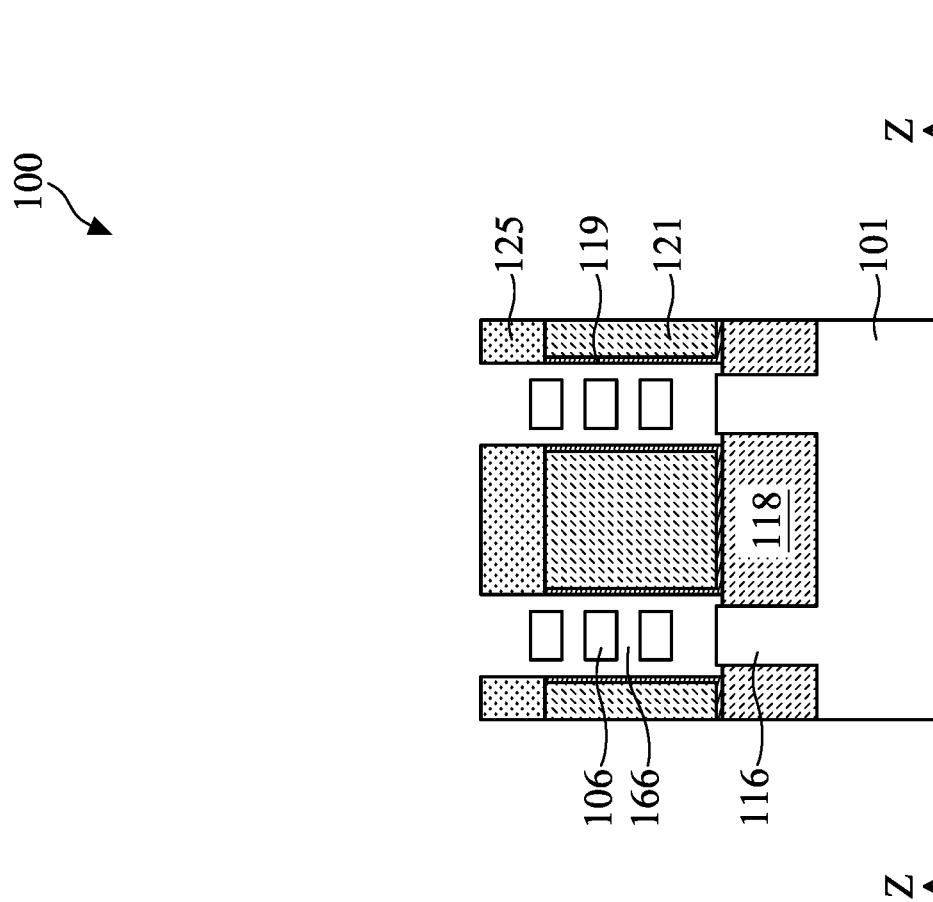

In FIGS. 16A-16C, the sacrificial gate structure 130, the cladding layer 117, and the second semiconductor layers 108 are removed. The removal of the sacrificial gate structure 130 and the semiconductor layers 108 forms an opening 166 between gate spacers 138 and between first semiconductor layers 106. The ILD layer 164 protects the S/D epitaxial features 146 during the removal processes. The sacrificial gate structure 130 can be removed using plasma dry etching and/or wet etching. The sacrificial gate electrode layer 134 may be first removed by any suitable process, such as dry etch, wet etch, or a combination thereof, followed by the removal of the sacrificial gate dielectric layer 132, which may also be performed by any suitable process, such as dry etch, wet etch, or a combination thereof. In some embodiments, a wet etchant such as a tetramethylammonium hydroxide (TMAH) solution can be used to selectively remove the sacrificial gate electrode layer 134 but not the gate spacers 138, the dielectric material 125, the ILD layer 164, and the CESL 162. In some embodiments, the gate spacers 138 may be recessed by the etchant used to remove the sacrificial gate electrode layer 134 and/or the sacrificial gate dielectric layer 132.

After the removal of the sacrificial gate structure 130, the cladding layers 117 are exposed. The removal of the cladding layers 117 and the second semiconductor layers 108 exposes the dielectric spacers 144 and the first semiconductor layers 106. The removal process may be any suitable etch processes, such as dry etch, wet etch, or a combination thereof. The etch process may be a selective etch process that removes the cladding layers 117 and the second semiconductor layers 108 but not the gate spacers 138, the ILD layer 164, the CESL 162, the dielectric material 125, and the first semiconductor layers 106. As a result, a portion of the first semiconductor layers 106 not covered by the dielectric spacers 144 is exposed in the opening 166.

Figure 17A:
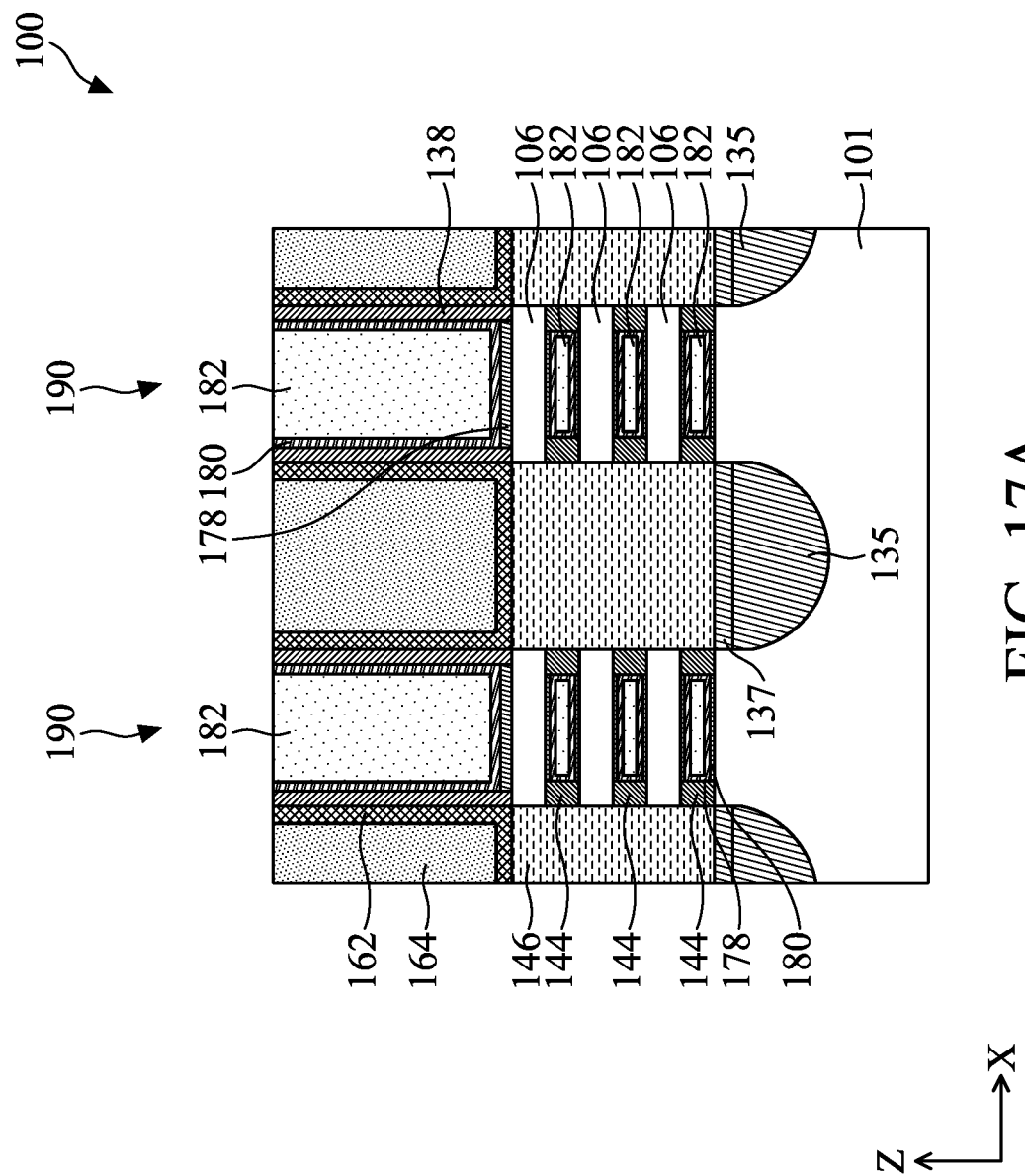
Figure 17C:
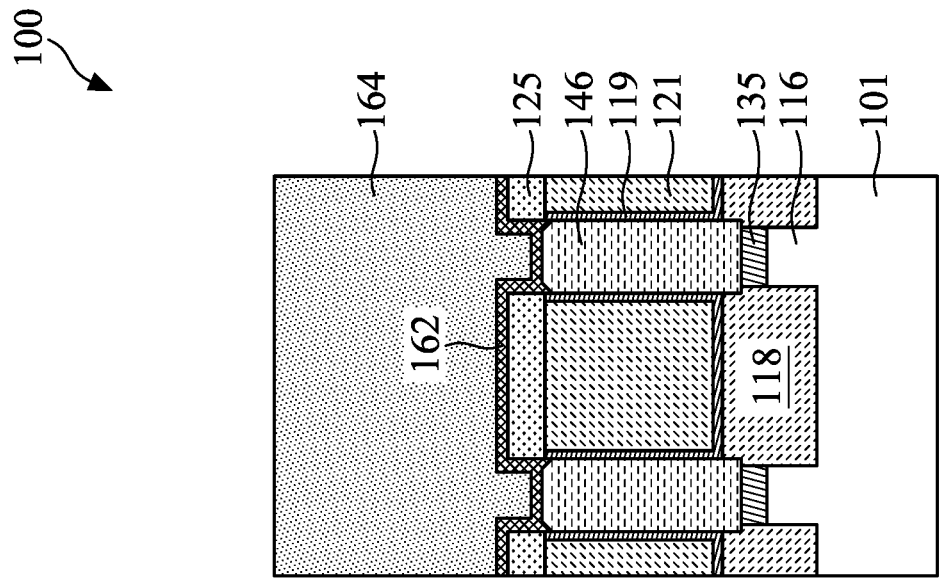
Figure 17B:
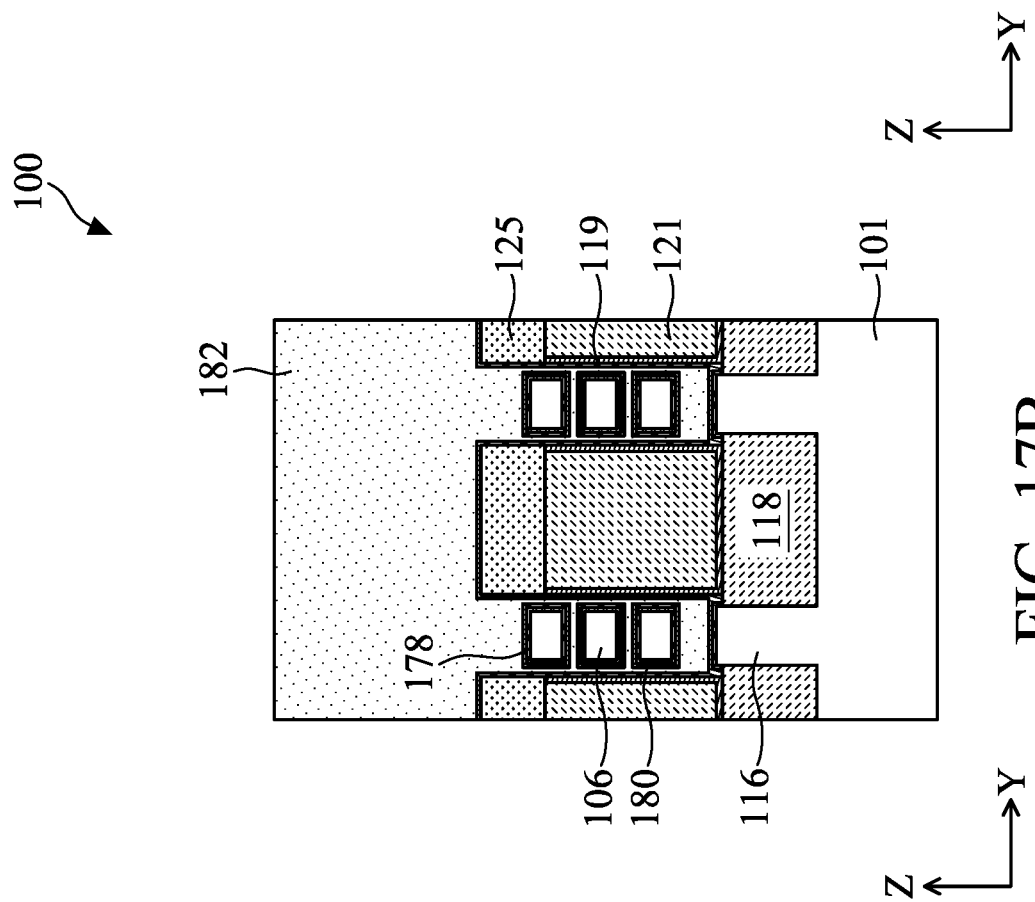

In FIGS. 17A-17C, replacement gate structures 190 are formed. The replacement gate structures 190 each includes an interfacial layer (IL) 178, a gate dielectric layer 180, and a gate electrode layer 182. The interfacial layer (IL) 178 is formed to surround exposed surfaces of the first semiconductor layers 106. In some embodiments, the IL 178 may also form on the well portion 116 of the substrate 101. The IL 178 may include or be made of an oxygen-containing material or a silicon-containing material, such as silicon oxide, silicon oxynitride, oxynitride, hafnium silicate, etc. In one embodiment, the IL 178 is silicon oxide. The IL 178 may be formed by CVD, ALD, a clean process, or any suitable process. Next, the gate dielectric layer 180 is formed on the exposed surfaces of the semiconductor device structure 100. In some embodiments, the gate dielectric layer 180 is formed to wrap around and in contact with the IL 178. The gate dielectric layer 180 also forms on and in contact with the liner 119 and the dielectric material 125. The gate dielectric layer 180 may include or made of a high-k dielectric material, such as hafnium oxide ($HfO_2$), hafnium silicate (HfSiO), hafnium silicon oxynitride (HfSiON), hafnium aluminum oxide (HfAlO), hafnium lanthanum oxide (HfLaO), hafnium zirconium oxide (HfZrO), hafnium tantalum oxide (HMO), hafnium titanium oxide (HMO), lanthanum oxide (LaO), aluminum oxide (AlO), aluminum silicon oxide (AlSiO), zirconium oxide (ZrO), titanium oxide (TiO), tantalum oxide ($Ta_2O_5$), yttrium oxide ($Y_2O_3$), silicon oxynitride (SiON), or other suitable high-k materials. The gate dielectric layer 180 may be a conformal layer formed by a conformal process, such as an ALD process or a CVD process.

After formation of the IL 178 and the gate dielectric layer 180, the gate electrode layer 182 is formed on the gate dielectric layer 180. The gate electrode layer 182 fills the openings 166 (FIGS. 16A and 16B) and surrounds a portion of each of the first semiconductor layers 106. The gate electrode layer 182 includes one or more layers of conductive material, such as polysilicon, aluminum, copper, titanium, tantalum, tungsten, cobalt, molybdenum, tantalum nitride, nickel silicide, cobalt silicide, TiN, WN, WCN, TiAl, TiTaN, TiAlN, TaN, TaCN, TaC, TaSiN, metal alloys, other suitable materials, and/or combinations thereof. The gate electrode layers 182 may be formed by PVD, CVD, ALD, electro-plating, or other suitable method.

Figure 18A:
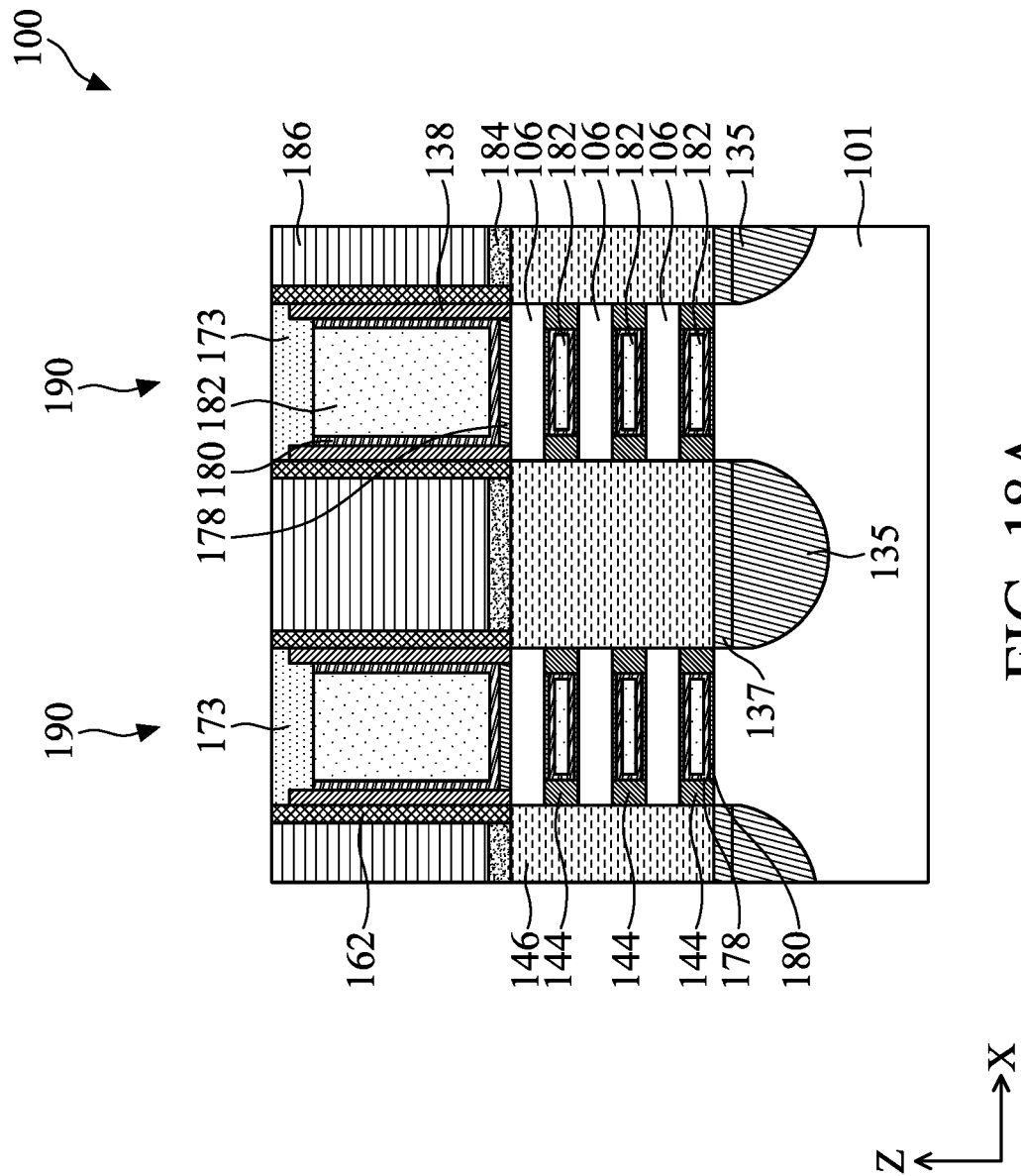
Figure 18C:
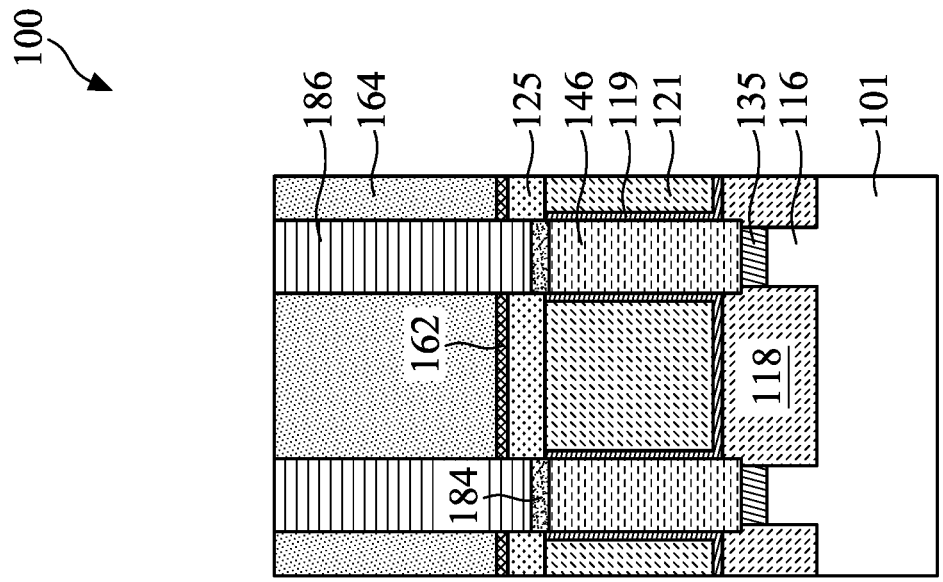
Figure 18B:
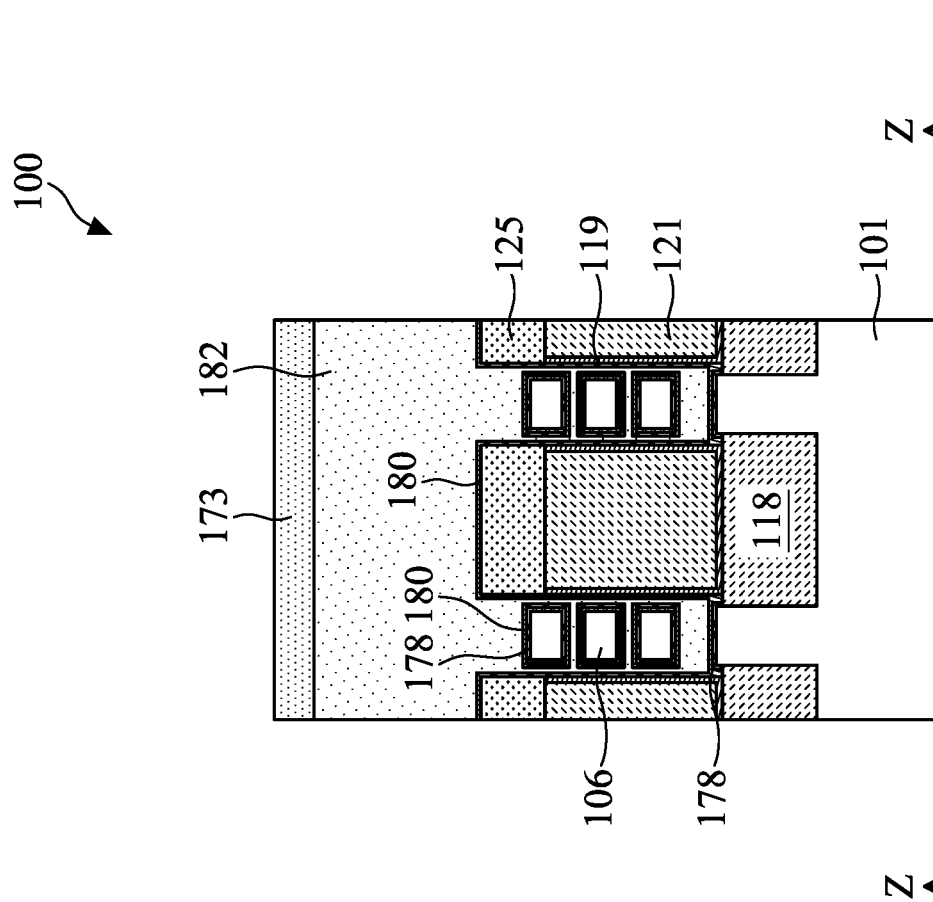

In FIGS. 18A-18C, the gate electrode layer 182 may be subject to one or more metal gate etching back (MGEB) processes. The MGEB processes are performed so that the top surfaces of the gate electrode layer 182 and the gate dielectric layer 180 are recessed to a level below the top surface of the gate spacers 138. In some embodiments, the gate spacers 138 are also recessed to a level below the top surface of the ILD layer 164, as shown in FIG. 18A. A self-aligned contact layer 173 is formed over the gate electrode layer 182 and the gate dielectric layer 180 between the gate spacers 138. The self-aligned contact layer 173 may be a dielectric material having an etch selectivity relative to the ILD layer 164. In some embodiments, the self-aligned contact layer 173 includes silicon nitride. A gate contact (not shown) may be subsequently formed in the self-aligned contact layer 173 and in contact with the gate electrode layer 182.

After formation of the self-aligned contact layer 173, contact openings are formed through the ILD layer 164 and the CESL 162 to expose the epitaxial S/D feature 146. A silicide layer 184 is then formed on the S/D epitaxial features 146, and a contact 186 is formed in the contact opening on the silicide layer 184. The contact 186 may include an electrically conductive material, such as Ru, Mo, Co, Ni. W, Ti, Ta, Cu, Al, TiN, or TaN. While not shown, a barrier layer (e.g., TiN, TaN, or the like) may be formed on sidewalls of the contact openings prior to forming the contacts 186.

It is understood that the semiconductor device structure 100 may undergo further complementary metal oxide semiconductor (CMOS) and/or back-end-of-line (BEOL) processes to form various features such as transistors, contacts/vias, interconnect metal layers, dielectric layers, passivation layers, etc.

Figure 19:
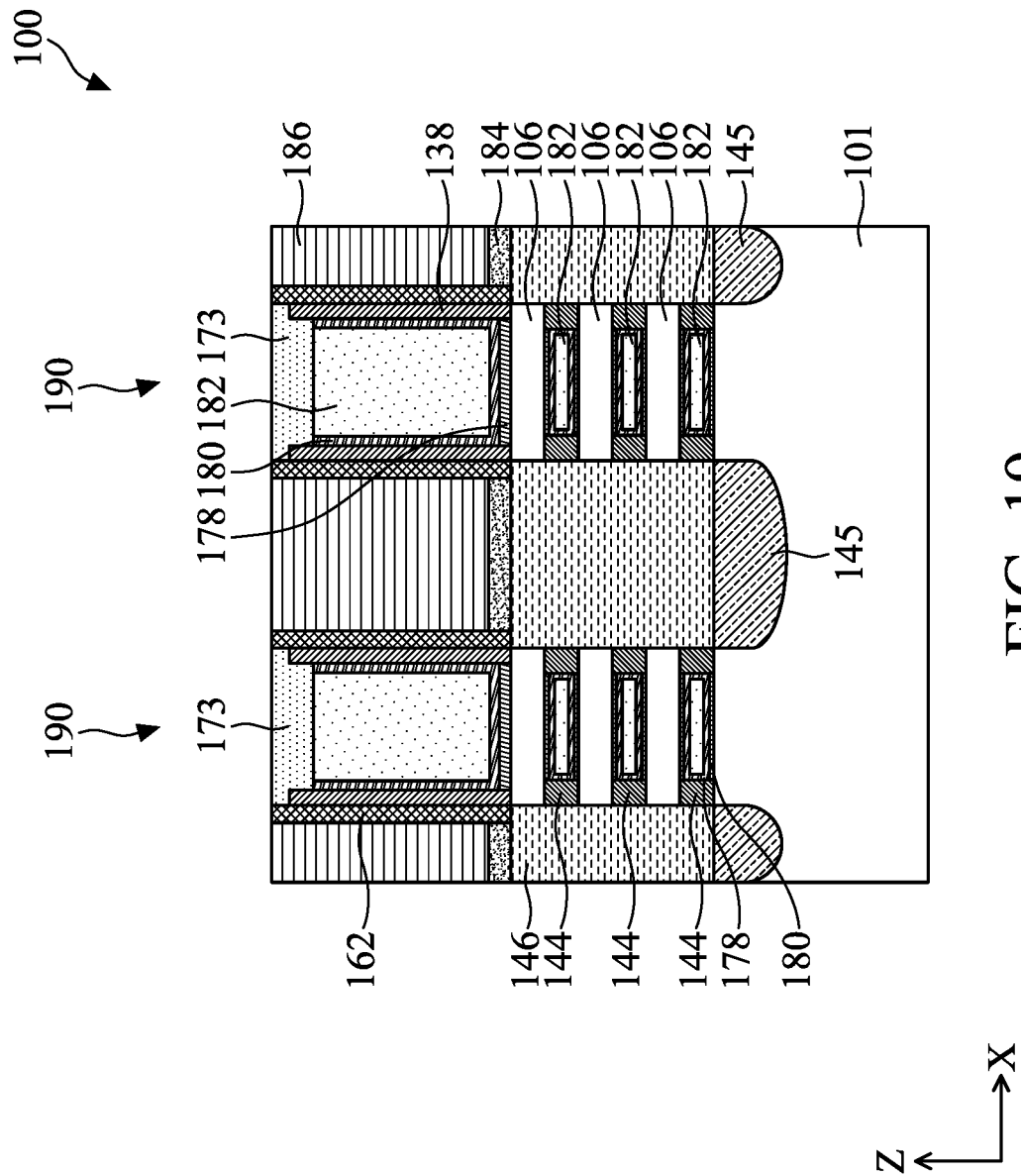
FIGS. 19-21 are cross-sectional side views of one of various stages of manufacturing the semiconductor device structure taken along cross-section A-A of FIG. 8, in accordance with some embodiments.

FIG. 19 is a cross-sectional side view of one of various stages of manufacturing the semiconductor device structure 100 taken along cross-section A-A of FIG. 8, in accordance with some embodiments. The embodiment shown in FIG. 19 is based on the alternative embodiment of FIGS. 12-1a to 12-1c, and therefore is substantially identical to the embodiment of FIG. 18A except that the dielectric regions 135 are being replaced with the dielectric region 145.

Figure 20:
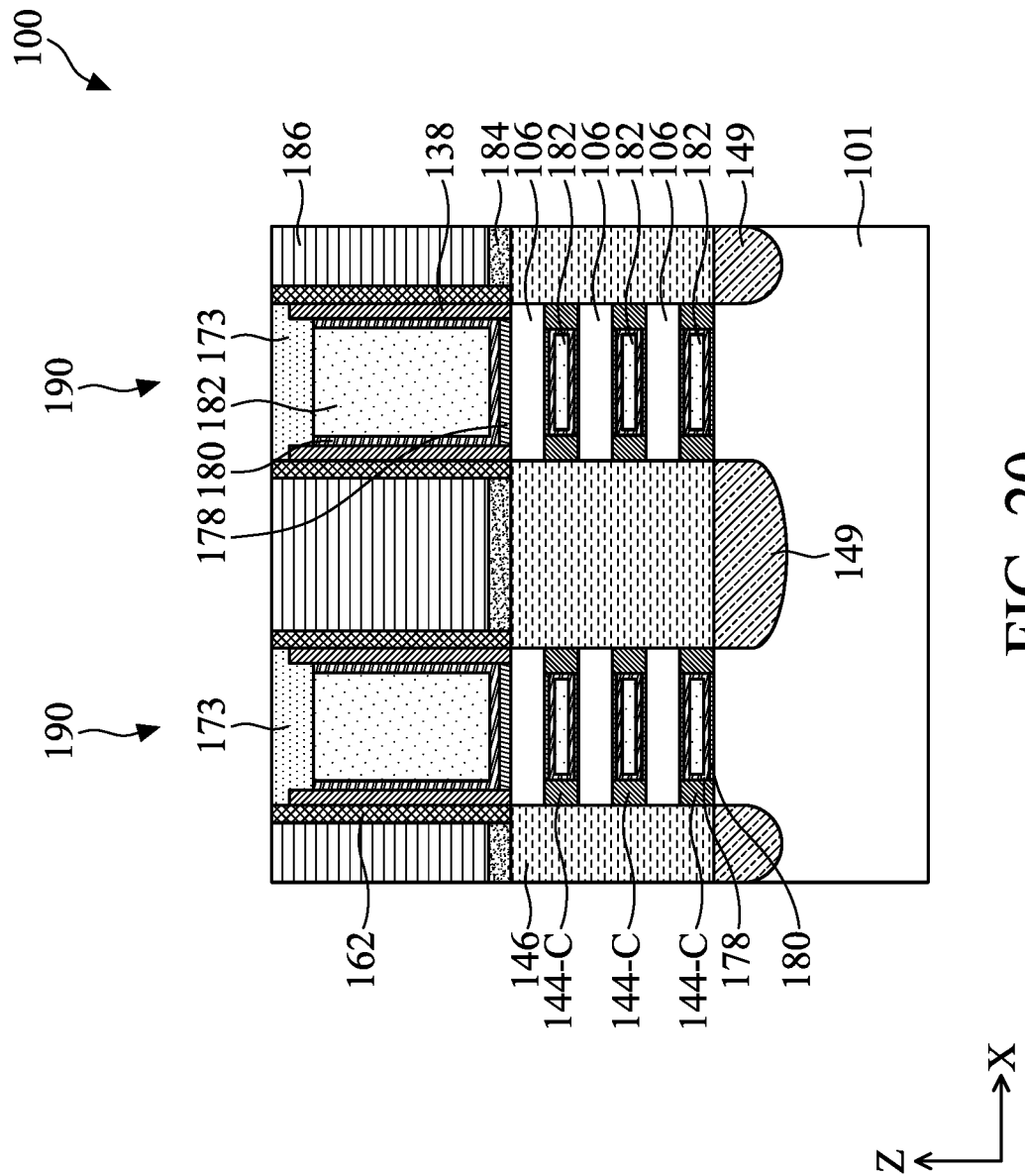

FIG. 20 is a cross-sectional side view of one of various stages of manufacturing the semiconductor device structure 100 taken along cross-section A-A of FIG. 8, in accordance with some embodiments. The embodiment shown in FIG. 20 is based on the alternative embodiment of FIGS. 12-2a to 12-2c, and therefore is substantially identical to the embodiment of FIG. 18A except that the dielectric regions 135 are being replaced with the dielectric region 149 and the dielectric spacers 144 are being replaced with the dielectric spacers 141-c.

Figure 21:
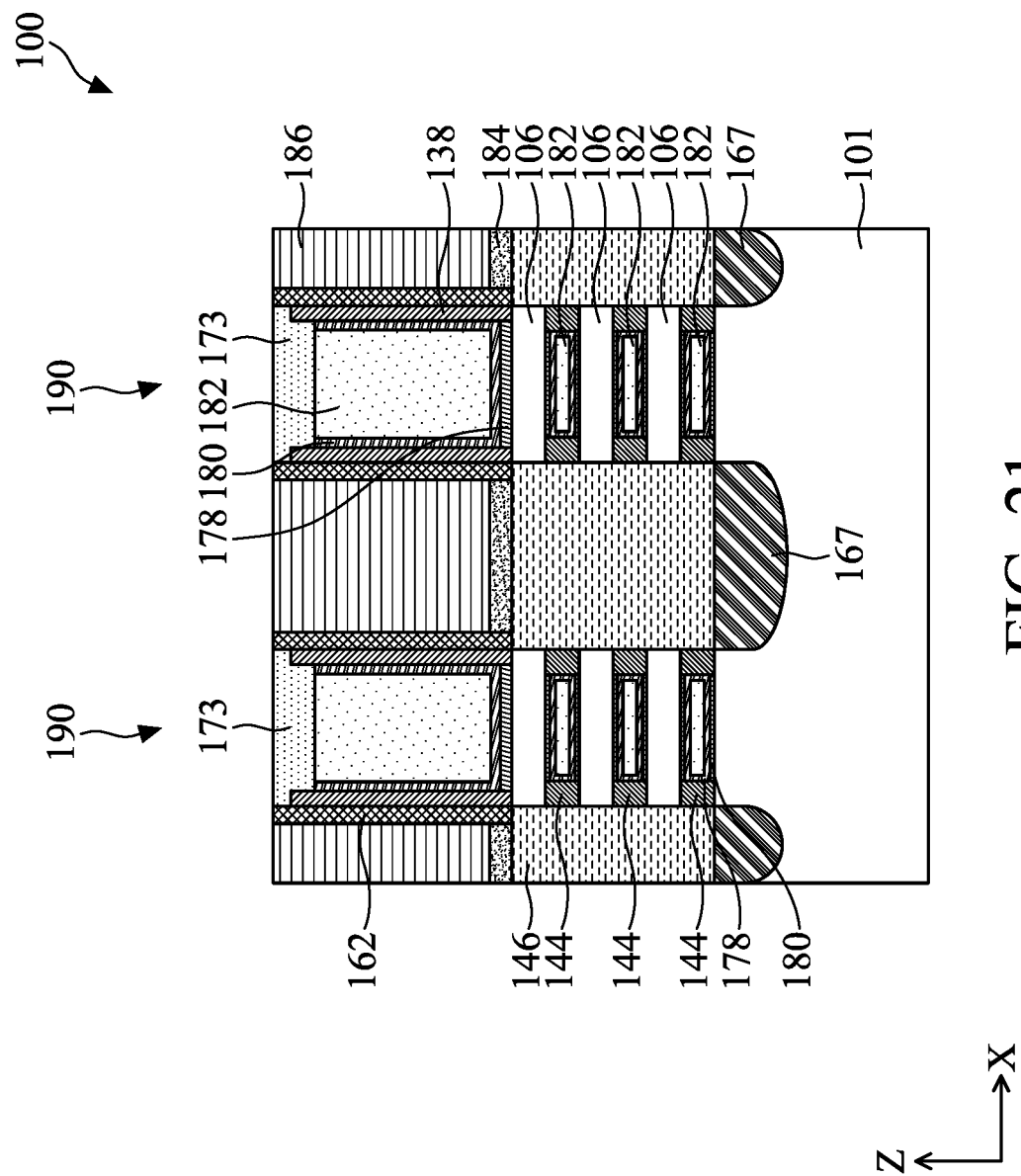

FIG. 21 is a cross-sectional side view of one of various stages of manufacturing the semiconductor device structure 100 taken along cross-section A-A of FIG. 8, in accordance with some embodiments. The embodiment shown in FIG. 21 is based on the alternative embodiment of FIGS. 13-1a to 13-1c, and therefore is substantially identical to the embodiment of FIG. 18A except that the dielectric regions 135 are being replaced with the dielectric region 167.

Various embodiments or examples described herein offer multiple advantages over the state-of-art technology. According to embodiments of the present disclosure, a dielectric region is formed in a substrate at a bottom of S/D regions between neighboring gate structures of a nanosheet transistor. The dielectric region serves to block current leakage flowing from source region through the substrate to drain region when the gate is in an "off" state. As a result, the device performance is increased and power consumption is reduced.

An embodiment is a semiconductor device structure. The semiconductor device structure includes a first source/drain epitaxial feature formed over a substrate, a second source/drain epitaxial feature formed over the substrate, two or more semiconductor layers disposed between the first source/drain epitaxial feature and the second source/drain epitaxial feature, a gate electrode layer surrounding a portion of one of the two or more semiconductor layers, a first dielectric region disposed in the substrate and in contact with a first side of the first source/drain epitaxial feature, and a second dielectric region disposed in the substrate and in contact with a first side of the second source/drain epitaxial feature, the second dielectric region being separated from the first dielectric region by the substrate.

Another embodiment is a semiconductor device structure. The semiconductor device structure includes a source/drain epitaxial feature disposed over a substrate, two or more semiconductor layers disposed parallelly to each other and in contact with the source/drain epitaxial feature, a gate electrode layer surrounding a portion of one of the two or more semiconductor layers, a nitride layer disposed between the source/drain epitaxial feature and the gate electrode layer, and a first oxide layer disposed between the source/drain epitaxial feature and the substrate.

A further embodiment is a method for forming a semiconductor device structure. The method includes forming a first fin structure and a second fin structure from a substrate, each first and second fin structure comprises a plurality of first semiconductor layers and a plurality of second semiconductor layers alternatingly stacked, forming a sacrificial gate structure over a portion of the first and second fin structures, subjecting a top surface of the substrate not covered by the sacrificial gate structure to a plurality of ion implantation processes to form implanted regions in the substrate, converting the implanted regions into dielectric regions by subjecting the implanted regions to an oxidation process, forming a source/drain feature on opposite sides of the sacrificial gate structure, the source/drain feature being in contact with the dielectric regions and the plurality of first semiconductor layers of the first and second fin structures, removing the sacrificial gate structure, removing the plurality of second semiconductor layers to expose portions of the plurality of first semiconductor layers of the first and second fin structures, and forming a gate electrode layer to surround at least the exposed portion of one of the plurality of first semiconductor layers of the first and second fin structures.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A semiconductor device structure, comprising:
    a first source/drain epitaxial feature formed over a substrate;
    a second source/drain epitaxial feature formed over the substrate;
    two or more semiconductor layers disposed between the first source/drain epitaxial feature and the second source/drain epitaxial feature;
    a gate electrode layer surrounding a portion of one of the two or more semiconductor layers;
    a first dielectric region disposed in the substrate and in contact with a first side of the first source/drain epitaxial feature; and
    a second dielectric region disposed in the substrate and in contact with a first side of the second source/drain epitaxial feature, the second dielectric region being separated from the first dielectric region by the substrate;
    wherein the first dielectric region comprises a first dopant and a second dopant different from the first dopant.

2. The semiconductor device structure of claim 1, wherein the first dopant is distributed at a first elevation and the second dopant is distributed at a second elevation below the first elevation.

3. The semiconductor device structure of claim 1, wherein the first dielectric region further comprises a third dopant different from the first dopant and the second dopant.

4. The semiconductor device structure of claim 3, wherein the first dopant is carbon, the second dopant is silicon, and the third dopant is germanium.

5. The semiconductor device structure of claim 3, wherein the first dielectric region further comprises a fourth dopant different from the first, second, and third dopant.

6. The semiconductor device structure of claim 5, wherein the fourth dopant comprises fluorine (F), tin (Sn), antimony (Sb), or phosphorus (P), neon (Ne), argon (Ar), krypton (Kr), xenon (Xe), or radon (Rn), or any combination thereof.

7. The semiconductor device structure of claim 1, further comprising:
    a first silicide layer in contact with a second side of the first source/drain epitaxial feature; and
    a second silicide layer in contact with a second side of the second source/drain epitaxial feature.

8. A semiconductor device structure, comprising:
    a source/drain epitaxial feature disposed over a substrate;
    two or more semiconductor layers disposed parallelly to each other and in contact with the source/drain epitaxial feature;
    a gate electrode layer surrounding a portion of one of the two or more semiconductor layers;
    a nitride layer disposed between the source/drain epitaxial feature and the gate electrode layer; and
    a first oxide layer disposed between the source/drain epitaxial feature and the substrate,
    wherein the first oxide layer comprises a first dopant and a second dopant different from the first dopant.

9. The semiconductor device structure of claim 8, wherein the first dopant is distributed at a first elevation and the second dopant is distributed at a second elevation below the first elevation.

10. The semiconductor device structure of claim 8, wherein the first oxide layer is in contact with the source/drain epitaxial feature.

11. The semiconductor device structure of claim 8, further comprising:
    a second oxide layer disposed between and in contact with the source/drain epitaxial feature and the first oxide layer.

12. The semiconductor device structure of claim 11, wherein the second oxide layer comprises the first dopant.

13. The semiconductor device structure of claim 11, wherein a portion of the second oxide layer is in contact with the nitride layer.

14. The semiconductor device structure of claim 8, wherein the first oxide layer further comprises a third dopant different from the first dopant and the second dopant.

15. The semiconductor device structure of claim 14, wherein the first dopant is carbon, the second dopant is germanium, and the third dopant is oxygen.

16. A method for forming a semiconductor device structure, comprising:
    forming a first fin structure and a second fin structure from a substrate, each first and second fin structure comprises a plurality of first semiconductor layers and a plurality of second semiconductor layers alternatingly stacked;

forming a sacrificial gate structure over a portion of the first and second fin structures;

subjecting a top surface of the substrate not covered by the sacrificial gate structure to a plurality of ion implantation processes to form implanted regions in the substrate;

converting the implanted regions into dielectric regions by subjecting the implanted regions to an oxidation process;

forming a source/drain feature on opposite sides of the sacrificial gate structure, the source/drain feature being in contact with the dielectric regions and the plurality of first semiconductor layers of the first and second fin structures;

removing the sacrificial gate structure;

removing the plurality of second semiconductor layers to expose portions of the plurality of first semiconductor layers of the first and second fin structures; and forming a gate electrode layer to surround at least the exposed portion of one of the plurality of first semiconductor layers of the first and second fin structures.

17. The method of claim 16, wherein the plurality of ion implantation processes comprises:

implanting a first group of ion species into the substrate at a first kinetic energy and a first implant dosage;

implanting a second group of ion species into the substrate at a second kinetic energy and a second implant dosage different from the first kinetic energy and the first implant dosage; and implanting a third group of ion species into the substrate at a third kinetic energy and a third implant dosage different from the first and second kinetic energies and the first and second implant dosages.

18. The method of claim 17, wherein the first group of ion species comprises carbon, the second group of ion species comprises germanium, and the third group of ion species comprises oxygen.

* * * * *